US010528160B2

(12) United States Patent
Ogura

(10) Patent No.: US 10,528,160 B2
(45) Date of Patent: Jan. 7, 2020

(54) WIRING BODY, WIRING BOARD, AND TOUCH SENSOR

(71) Applicant: FUJIKURA LTD., Tokyo (JP)

(72) Inventor: Shingo Ogura, Chiba (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 15/508,418

(22) PCT Filed: Feb. 26, 2016

(86) PCT No.: PCT/JP2016/055897
§ 371 (c)(1),
(2) Date: Mar. 2, 2017

(87) PCT Pub. No.: WO2016/136967
PCT Pub. Date: Sep. 1, 2016

(65) Prior Publication Data
US 2017/0308192 A1  Oct. 26, 2017

(30) Foreign Application Priority Data

Feb. 27, 2015 (JP) ................................. 2015-038652
May 22, 2015 (JP) ................................. 2015-104433

(51) Int. Cl.
*G06F 3/041* (2006.01)
*H05K 1/11* (2006.01)
*G06F 3/044* (2006.01)

(52) U.S. Cl.
CPC ............... *G06F 3/041* (2013.01); *H05K 1/11* (2013.01); *G06F 3/044* (2013.01);
(Continued)

(58) Field of Classification Search
None
See application file for complete search history.

(56) References Cited

U.S. PATENT DOCUMENTS

2011/0291966 A1*  12/2011  Takao ..................... G06F 3/044
345/173
2013/0342504 A1   12/2013  Hwang et al.
(Continued)

FOREIGN PATENT DOCUMENTS

CN  103105972 A  5/2013
CN  103197798 A  7/2013
(Continued)

OTHER PUBLICATIONS

Office Action issued in corresponding Taiwanese Application No. 105106078 dated Jun. 12, 2017 (3 pages).
(Continued)

*Primary Examiner* — Lunyi Lao
*Assistant Examiner* — Benjamin X Casarez
(74) *Attorney, Agent, or Firm* — Osha Liang LLP

(57) ABSTRACT

A wiring body includes an resin layer, a reticular electrode layer that includes first conductor wires arranged into the shape of a reticulation disposed on the resin layer, and a lead-out wiring layer connected to the reticular electrode layer disposed on the resin layer. The lead-out wiring layer includes a reticulation portion configured by gathering unit reticulations formed by being surrounded by second conductor wires. The second conductor wires are inclined with respect to an extending direction of the lead-out wiring layer. The unit reticulation includes an end portion that is an intersection point between the second conductor wires, The lead-out wiring layer includes a lateral end portion formed by arranging the unit reticulations side by side along the extending direction of the lead-out wiring layer. The lateral end portion of the lead-out wiring layer is closed by the second conductor wires.

14 Claims, 18 Drawing Sheets

(52) U.S. Cl.
CPC .............. *G06F 2203/04103* (2013.01); *G06F 2203/04111* (2013.01); *G06F 2203/04112* (2013.01); *H05K 2201/09227* (2013.01)

(56) References Cited

U.S. PATENT DOCUMENTS

| | | |
|---|---|---|
| 2014/0042406 A1 | 2/2014 | Degner et al. |
| 2014/0049485 A1 | 2/2014 | Oh et al. |
| 2014/0055702 A1 | 2/2014 | Park et al. |
| 2014/0152917 A1 | 6/2014 | Lee et al. |
| 2014/0198264 A1 | 7/2014 | Gao et al. |
| 2014/0216786 A1* | 8/2014 | Zhou .................... H05K 1/0296 174/250 |
| 2014/0231120 A1 | 8/2014 | Nakamura |
| 2014/0232959 A1* | 8/2014 | Kuriki .................... G06F 3/044 349/12 |
| 2014/0238730 A1 | 8/2014 | Nakamura |
| 2014/0284082 A1* | 9/2014 | Zhou .................... H05K 1/0296 174/251 |
| 2014/0290980 A1 | 10/2014 | Tang et al. |
| 2014/0293150 A1 | 10/2014 | Tang et al. |
| 2014/0327842 A1 | 11/2014 | Tang et al. |
| 2015/0002755 A1* | 1/2015 | Tang ........................ G06F 3/041 349/12 |
| 2015/0009420 A1 | 1/2015 | Zhou |
| 2015/0028897 A1* | 1/2015 | Koo .................... G01R 27/2605 324/690 |
| 2015/0060120 A1* | 3/2015 | Park ........................ G06F 3/044 174/257 |
| 2015/0062449 A1* | 3/2015 | Park ........................ G06F 3/044 349/12 |
| 2015/0160760 A1 | 6/2015 | Sato |
| 2015/0205424 A1* | 7/2015 | Park ...................... G06F 3/0414 345/174 |
| 2015/0324024 A1* | 11/2015 | Hwang .................... G06F 3/041 345/173 |
| 2015/0370379 A1 | 12/2015 | Hayashi et al. |
| 2016/0018348 A1* | 1/2016 | Yau ........................ G06F 3/044 324/697 |
| 2016/0085125 A1 | 3/2016 | Park et al. |
| 2016/0139709 A1* | 5/2016 | Chung .................... G06F 3/044 345/174 |
| 2016/0147337 A1* | 5/2016 | Lee ........................ G06F 3/044 345/174 |
| 2016/0179229 A1* | 6/2016 | Ahn ........................ G06F 3/041 345/173 |
| 2016/0195966 A1* | 7/2016 | Chang .................... G06F 3/0412 345/173 |
| 2016/0219697 A1* | 7/2016 | Bae ........................ H05K 1/0296 |
| 2016/0274727 A1* | 9/2016 | Nakamura ............. G06F 3/044 |
| 2016/0313827 A1* | 10/2016 | Song ........................ G06F 3/044 |
| 2017/0003821 A1* | 1/2017 | Jeon ........................ G06F 1/1643 |
| 2017/0010720 A1 | 1/2017 | Nakayama |
| 2017/0153762 A1* | 6/2017 | Kim ........................ G06F 3/0418 |

FOREIGN PATENT DOCUMENTS

| | | |
|---|---|---|
| JP | 2010-191504 A | 9/2010 |
| JP | 2013-127658 A | 6/2013 |
| JP | 2014-038580 A | 2/2014 |
| JP | 2014-056461 A | 3/2014 |
| JP | 2014-099199 A | 5/2014 |
| JP | 2014-110060 A | 6/2014 |
| JP | 2014-519129 A | 8/2014 |
| JP | 2014-182436 A | 9/2014 |
| JP | 2014-207283 A | 10/2014 |
| KR | 10-2012-0072187 A | 7/2012 |
| TW | 201437866 A | 10/2014 |
| WO | 2014/146382 A1 | 9/2014 |
| WO | 2014/157632 A1 | 10/2014 |
| WO | 2015/174126 A1 | 11/2015 |

OTHER PUBLICATIONS

Japanese Official Action issued in application No. 2015-038652 dated Jan. 19, 2016 (5 pages).
Office Action issued in corresponding Chinese Application No. 201680002512.9 dated Nov. 23, 2017 (16 pages).
Extended European Search Report issued in corresponding European Application No. 16755711.5 dated Dec. 18, 2017 (10 pages).
Office Action issued in corresponding European Patent Application No. 16 755 711.5 dated Oct. 1, 2018 (7 pages).

* cited by examiner

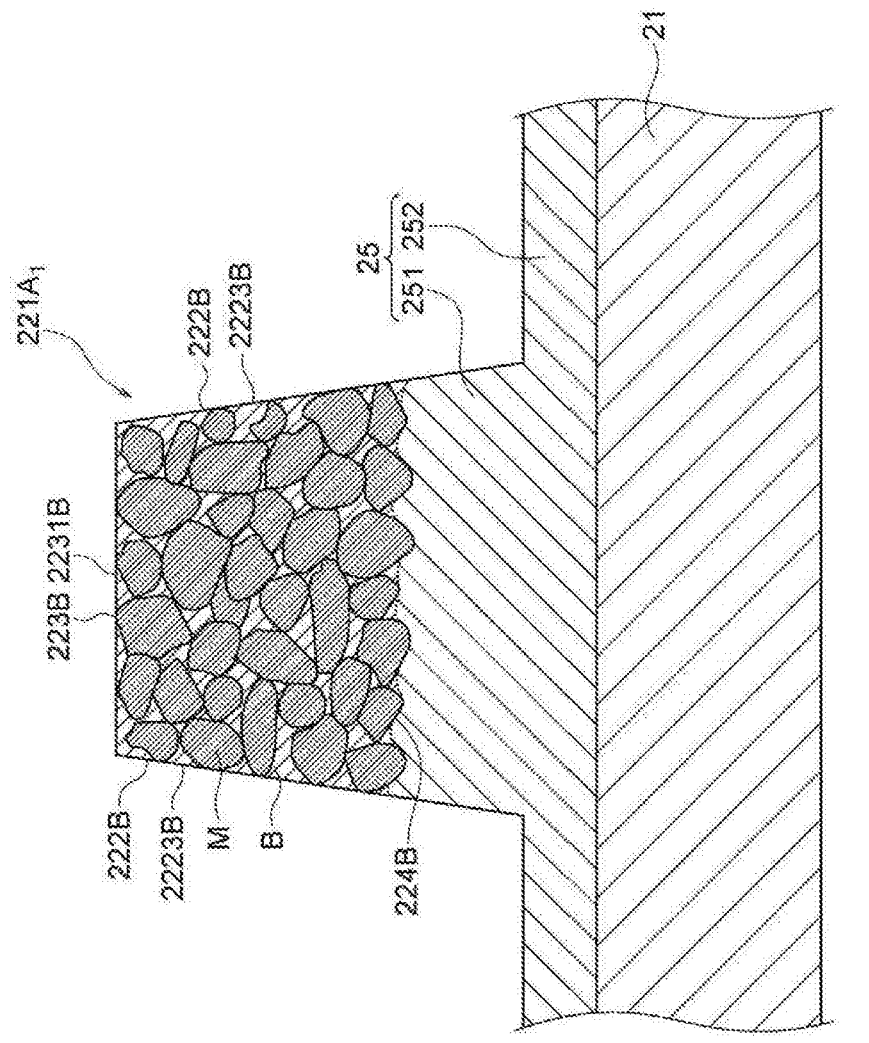

WIRING BODY, WIRING BOARD, AND TOUCH SENSOR

TECHNICAL FIELD

The present invention relates to a wiring body, a wiring board, and a touch sensor.

In designated nations where incorporation of documents by reference is accepted, the contents disclosed in Japanese Patent Application No. 2015-038652, filed on Feb. 27, 2015, and Japanese Patent Application No. 2015-104433, filed on May 22, 2015 in Japan are incorporated by reference into this specification, and are regarded as a part of disclosure of the description.

BACKGROUND ART

A touch panel including a detection electrode configured of a conductive fine wire, and lead-out wiring connected to the detection electrode is known (for example, refer to Patent Document 1).

CITATION LIST

Patent Document

Patent Document 1: JP 2014-182436 A

SUMMARY OF THE INVENTION

Problem to be Solved by the Invention

In the technology described above, the lead-out wiring is configured of a linear solid pattern. For this reason, there is a case where a stress is concentrated on a boundary between the detection electrode and the lead-out wiring due to a difference in the rigidity between the detection electrode and the lead-out wiring, and the detection electrode and the lead-out wiring are disconnected from each other. On the other hand, such a stress concentration is alleviated by forming the lead-out wiring in the shape of a mesh. However, in a case where the lead-out wiring is formed in the shape of a mesh, there is a problem in that an electric resistance value of the lead-out wiring increases.

Problems to be solved by the present invention include providing a wiring body which is capable of suppress an increase in the electric resistance value of the lead-out wiring layer while preventing the disconnection between the lead-out wiring layer and the reticular electrode layer, a wiring board, and a touch sensor.

Means for Solving Problem

[1] A wiring body according to the invention, includes: a resin layer; a reticular electrode layer disposed on the resin layer and including first conductor wires arranged into the shape of a reticulation; and a lead-out wiring layer disposed on the resin layer and connected to the reticular electrode layer, in which the lead-out wiring layer includes a reticulation portion configured by gathering unit reticulations formed by being surrounded by a second conductor wire in the planar view, the second conductor wire is disposed by being inclined with respect to an extending direction of the lead-out wiring layer, the unit reticulation includes an end portion which is an intersection point between the second conductor wires, the lead-out wiring layer includes a lateral end portion formed by arranging the unit reticulations side by side along the extending direction of the lead-out wiring layer in the planar view, the lateral end portion is closed by the second conductor wire connected to an outside end portion positioned on the outermost side in the end portion of the unit reticulation existing in the lateral end portion, and a width of the reticulation portion is defined by the outside end portion.

[2] In the invention described above, a lateral portion of the lead-out wiring layer in the planar view may have a shape of a wave configured of the second conductor wire forming the unit reticulation disposed on the lateral end portion of the lead-out wiring layer.

[3] In the invention described above, the lead-out wiring layer may include a linear side portion disposed on the lateral end portion of the lead-out wiring layer and connecting the unit reticulations together, and the lateral portion of the lead-out wiring layer in the planar view may be configured of the side portion.

[4] In the invention described above, the lead-out wiring layer may include a first linear portion extending along a first direction, a second linear portion extending along a second direction different from the first direction, and a curved portion connecting the first linear portion and the second linear portion to each other, the first linear portion and the second linear portion may be respectively configured by arranging first unit reticulations formed of the second conductor wire and having substantially the same shape, as the unit reticulation, and the following Formula (1) may be satisfied.

$$\alpha_1 = \alpha_2 \quad (1)$$

in the Formula (1), $\alpha_1$ is an angle between a virtual straight line extending along an arrangement direction of the first unit reticulation and a virtual straight line extending along the first direction in the first linear portion, and $\alpha_2$ is an angle between a virtual straight line extending along the arrangement direction of the first unit reticulation and a virtual straight line extending along the second direction in the second linear portion.

[5] In the invention described above, the curved portion may include a second unit reticulation, as the unit reticulation, having a shape different from the shape of the first unit reticulation.

[6] In the invention described above, the curved portion may be configured by overlapping one end of the first linear portion and one end of the second linear portion with each other, and a conductor wire configuring the second unit reticulation, may include the second conductor wire configuring the first linear portion, and the second conductor wire configuring the second linear portion.

[7] In the invention described above, one end of the first linear portion and one end of the second linear portion may be separated from each other, the curved portion may include a third conductor wire connecting one end of the first linear portion and one end of the second linear portion to each other, and the second unit reticulation may include the third conductor wire.

[8] In the invention described above, the third conductor wire may connect the end portion of the first unit reticulation configuring the first linear portion and the end portion of the first unit reticulation configuring the second linear portion to each other.

[9] In the invention described above, a width of the second conductor wire may be substantially identical to a width of the third conductor wire.

[10] In the invention described above, in the first unit reticulations arranged side by side along the arrangement direction in the first linear portion, the end portion of one first unit reticulation and the end portion of the other first unit reticulation corresponding to the end portion of one first unit reticulation, may be positioned on the virtual straight line extending along the first direction, and in the first unit reticulations arranged side by side along the arrangement direction in the second linear portion, the end portion of one first unit reticulation and the end portion of the other first unit reticulation corresponding to the end portion of one first unit reticulation, may be positioned on the virtual straight line extending along the second direction.

[11] In the invention described above, an aspect ratio of the unit reticulation in the planar view may be greater than 1, and the aspect ratio of the unit reticulation in the planar view may be a ratio of a length of the unit reticulation along the extending direction of the lead-out wiring layer to a length of the unit reticulation along a width direction with respect to the extending direction of the lead-out wiring layer.

[12] In the invention described above, the wiring body may further includes: reticular electrode layers; and lead-out wiring layers respectively connected to the reticular electrode layers and arranged approximately in parallel to each other, the lateral end portion may include a convex portion configured by including the outside end portion and the second conductor wire connected to the outside end portion, and protruding towards the outside of the lead-out wiring layer in the planar view, and a concave portion alternately disposed with the convex portion along the extending direction of the lead-out wiring layer, and recessed towards the inside of the lead-out wiring layer in the planar view, and the convex portion configuring the lateral end portion of the other lead-out wiring layer facing the lateral end portion of one lead-out wiring layer and the convex portion configuring the lateral end portion of one lead-out wiring layer facing the lateral end portion of the other lead-out wiring layer may be shifted from each other along the extending direction of the lead-out wiring layer in the adjacent lead-out wiring layers.

[13] In the invention described above, the convex portion configuring the lateral end portion of the other lead-out wiring layer facing the lateral end portion of one lead-out wiring layer and the concave portion configuring the lateral end portion of one lead-out wiring layer facing the lateral end portion of the other lead-out wiring layer may face each other in a direction orthogonal to the extending direction of the lead-out wiring layer in the adjacent lead-out wiring layers, and the concave portion configuring the lateral end portion of the other lead-out wiring layer facing the lateral end portion of one lead-out wiring layer and the convex portion configuring the lateral end portion of one lead-out wiring layer facing the lateral end portion of the other lead-out wiring layer may face each other in the direction orthogonal to the extending direction of the lead-out wiring layer in the adjacent lead-out wiring layers.

[14] In the invention described above, the following Formula (2) described below may be satisfied.

$$W_1 < W_2 \quad (2)$$

in the Formula (2), $W_1$ is a width of the first conductor wire, and $W_2$ is a width of the second conductor wire.

[15] In the invention described above, the following Formula (3) described below may be satisfied.

$$P_1 > P_2 \quad (3)$$

in the Formula (3), $P_1$ is a pitch between the adjacent first conductor wires, and $P_2$ is a pitch between the adjacent second conductor wires.

[16] In the invention described above, the aspect ratio of the unit reticulation in the planar view may be greater than an aspect ratio of the reticulation configuring the reticular electrode layer in the planar view, the aspect ratio of the unit reticulation in the planar view may be a ratio of the length of the unit reticulation along the extending direction of the lead-out wiring layer to the length of the unit reticulation along the width direction with respect to the extending direction of the lead-out wiring layer, and the aspect ratio of the reticulation configuring the reticular electrode layer in the planar view may be a ratio of a length of the reticulation along an extending direction of the reticular electrode layer to an length of the reticulation along a width direction with respect to the extending direction of the reticular electrode layer.

[17] In the invention described above, an aperture ratio of the reticular lead-out wiring layer may be less than or equal to 50%.

[18] A wiring board according to the invention, includes: the wiring body of the invention described above; and a support that supports the wiring body.

[19] A touch sensor according to the invention, includes: the wiring board described above.

Effect of the Invention

According to the invention, the lead-out wiring layer includes the reticulation portion configured by gathering the unit reticulations formed by being surrounded by the second conductor wire, in the planar view. Accordingly, a stress concentration due to a difference in the rigidity between the reticular electrode layer and the lead-out wiring layer can be relaxed, and the disconnection between the reticular electrode layer and the lead-out wiring layer can be suppressed. In addition, the width of the reticulation portion is defined by the end portion of the unit reticulation. Accordingly, the lateral portion of the lead-out wiring layer is closed by the second conductor wire, and the entire second conductor wire can be in a conduction state, and thus, it is possible to prevent an increase in an electric resistance value of the lead-out wiring layer.

BRIEF DESCRIPTION OF DRAWINGS

FIG. 5 is a sectional view for describing a first conductor wire of the first embodiment of the invention;

MODES FOR CARRYING OUT THE INVENTION

Hereinafter, embodiments of the invention will be described on the basis of the drawings.

First Embodiment

Figure 1:
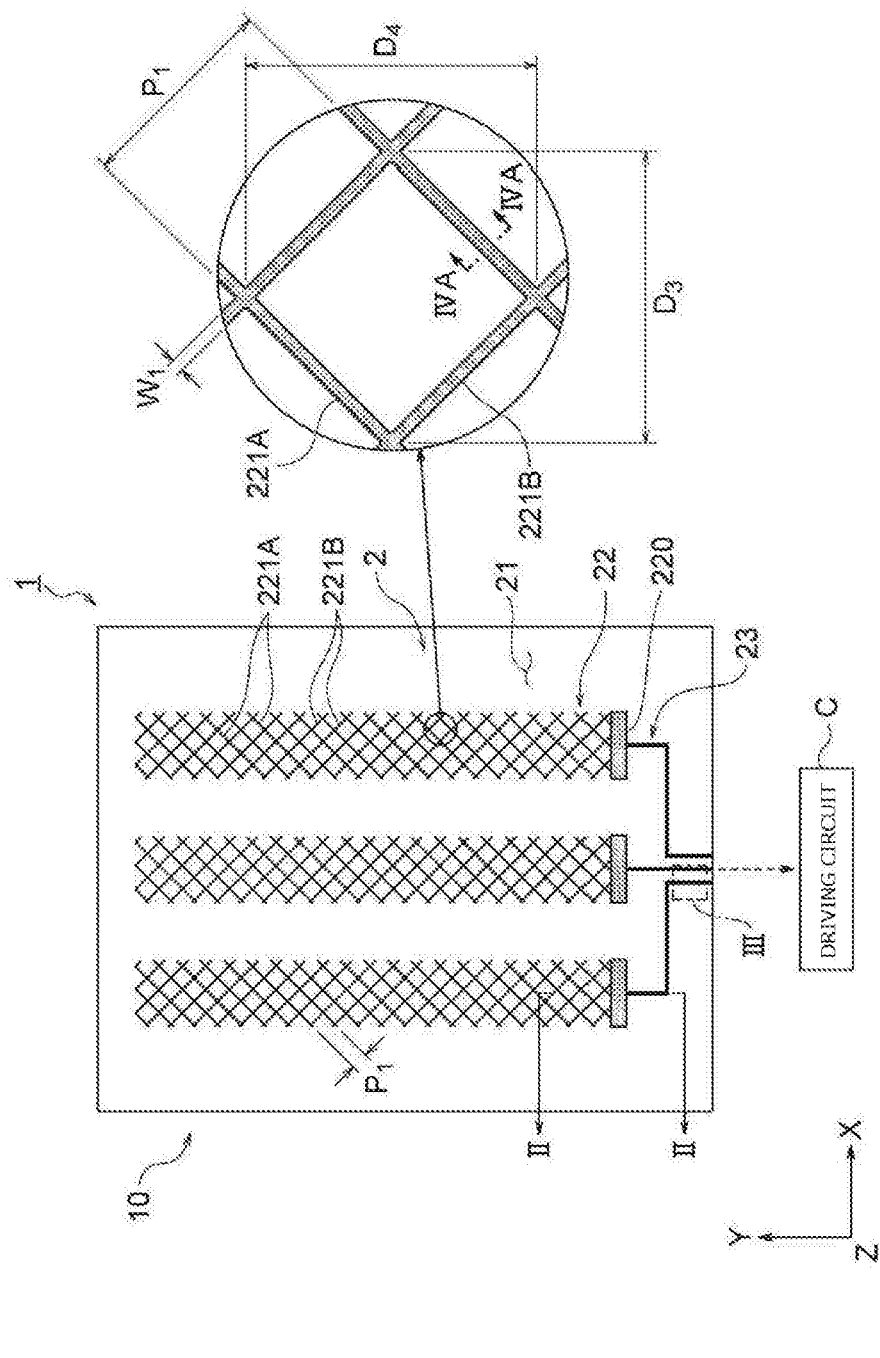
FIG. 1 is a plan view illustrating a touch sensor including wiring body of a first embodiment of the invention.
Figure 2:
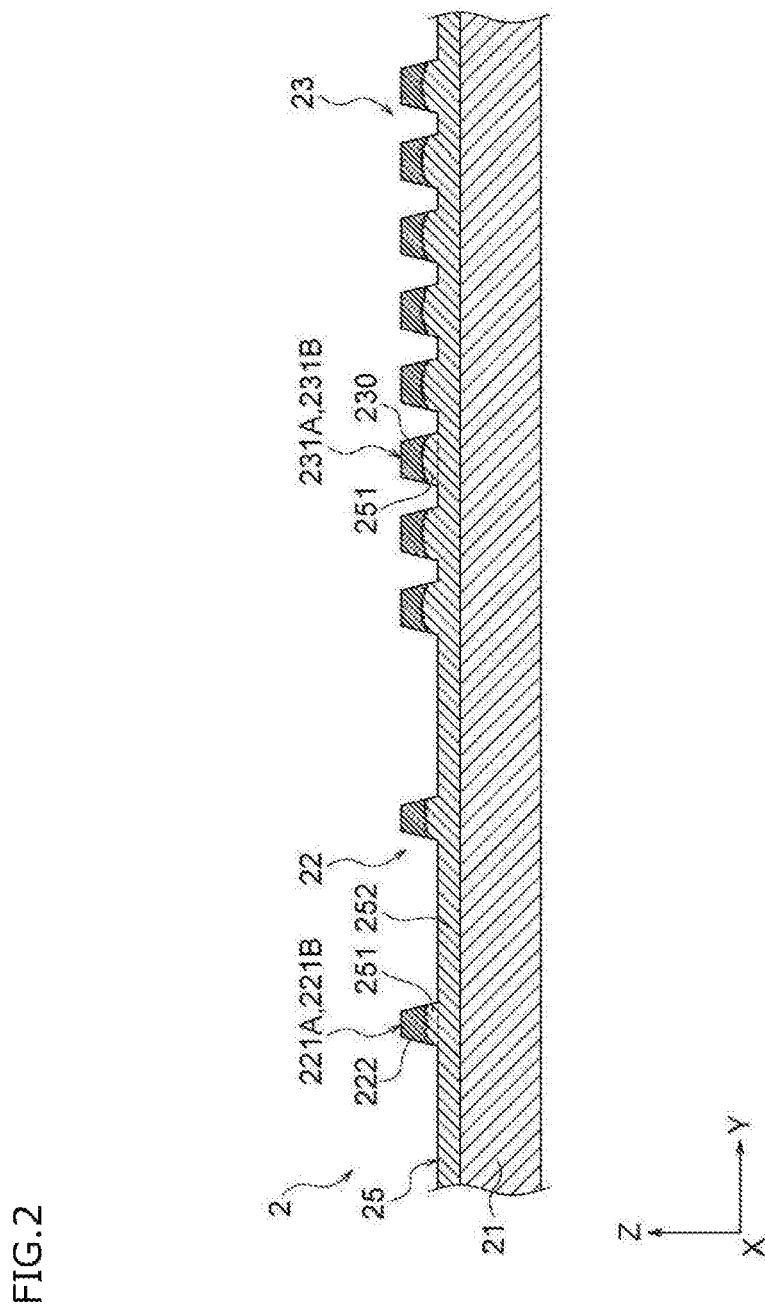
FIG. 2 is a sectional view taken along line II-II of FIG. 1.
Figure 3:
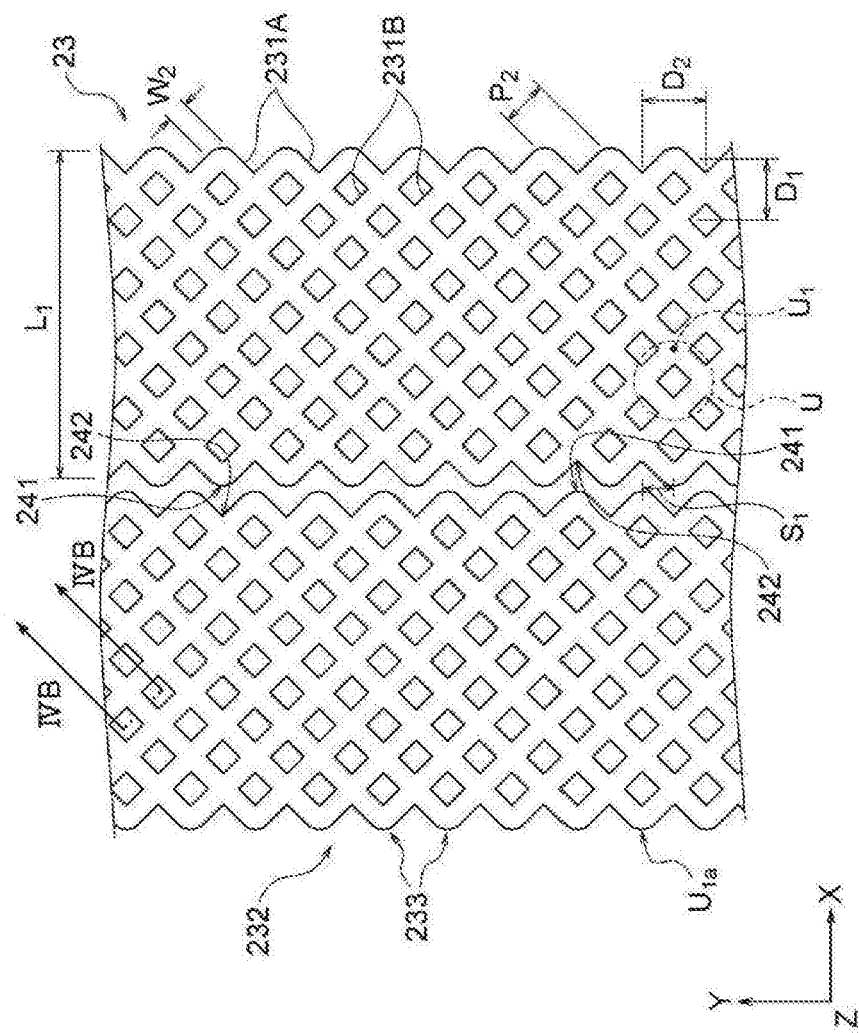
FIG. 3 is an enlarged view of a portion III of FIG. 1.
Figures 4A, 4B:
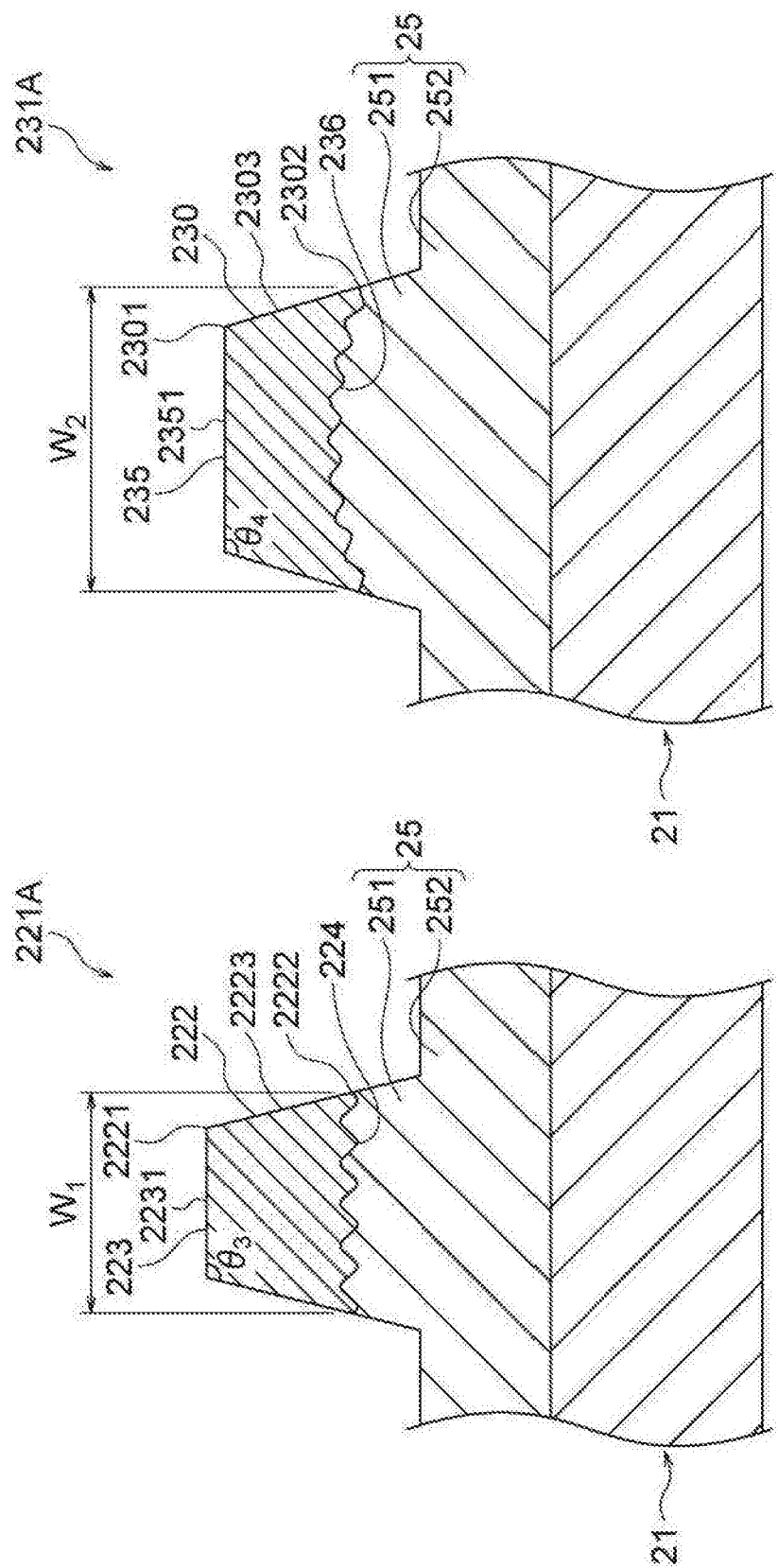
FIG. 4(A) is a view taken along line IVA-IVA of FIG. 1.
FIG. 4(B) is a sectional view taken along line IVB-IVB of FIG. 3.

FIG. 1 is a plan view illustrating a touch sensor including a wiring body of a first embodiment, FIG. 2 is a sectional view taken along line II-II of FIG. 1, FIG. 3 is an enlarged view of a portion III of FIG. 1, FIG. 4(A) is a view taken along line IVA-IVA of FIG. 1, FIG. 4(B) is a sectional view taken along line IVB-IVB of FIG. 3, and FIG. 5 is a sectional view for describing a first conductor wire of the first embodiment of the invention.

A touch sensor 1 including a wiring body 2 of this embodiment, for example, is a touch input device used in an electrostatic capacitance type touch panel or an electrostatic capacitance type touch pad. As illustrated in FIG. 1, the touch sensor 1 includes a wiring board 10, and a second reticular electrode layer disposed on a reticular electrode layer 22 of the wiring board 10 through a resin layer. In FIG. 1, the resin layer and the second reticular electrode layer are not illustrated. The wiring board 10 of this embodiment includes a substrate 21 and the wiring body 2.

The substrate 21 is an insulating transparent substrate configured of a transparent film such as polyethylene terephthalate (PET), polyethylene naphthalate (PEN), and polyimide (PI), glass, or the like. In addition, the substrate 21 may be a display device or a cover panel. For this reason, when a backlight such as an LED or a display (not illustrated) is disposed under the wiring board 10, light of the backlight or the display is transmitted through the wiring body 2.

The wiring body 2 includes an adhesive layer 25, reticular electrode layers 22 (in this example, three reticular electrode layers) formed on the adhesive layer 25, and a lead-out wiring layer 23 connected to the reticular electrode layer 22.

The adhesive layer 25 as the resin layer is a layer for allowing the substrate 21, and the reticular electrode layer 22 and the lead-out wiring layer 23 to adhere to and to be fixed to each other, and as illustrated in FIG. 2, is disposed on one entire main surface of the substrate 21. A UV curable resin such as an epoxy resin, an acrylic resin, a polyester resin, a urethane resin, a vinyl resin, a silicone resin, a phenolic resin, and a polyimide resin, a thermosetting resin or a thermoplastic resin, ceramics, or the like can be exemplified as adhesive material configuring the adhesive layer 25. The adhesive layer 25 includes a support portion 251 supporting first conductor wires 221A and 221B or second conductor wires 231A and 231B, and a smooth portion 252 disposed between the support portion 251 and the main surface of the substrate 21 and covering the main surface. The support portion 251 and the smooth portion 252 are integrally formed.

As illustrated in FIG. 2, a sectional shape of the support portion 251 of this embodiment is a shape which narrows towards a direction separated from the substrate 21 (a +Z direction in FIG. 2). In addition, an upper surface of the support portion 251 (an adhesive surface on a boundary between the support portion 251 and the first conductor wires 221A and 221B or the second conductor wires 231A and 231B) has a concave-convex shape corresponding to a concave-convex shape of a lower surface of the first conductor wires 221A and 221B or the second conductor wires 231A and 231B, in the sectional view. Such a concave-convex shape is formed on the basis of the surface roughness of a lower surface 224 of the first conductor wire 221A. Furthermore, even though it is not particularly illustrated, a boundary between the support portion 251 and the first conductor wire 221A in the sectional surface along an extending direction of the first conductor wire 221A also has a concave-convex shape corresponding to the concave-convex shape of the lower surface 224 of the first conductor wire 221A. The surface roughness of the lower surface 224 will be described below in detail. In FIG. 2, in order to describe the wiring body 2 of this embodiment to be easily understood, the concave-convex shape of the boundary between the support portion 251 and the first conductor wire 221A is exaggeratingly illustrated. Even though it is not particularly illustrated, a boundary between the support portion and the first conductor wire 221B described below also has a concave-convex shape corresponding to the concave-convex shape of the lower surface of the first conductor wire 221B, as with the boundary between the support portion and the first conductor wire 221A.

The smooth portion 252 is disposed on the entire main surface of the substrate 21 with approximately an even height (a thickness). The thickness of the smooth portion 252 can be set to be within a range of 5 μm to 100 μm, but is not particularly limited. The support portion 251 is disposed on the smooth portion 252, and thus, the adhesive layer 25 protrudes in the support portion 251, and the rigidity of the first conductor wires 221A and 221B and the second conductor wires 231A and 231B in the support portion 251 is improved.

Furthermore, the adhesive layer 25 may be configured only of the support portion 251 by omitting the smooth portion 252 from the adhesive layer 25. In this case, the light transmittance of the entire wiring board 10 is improved, and thus, it is possible to improve the visibility of the touch sensor 1.

The reticular electrode layer 22 is configured of a conductive material (conductive particles) and a binder resin. Examples of the conductive material are capable of including a metal material such as silver, copper, nickel, tin, bismuth, zinc, indium, and palladium, and a carbon-based material such as graphite or carbon black (furnace black, acetylene black, and Ketjen black), a carbon nanotube, and a carbon nanofiber. Furthermore, a metal salt may be used as the conductive material. Examples of the metal salt are capable of including the salts of the metals described above.

Conductive particles which, for example, have a diameter ϕ of 0.5 μm to 2 μm (0.5 μm≤ϕ≤2 μm) according to the width of a conductor pattern to be formed (the width of the first conductor wires 221A and 221B) may be used as the conductive particles contained in the reticular electrode layer 22. Furthermore, it is preferable to use conductive particles having an average diameter ϕ of less than or equal to half of the width of the conductor pattern to be formed, from the viewpoint of stabilizing an electric resistance value of the reticular electrode layer 22. In addition, when the carbon-based material is used as the conductive particles, it is preferable to use a particle whose specific surface area measured by a BET method is 20 m2/g or more.

When relatively small electrical resistivity of a certain value or less is required for the reticular electrode layer 22, a metal material is preferably used as conductive particles. However, when relatively large electrical resistivity of the certain value or more is allowed for the reticular electrode layer 22, a carbon-based material may be used as conductive particles. Using the carbon-based material as conductive material is preferable in terms of improving haze or total light ray reflectance of a mesh film.

In addition, in this embodiment, in order to impart light transmittance, the reticular electrode layer 22 is formed in the shape of a reticulation. For this reason, a conductive material, such as a metal material such as silver, copper, and nickel, and the carbon-based material described above, which has excellent conductivity but is opaque (an opaque metal material and an opaque carbon-based material), can be used as a constitutional material of the reticular electrode layer 22.

An acrylic resin, a polyester resin, an epoxy resin, a vinyl resin, a urethane resin, a phenolic resin, a polyimide resin, a silicone resin, a fluorine resin, and the like can be exemplified as the binder resin.

Such a reticular electrode layer 22 is formed by applying and hardening a conductive paste. A conductive paste configured by mixing the conductive material and the binder resin described above with water or a solvent, and various additives can be exemplified as a specific example of the conductive paste. α-Terpineol, butyl carbitol acetate, butyl carbitol, 1-decanol, butyl cellosolve, diethylene glycol monoethyl ether acetate, tetradecane, and the like can be exemplified as the solvent contained in the conductive paste. Furthermore, the binder resin may be omitted from the materials configuring the reticular electrode layer 22.

As illustrated in FIG. 1, the reticular electrode layer 22 has a shape of a reticulation formed by allowing first conductor wires 221A arranged in parallel to each other and first conductor wires 221B arranged in parallel to each other to intersect with each other approximately at a right angle. Furthermore, a reticulation shape of the reticular electrode layer 22 is not particularly limited. For example, the reticulation shape may be a reticulation shape such as a square shape or a rectangular shape, and a rhombic shape. In addition, the reticulation shape of the reticular electrode layer 22 may be a triangular shape such as an equilateral-triangular shape, an isosceles-triangular shape, and a right-triangular shape, or may be a quadrangular shape such as a parallelogram-like shape and a trapezoidal shape. In addition, the shape of the reticulation may be an n-polygonal shape such as a hexagonal shape (a honeycomb-like shape), an octagonal shape, a dodecagonal shape, and an icosagonal shape, a circular shape, an elliptical shape, a star-like shape, or the like.

In this embodiment, the first conductor wires 221A and 221B are arranged by being respectively inclined at 45° with respect to an extending direction of the reticular electrode layer 22 (a Y axis direction in FIG. 1), and may be arranged by being respectively inclined at other angles (for example 30°). Furthermore, the first conductor wires 221A and 221B may extend into the shape of a curve, a horseshoe, a zigzag line, and the like, or a linear portion and portions in the shape of a curve, a horseshoe, a zigzag line, and the like may be mixed.

In this embodiment, the first conductor wire 221A and the first conductor wire 221B, which configure the reticular electrode layer 22, have approximately the same width (a maximum width in the sectional view with respect to the extending direction of the first conductor wires 221A and 221B) $W_1$. In addition, an aperture ratio (described below) of the reticular electrode layer 22 of this embodiment is greater than or equal to 85% and less than 100%. It is preferable that the aperture ratio of the reticular electrode layer 22 is greater than or equal to 90% and less than 100%, from the viewpoint of improving the light transmittance of the backlight, the display, or the like which is disposed under the wiring body 2.

The width of such first conductor wires 221A and 221B is preferably within a range of 50 nm to 1000 μm, is more preferably within a range of 500 nm to 150 μm, is even more preferably within a range of 1 μm to 10 μm, and is still even more preferably within a range of 1 μm to 5 μm, from the viewpoint of improving the visibility of the touch sensor 1. In addition, the height of the first conductor wires 221A and 221B is preferably within a range of 50 nm to 3000 μm, is more preferably within a range of 500 nm to 450 μm, and is even more preferably within a range of 500 nm to 10 μm.

As illustrated in FIG. 2, a lateral portion 222 of the first conductor wires 221A and 221B and a lateral portion of the support portion 251 of the adhesive layer 25 are smoothly continuous, and thus, form one flat surface. The first conductor wires 221A and 221B have a tapered shape which narrows towards a side separated from the substrate 21 (a +Z axis direction side in FIG. 2), and thus, a sectional surface of an outer surface of the first conductor wires 221A and 221B (a sectional surface of the first conductor wires 221A and 221B in the extending direction) is approximately in the shape of a trapezoid. An adhesive surface between the first conductor wires 221A and 221B and the support portion 251 of the adhesive layer 25 are substantially parallel to the substrate 21.

The shape of the first conductor wire 221A will be described in detail by using FIG. 4(A). Furthermore, the first conductor wire 221B has the same fundamental configuration as that of the first conductor wire 221A. Therefore, in the first conductor wire 221B, the repetitive description will be omitted, and the description of the first conductor wire 221A will be used.

As illustrated in FIG. 4(A), the first conductor wire 221A includes a lower surface 224, an upper surface 223, and the lateral portion 222, in a sectional surface of the first conductor wire 221A in a width direction. The lower surface 224 is in contact with the upper surface of the support portion 251. The upper surface 223 is positioned on a side opposite to the lower surface 224 in the first conductor wire 221A. The upper surface 223 is substantially parallel to the main surface of the substrate 21 (an upper surface of the smooth portion 252 of the adhesive layer 25).

The upper surface 223 includes a flat portion 2231 in the sectional surface of the first conductor wire 221A in the width direction. The flat portion 2231 is a linear portion which exists in the upper surface 223 (that is, a portion having a maximum curvature radius), in the sectional surface of the first conductor wire 221A in the width direction, and has a flatness of less than or equal to 0.5 μm. Furthermore, the flatness can be defined by a JIS method (JIS B0621 (1984)).

In this embodiment, the flatness of the flat portion 2231 is obtained by using a non-contact type measurement method using laser light. Specifically, a measurement target (specifically, the upper surface 223) is irradiated with strip-like laser light, and reflection light thereof is subjected to image formation on an imaging element (for example, a two-dimensional CMOS), and thus, the flatness is measured. A method in which in a flat surface of a target, a flat surface passing through each of three points which are maximally separated from each other is set, and a maximum value of a deviation thereof is calculated as the flatness (a maximum deviation type flatness) is used as a calculation method of the flatness. Furthermore, the measurement method or the calculation method of the flatness is not particularly limited to the above description. For example, the measurement method of the flatness may be a contact type measurement method using a dial gauge or the like. In addition, the calculation method of the flatness may be a method in which the value of a gap which can be formed at the time of interposing a flat surface, which becomes a target, between parallel flat surfaces is calculated as the flatness (a maximum inclination type flatness).

The flat portion 2231 of this embodiment is formed approximately on the entire upper surface 223. Furthermore, the flat portion 2231 may be formed on a part of the upper surface 223, but is not particularly limited to the above description. In this case, for example, the flat portion may be formed in a region in which both ends of the upper surface are not included. In a case where the flat portion is formed on a part of the upper surface, the width of the flat portion is at least ½ with respect to the width of the upper surface.

The lateral portion 222 is positioned between the upper surface 223 and the lower surface 224. The lateral portion 222 is connected to the upper surface 223 in a first portion 2221, and is connected to the lower surface 224 in a second portion 2222. The first conductor wire 221A of this embodiment has a tapered shape which narrows towards a side separated from the adhesive layer 25, and thus, the second portion 2222 is positioned on the outside from the first portion 2221, in the sectional surface of the first conductor wire 221A in the width direction. The lateral portion 222 of this embodiment is a surface extending on a virtual straight line (not illustrated) which passes through the first portion 2221 and the second portion 2222, in the sectional surface of the first conductor wire 221A in the width direction.

Furthermore, the shape of the lateral portion 222 is not particularly limited to the above description. For example, the lateral portion 222 may have an arc-like shape protruding towards the outside, in the sectional surface of the first conductor wire 221A in the width direction. In this case, the lateral portion 222 exists on the outside from the virtual straight line which passes through the first portion 2221 and the second portion 2222. That is, it is preferable that the shape of the lateral portion 222 is a shape in which a part of the lateral portion 222 does not exist on the inside from the virtual straight line passing through the first portion 2221 and the second portion 2222, in the sectional surface of the first conductor wire 221A in the width direction. For example, in a case where the outline of the first conductor wire gradually increases as approaching the resin layer, in the sectional surface of the first conductor wire in the width direction, and the lateral portion has an arc-like shape protruding towards the inside (that is, a shape in which the bottom of the first conductor wire widens), there is a concern that light which is incident on the wiring body is easily subjected to diffuse reflection.

The lateral portion 222 of this embodiment includes a flat portion 2223 in the sectional surface of the first conductor wire 221A in the width direction. The flat portion 2223 is a linear portion which exists in the lateral portion 222 (that is, a portion having a maximum curvature radius), in the sectional surface of the first conductor wire 221A in the width direction, and has a flatness of less than or equal to 0.5 μm. The flatness of the flat portion 2223 can be measured by the same method as the measurement method of the flatness of the flat portion 2231. In this embodiment, the flat portion 2223 is formed approximately in the entire lateral portion 222. Furthermore, the shape of the flat portion 2223 is not particularly limited to the above description, and the flat portion 2223 may be formed in a part of the lateral portion 222.

An angle $\theta_3$ between the lateral portion 222 and the upper surface 223 is preferably within a range of 90° to 170° (90°≤$\theta_3$≤170°), and is more preferably within a range of 90° to 120° (90°≤$\theta_3$≤120°), from the viewpoint of suppressing the diffuse reflection of light on the lateral portion 222. In this embodiment, in one first conductor wire 221A, an angle between one lateral portion 222 and the upper surface 223 and an angle between the other lateral portion 222 and the upper surface 223 are substantially identical to each other. Furthermore, in one first conductor wire 221A, the angle between one lateral portion 222 and the upper surface 223 and the angle between the other lateral portion 222 and the upper surface 223 may be different from each other.

In this embodiment, it is preferable that the surface roughness of the lower surface 224 of the first conductor wire 221A is rougher than the surface roughness of the upper surface 223 of the first conductor wire 221A, from the viewpoint of rigidly fixing the first conductor wire 221A to the adhesive layer 25. In this embodiment, the upper surface 223 includes a flat surface 2231, and thus, a relative relationship of the surface roughness of the first conductor wire 221A described above (a relationship in which the surface roughness of the lower surface 224 is rougher than the surface roughness of the upper surface 223) is established. Specifically, it is preferable that surface roughness Ra of the lower surface 224 of the first conductor wire 221A is within a range of 0.1 μm to 3 μm, whereas the surface roughness Ra of the upper surface 223 is within a range of 0.001 μm to 1.0 μm. It is more preferable that the surface roughness Ra of the lower surface 224 of the first conductor wire 221A is within a range of 0.1 μm to 0.5 μm, and it is more preferable that the surface roughness Ra of the upper surface 223 is within a range of 0.001 μm to 0.3 μm. In addition, a ratio of the surface roughness of the upper surface 223 to the surface roughness of the lower surface 224 (the surface roughness of the upper surface 223 with respect to the surface roughness of the lower surface 224) is preferably greater than or equal to 0.01 and less than 1, and is more preferably greater than or equal to 0.1 and less than 1. In addition, the surface roughness of the upper surface 223 is less than or equal to ⅕ of the width (a maximum width) of the first conductor wire 221A. Furthermore, such surface roughness can be measured by a JIS method (JIS B0601 (revised on Mar. 21, 2013)). The surface roughness of the upper surface 223 and the surface roughness of the lower surface 224 may be measured along the width direction of the first conductor wire 221A, or may be measured along the extending direction of the first conductor wire 221A.

Incidentally, as described in the JIS method (JIS B0601 (revised on Mar. 21, 2013)), the "surface roughness Ra" herein indicates "arithmetic average roughness Ra". The "arithmetic average roughness Ra" indicates a roughness parameter obtained by blocking a long wavelength component (a waviness component) from a sectional curve. The waviness component is separated from the sectional curve on the basis of measurement conditions required for obtaining a form (for example, the dimension and the like of the target).

In addition, in this embodiment, the lateral portion 222 includes the flat portion 2223. For this reason, the surface roughness of the lower surface 224 is relatively rougher than the surface roughness of the lateral portion 222. Specifically, it is preferable that the surface roughness Ra of the lower surface 224 of the first conductor wire 221A is within a range of 0.1 µm to 3 µm, whereas the surface roughness Ra of the lateral portion 222 is within a range of 0.001 µm to 1.0 µm. Furthermore, it is more preferable that the surface roughness Ra of the lateral portion 222 is within a range of 0.001 µm to 0.3 µm. The surface roughness of the lateral portion 222 may be measured along the width direction of the first conductor wire 221A, or may be measured along the extending direction of the first conductor wire 221A.

In this embodiment, the surface roughness of the lower surface 224 is relatively rougher than the surface roughness of the upper surface 223 and the surface roughness of the lateral portion 222, and thus, the diffuse reflectance of the wiring body 2 on a side of a surface except for the lower surface 224 (that is, the upper surface 223 and the lateral portion 222) is relatively smaller than the diffuse reflectance of the wiring body 2 on a side of the lower surface 224. A ratio of the diffuse reflectance of the wiring body 2 on the side of the surface except for the lower surface 224 to the diffuse reflectance of the wiring body 2 on the side of the lower surface 224 (the diffuse reflectance of the wiring body 2 on the side of the surface except for the lower surface 224 with respect to the diffuse reflectance of the wiring body 2 on the side of the lower surface 224) is preferably greater than or equal to 0.1 and less than 1, and is more preferably greater than or equal to 0.3 and less than 1, from the viewpoint of improving the visibility of the wiring body 2.

An example of the shape of the first conductor wire having a relative relationship of the surface roughness between the lower surface described above and a surface except for the lower surface will be described with reference to FIG. 5. As illustrated in FIG. 5, in a first conductor wire $221A_1$ configured of conductive particles M and a binder resin B, conductive particles M are dispersed in the binder resin B. In a sectional surface of the first conductor wire $221A_1$ in a width direction, a part of the conductive particles M protrudes from the binder resin B in a lower surface 224B of the first conductor wire $221A_1$. For this reason, the lower surface 224B has a concave-convex shape. On the other hand, in an upper surface 223B and a lateral portion 222B, the binder resin B is inserted between the conductive particles M, and the binder resin B covers the conductive particles M. For this reason, the upper surface 223B includes a flat portion 2231B, and the lateral portion 222B includes a flat portion 2223B. Furthermore, in the upper surface 223B and the lateral portion 222B, the conductive particles M are covered with the binder resin B, and thus, the electrical insulating properties between the adjacent first conductor wires $221A_1$ are improved, and the occurrence of a migration is suppressed.

In a shape illustrated in FIG. 5, the lower surface 224B has a concave-convex shape, and the upper surface 223B includes the flat portion 2231B. For this reason, the surface roughness of the lower surface 224B is relatively rougher than the surface roughness of the upper surface 223B. Similarly, in the shape illustrated in FIG. 5, the lateral portion 222B includes the flat portion 2223B. For this reason, the surface roughness of the lower surface 224B is relatively rougher than the surface roughness of the lateral portion 222B. Furthermore, the shape of the upper surface and the lower surface (the lateral portion) of the first conductor wire is not particularly limited to the above description.

As illustrated in FIG. 1, the lead-out wiring layer 23 is led out from a linear outer edge portion 220 disposed in the reticular electrode layer 22 on a −Y axis direction side in the drawing. The lead-out wiring layer 23 and the reticular electrode layer 22 described above are integrally formed of the same material as that of the reticular electrode layer 22. Furthermore, "integrally" indicates that members are not separated from each other, and are formed of the same material (conductive particles having the same particle diameter, a binder resin, and the like) as an integrated structure. In the outer edge of the reticular electrode layer 22, a position in which the lead-out wiring layer 23 is disposed is not particularly limited. In addition, the outer edge portion 220 may be omitted from the configuration of the wiring body 2, and in this case, the lead-out wiring layer 23 and the reticular electrode layer 22 are directly connected to each other.

As illustrated in FIG. 3, the lead-out wiring layer 23 of this embodiment includes a reticulation portion 232 configured by gathering unit reticulations U formed by allowing second conductor wires 231A arranged in parallel to each other and second conductor wires 231B arranged in parallel to each other to intersect with each other approximately at a right angle. The unit reticulation U includes an end portion $U_1$ which is an intersection point between the second conductor wires 231A and 231B. The unit reticulation U of this embodiment is approximately in the shape of a square in the planar view, and includes four end portions $U_1$. Furthermore, the shape of the unit reticulation U is not particularly limited. For example, the shape of the unit reticulation U may be a reticulation shape such as a square shape or a rectangular shape, and a rhombic shape, or may be a reticulation shape such as a hexagonal shape (a honeycomb-like shape) or a circular shape. In addition, the shape of a reticulation of a mesh configured of the second conductor wires 231A and 231B may be a triangular shape such as an equilateral-triangular shape, an isosceles-triangular shape, and a right-triangular shape, or may be a quadrangular shape such as a parallelogram-like shape and a trapezoidal shape. In addition, the shape of the reticulation may be an n-polygonal shape such as a hexagonal shape, an octagonal shape, a dodecagonal shape, and an icosagonal shape, a circular shape, an elliptical shape, a star-like shape, or the like. Furthermore, even though it is not particularly illustrated, a terminal used at the time of being connected to a driving circuit C may be disposed on an end portion of the lead-out wiring layer 23, and in this case, the terminal may also has the same reticulation shape as that of the lead-out wiring layer 23.

In this embodiment, the second conductor wires 231A and 231B are arranged by being respectively inclined at 45° with respect to a Y axis direction in FIG. 3 (an extending direction of the lead-out wiring layer 23), and may be arranged by being respectively inclined at other angles (for example, 30°). Furthermore, the second conductor wires 231A and 231B may extend into the shape of a curve, a horseshoe, a zigzag line, and the like, or a linear portion and portions in the shape of a curve, a horseshoe, a zigzag line, and the like may be mixed. Incidentally, it is preferable that an angle between the extending direction of the lead-out wiring layer 23 and an extending direction of the second conductor wire 231A and an angle between the extending direction of the lead-out wiring layer 23 and an extending direction of the second conductor wire 231B are substantially identical to each other. In this case, it is possible to align the position between the end portions $U_1$ existing in a lateral end portion of the lead-out wiring layer 23 along the extending direction of the lead-out wiring layer 23 (in particular, an outside end portion $U_{1a}$ (described below)), and thus, it is possible to set the width of the lead-out wiring layer 23 to be constant.

The width of such second conductor wires 231A and 231B is preferably within a range of 1 μm to 500 μm, is more preferably within a range of 3 μm to 100 μm, and is even more preferably within a range of 5 to 20 μm, from the viewpoint of improving the durability of the wiring body 2 while suppressing an increase in an electric resistance value of the lead-out wiring layer 23.

Furthermore, in this embodiment, four unit reticulations U arranged along an X axis direction in FIG. 3 and five unit reticulations U arranged along the X axis direction are alternately arranged along the Y axis direction. However, the arrangement of the unit reticulation is not particularly limited thereto. In addition, in this embodiment, the reticulation portion 232 of the lead-out wiring layer 23 is configured only of the unit reticulations U having one type of shape and one type of size, but is not particularly limited thereto. For example, the reticulation portion 232 may be configured of unit reticulations having types of shapes or types of sizes.

In this embodiment, a width L of the reticulation portion 232 (in this example, which is identical to the width of the lead-out wiring layer 23), as illustrated in FIG. 3, is defined by the outside end portion $U_{1a}$ of the unit reticulation U. The outside end portion $U_{1a}$ indicates an end portion positioned on the outermost side in the end portion $U_1$ of the unit reticulation U existing in the lateral end portion of the lead-out wiring layer 23. That is, the lateral end portion of the lead-out wiring layer 23 is formed by arranging the unit reticulations U side by side along the extending direction of the lead-out wiring layer 23, and the second conductor wires 231A and 231B which do not configure the unit reticulation U are not in a state where the second conductor wires 231A and 231B protrude towards the outside, in the lateral end portion of the lead-out wiring layer 23. In other words, the lateral end portion of the lead-out wiring layer 23 is closed by the second conductor wires 231A and 231B connected to the outside end portion $U_{1a}$. At least one of the second conductor wires 231A and 231B connected to the outside end portion $U_{1a}$ is disposed by being inclined with respect to the extending direction of the lead-out wiring layer 23. In this embodiment, one second conductor wire 231A and one second conductor wire 231B are connected to the outside end portion $U_{1a}$, and both of the conductor wires 231A and 231B are arranged by being inclined with respect to the extending direction of the lead-out wiring layer 23. For this reason, the lateral end portion of the lead-out wiring layer 23 has a shape of a wave configured of the second conductor wires 231A and 231B.

As illustrated in FIG. 2, a lateral portion 230 of the second conductor wires 231A and 231B and the lateral portion of the support portion 251 of the adhesive layer 25 are smoothly continuous, and thus, form one flat surface. The second conductor wires 231A and 231B has a tapered shape which narrows towards a side separated from the substrate 21 (the +Z axis direction side in FIG. 2), and thus, a sectional shape of an outer surface of the second conductor wires 231A and 231B (a sectional shape of the second conductor wires 231A and 231B in the extending direction) is approximately in the shape of a trapezoid.

The shape of the second conductor wire 231A will be described in detail by using FIG. 4(B). Furthermore, the second conductor wire 231B has the same fundamental configuration as that of the second conductor wire 231A. Therefore, in the second conductor wire 231B, the repetitive description will be omitted, and the description of the second conductor wire 231A will be used.

As illustrated in FIG. 4(B), the second conductor wire 231A includes a lower surface 236, an upper surface 235, and the lateral portion 230, in a sectional surface of the second conductor wire 231A in a width direction. The lower surface 236 is in contact with the upper surface of the support portion 251. The upper surface 235 is positioned on a side opposite to the lower surface 236 in the second conductor wire 231A. The upper surface 235 is substantially parallel to the main surface of the substrate 21 (the upper surface of the smooth portion 252 of the adhesive layer 25).

The upper surface 235 includes a flat portion 2351 in the sectional surface of the second conductor wire 231A in the width direction. The flat portion 2351 is a linear portion which exists in the upper surface 235 (that is, a portion having a maximum curvature radius), in the sectional surface of the second conductor wire 231A in the width direction, and has a flatness of less than or equal to 0.5 μm. The flatness of the flat portion 2351 may be measured by the same method as the measurement method of the flatness of the flat portion 2231.

The flat portion 2351 of this embodiment is formed approximately on the entire upper surface 235. Furthermore, the flat portion 2351 may be formed on a part of the upper surface 235, but is not particularly limited to the above description. In this case, for example, the flat portion may be formed in a region in which both ends of the upper surface are not included. In a case where the flat portion is formed on a part of the upper surface, the width of the flat portion is at least ½ with respect to the width of the upper surface.

The lateral portion 230 is positioned between the upper surface 235 and the lower surface 236. The lateral portion 230 is connected to the upper surface 235 in a first portion 2301, and is connected to the lower surface 236 in a second portion 2302. The second conductor wire 231A of this embodiment has a tapered shape which narrows towards a side separated from the substrate 21, and thus, the second portion 2302 is positioned on the outside from the first portion 2301, in the sectional surface of the second conductor wire 231A in the width direction. The lateral portion 230 of this embodiment is a surface extending on a virtual straight line (not illustrated) which passes through the first portion 2301 and the second portion 2302, in the sectional surface of the second conductor wire 231A in the width direction.

Furthermore, the shape of the lateral portion 230 is not particularly limited to the above description. For example, the lateral portion 230 may have an arc-like shape protruding towards the outside, in the sectional surface of the second conductor wire 231A in the width direction. In this case, the lateral portion 230 exists on the outside from the virtual straight line which passes through the first portion 2301 and the second portion 2302. That is, it is preferable that the shape of the lateral portion 230 is a shape in which a part of the lateral portion 230 does not exist on the inside from the virtual straight line passing through the first portion 2301 and the second portion 2302, in the sectional surface of the second conductor wire 231A in the width direction. For example, in a case where the outline of the second conductor wire gradually increases as approaching the resin layer, in the sectional surface of the second conductor wire in the width direction, it is preferable that the lateral portion does not have an arc-like shape protruding towards the inside (that is, a shape in which the bottom of the second conductor wire widens).

The lateral portion 230 of this embodiment includes a flat portion 2303, in the sectional surface of the second conductor wire 231A in the width direction. The flat portion 2303 is a linear portion which exists in the lateral portion 230 (that is, a portion having a maximum curvature radius), in the sectional surface of the second conductor wire 231A in the width direction, and has a flatness of less than or equal to 0.5 μm. The flatness of the flat portion 2303 may be measured by the same method as the measurement method of the flatness of the flat portion 2231. In this embodiment, the flat portion 2303 is formed approximately in the entire lateral portion 230. Furthermore, the shape of the flat portion 2303 is not particularly limited to the above description, and the flat portion 2303 may be formed in a part of the lateral portion 230.

An angle $\theta_4$ between the lateral portion 230 and the upper surface 235 is preferably within a range of 90° to 170° ($90°\leq\theta_4\leq170°$), and is more preferably within a range of 90° to 120° ($90°\leq\theta_4\leq120°$). In this embodiment, in one second conductor wire 231A, an angle between one lateral portion 230 and the upper surface 235 and an angle between the other lateral portion 230 and the upper surface 235 are substantially identical to each other. Furthermore, in one second conductor wire 231A, the angle between one lateral portion 230 and the upper surface 235 and the angle between the other lateral portion 230 and the upper surface 235 may be different from each other.

In this embodiment, it is preferable that the surface roughness of the lower surface 236 of the second conductor wire 231A is rougher than the surface roughness of the upper surface 235 of the second conductor wire 231A from the viewpoint of rigidly fixing the second conductor wire 231A to the adhesive layer 25. In this embodiment, the upper surface 235 includes a flat surface 2351, and thus, a relative relationship of the surface roughness of the second conductor wire 231A described above (a relationship in which the surface roughness of the lower surface 236 is relatively rougher than the surface roughness of the upper surface 235) is established. Specifically, it is preferable that the surface roughness Ra of the lower surface 236 of the second conductor wire 231A is within a range of 0.1 μm to 3 μm, whereas the surface roughness Ra of the upper surface 235 is within a range of 0.001 μm to 1.0 μm. It is more preferable that the surface roughness Ra of the lower surface 236 of the second conductor wire 231A is within a range of 0.1 μm to 0.5 μm, and it is more preferable that the surface roughness Ra of the upper surface 235 is within a range of 0.001 μm to 0.3 μm. In addition, a ratio of the surface roughness of the upper surface 235 to the surface roughness of the lower surface 236 (the surface roughness of the upper surface 235 with respect to the surface roughness of the lower surface 236) is preferably greater than or equal to 0.01 and less than 1, and is more preferably greater than or equal to 0.1 and less than 1. In addition, it is preferable that the surface roughness of the upper surface 235 is less than or equal to ⅓ of the width (a maximum width) of the second conductor wire 231A. Furthermore, such surface roughness can be measured by a JIS method (JIS B0601 (revised on Mar. 21, 2013)). The surface roughness of the upper surface 235 and the lower surface 236 may be measured along the width direction of the second conductor wire 231A, or may be measured along the extending direction of the second conductor wire 231A.

In addition, in this embodiment, the lateral portion 230 includes the flat portion 2303. For this reason, the surface roughness of the lower surface 236 is relatively rougher than the surface roughness of the lateral portion 230. Specifically, it is preferable that the surface roughness Ra of the lower surface 236 of the second conductor wire 231A is within a range of 0.1 μm to 3 μm, whereas the surface roughness Ra of the lateral portion 230 is within a range of 0.001 μm to 1.0 μm. Furthermore, it is more preferable that the surface roughness Ra of the lateral portion 230 is within a range of 0.001 μm to 0.3 μm. The surface roughness of the lateral portion 230 may be measured along the width direction of the second conductor wire 231A, or may be measured along the extending direction of the second conductor wire 231A.

Examples of the shape of the second conductor wire having a relative relationship of the surface roughness between the lower surface described above and a surface except for the lower surface are capable of including the same shape as that of the first conductor wire $221A_1$ illustrated in FIG. 5. That is, in the sectional surface of the second conductor wire in the width direction, a part of the conductive particles protrudes from the binder resin in the lower surface of the second conductor wire. On the other hand, in the upper surface and the lateral portion of the second conductor wire, the binder resin is inserted between the conductive particles, and the binder resin covers the conductive particles, in the sectional surface of the second conductor wire in the width direction. In this case, the lower surface has a concave-convex shape, and the upper surface includes the flat portion. For this reason, the surface roughness of the lower surface of the second conductor wire is relatively rougher than the surface roughness of the upper surface of the second conductor wire. In addition, in this example, the lateral portion of the second conductor wire also includes the flat portion. For this reason, the surface roughness of the lower surface of the second conductor wire is relatively rougher than the surface roughness of the lateral portion of the second conductor wire. Furthermore, the shape of the lower surface and the upper surface (the lateral portion) of the second conductor wire is not particularly limited to the above description.

An adhesive surface between the second conductor wires 231A and 231B and the support portion 251 of the adhesive layer 25 (for example, the lower surface 236 of the second conductor wire 231A) is slightly curved towards a side separated from the substrate 21 (the +Z axis direction side in FIG. 2). Furthermore, the curvature of the adhesive surface is greater than the curvature of the adhesive surface between the first conductor wires 221A and 221B and the support portion 251. Incidentally, the adhesive surface between the first conductor wires 221A and 221B and the support portion 251 and the adhesive surface between the second conductor wires 231A and 231B and the support portion 251 have a slightly concave-convex shape due to the influence of the conductive particles or the like contained in the conductor wire as illustrated in FIG. 2.

Furthermore, the sectional shape of the outer surface of the second conductor wires 231A and 231B is not particularly limited thereto. For example, the sectional shape of the second conductor wires 231A and 231B may be a square shape, a rectangular shape, a triangular shape, and the like.

In this embodiment, as illustrated in FIG. 3, the second conductor wire 231A and the second conductor wire 231B, which configure the lead-out wiring layer 23, have approximately the same width (a maximum width in the sectional view with respect to the extending direction of the second conductor wires 231A and 231B) $W_2$. In this embodiment, the width $W_1$ of the first conductor wires 221A and 221B and the width $W_2$ of the second conductor wires 231A and 231B satisfy a relationship of Formula (4) described below.

$$W_1 \leq W_2 \tag{4}$$

Formula (4) described above may not be necessarily satisfied, but it is preferable that Formula (4) described above is satisfied from the viewpoint of suppressing an increase in the electric resistance value of the lead-out wiring layer 23. It is preferable that the width $W_2$ of the second conductor wires 231A and 231B is less than or equal to four times the width $W_1$ of the first conductor wires 221A and 221B ($W_2 \leq 4 \times W_1$), from the viewpoint of reducing a disconnection portion.

In addition, in the wiring body 2 of this embodiment, Formula (5) described below is satisfied.

$$P_1 > P_2 \tag{5}$$

Here, in Formula (5) described above, $P_1$ is a pitch between the adjacent first conductor wires 221A (a distance between the centers) and a pitch between the adjacent first conductor wires 221B in the reticular electrode layer 22 (refer to FIG. 1), and $P_2$ is a pitch between the adjacent second conductor wires 231A (a distance between the centers) and a pitch between the adjacent second conductor wires 231B (a distance between the centers) in the lead-out wiring layer 23 (refer to FIG. 3). Formula (5) described above may not be necessarily satisfied, but it is preferable that Formula (5) described above is satisfied from the viewpoint of suppressing an increase in the electric resistance value of the lead-out wiring layer 23.

In this embodiment, as illustrated in FIG. 3, the second conductor wire 231A and the second conductor wire 231B are orthogonal to each other. For this reason, an aspect ratio of the unit reticulation U of this embodiment (a ratio ($D_2/D_1$) of a length $D_2$ of the unit reticulation U along the extending direction of the lead-out wiring layer 23 to a length $D_1$ of the unit reticulation U along the width direction with respect to the extending direction of the lead-out wiring layer 23) is 1. It is preferable that the aspect ratio is greater than 1.

In this embodiment, an aperture ratio of the lead-out wiring layer 23 is less than or equal to 50%. It is preferable that the aperture ratio of the lead-out wiring layer 23 is within a range of 10% to 50%, from the viewpoint of reducing a difference in the rigidity between the reticular electrode layer 22 and the lead-out wiring layer 23 or from the viewpoint of improving an effect of suppressing an increase in the electric resistance value of the lead-out wiring layer 23.

Figure 6:
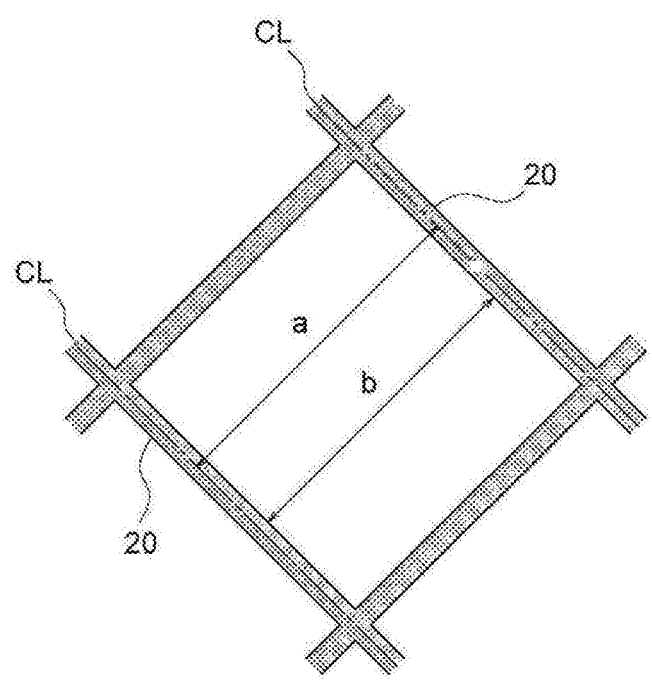
FIG. 6 is an explanatory diagram for describing an aperture ratio.

Furthermore, the "aperture ratio" indicates a ratio represented by Formula (6) described below (refer to FIG. 6).

$$(\text{Aperture Ratio}) = b \times b / (a \times a) \tag{6}$$

Here, in Formula (6) described above, a is a pitch between an arbitrary conductor wire 20 and the other conductor wire 20 which is adjacent to the arbitrary conductor wire 20 (a distance between center lines CL), and b is a distance between an arbitrary conductor wire 20 and the other conductor wire 20 which is adjacent to the arbitrary conductor wire 20.

As illustrated in FIG. 1, the wiring body 2 having the configuration as described above is connected to the driving circuit C through the lead-out wiring layer 23. In this embodiment, the lead-out wiring layers 23 are respectively extracted from the three reticular electrode layers 22.

At this time, as illustrated in FIG. 3, in the adjacent lead-out wiring layers 23, maximum portions 233 in which the width of the lead-out wiring layer 23 is maximized, are arranged to be shifted from each other by a distance S along the extending direction of the lead-out wiring layer 23. That is, the lead-out wiring layer 23 includes the maximum portion 233 in which the width of the lead-out wiring layer 23 along the extending direction is maximized, in the end portion $U_1$ of the unit reticulation U positioned in the lateral end portion (the intersection point between the second conductor wire 231A and the second conductor wire 231B). Then, in the adjacent lead-out wiring layers 23, the maximum portions 233 are shifted from each other by the distance S along the extending direction of the lead-out wiring layer 23. The distance $S_1$ is less than the length $D_2$ of the unit reticulation U along the extending direction of the lead-out wiring layer 23 ($S_1 < D_2$), and thus, the maximum portions 233 are arranged not to face each other along a direction in which the lead-out wiring layers face each other (the X axis direction in FIG. 3).

Furthermore, in this embodiment, four unit reticulations U arranged along the X axis direction in FIG. 3 and five unit reticulations U arranged along the X axis direction are alternately arranged along the Y axis direction. For this reason, the maximum portion 233 is periodically formed at intervals of a distance $D_2$ along the Y axis direction.

In addition, in this embodiment, as illustrated in FIG. 3, the lateral end portion of the lead-out wiring layer 23 is configured by including a convex portion 241 protruding towards the outside of the lead-out wiring layer 23, in the planar view, and a concave portion 242 recessed towards the inside of the lead-out wiring layer 23, in the planar view. The convex portion 241 is configured by including the outside end portion $U_{1a}$ and the second conductor wires 231A and 231B connected to and outside end portion $U_{1a}$. The concave portion 242 and the convex portion 241 are alternately arranged along the extending direction of the lead-out wiring layer 23. In this embodiment, in the adjacent lead-out wiring layers 23 and 23, the convex portion 241 configuring the lateral end portion of the other lead-out wiring layer 23 on a +X axis direction side (the lead-out wiring layer on a −X axis direction side) facing the lateral end portion of one lead-out wiring layer 23 on the −X axis direction side (for example, the lead-out wiring layer on the +X axis direction side) and the convex portion 241 configuring the lateral end portion of one lead-out wiring layer 23 on the −X axis direction side facing the lateral end portion of the other lead-out wiring layer 23 on the +X axis direction side are shifted from each other along the extending direction of the lead-out wiring layers 23 and 23.

In addition, in this embodiment, in the adjacent lead-out wiring layers 23 and 23, the convex portion 241 configuring the lateral end portion of the other lead-out wiring layer 23 on the +X axis direction side (the lead-out wiring layer on the −X axis direction side) facing the lateral end portion of one lead-out wiring layer 23 on the −X axis direction side (for example, the lead-out wiring layer on the +X axis direction side) and the concave portion 242 configuring the lateral end portion of one lead-out wiring layer 23 on the −X axis direction side facing the lateral end portion of the other lead-out wiring layer 23 on the +X axis direction side face each other in a direction which is orthogonal to the extending direction of the lead-out wiring layers 23 and 23. In addition, in the adjacent lead-out wiring layers 23 and 23, the concave portion 242 configuring the lateral end portion of the other lead-out wiring layer 23 on the +X axis direction side (the lead-out wiring layer on the −X axis direction side) facing the lateral end portion of one lead-out wiring layer 23 on the −X axis direction side (for example, the lead-out wiring layer on the +X axis direction side) and the convex portion 241 configuring the lateral end portion of one lead-out wiring layer 23 on the −X axis direction side facing the lateral end portion of the other lead-out wiring layer 23 on the +X axis direction side face each other in the direction which is orthogonal to the extending direction of the lead-out wiring layers 23 and 23.

In the touch sensor 1 of this embodiment, the second reticular electrode layer (not illustrated) disposed to intersect with the extending direction of the reticular electrode layer 22 is disposed on the wiring board 10 through the resin layer for ensuring the insulation with respect to the reticular electrode layer 22. Then, the reticular electrode layer 22 and the second reticular electrode layer are respectively connected to the driving circuit C. The driving circuit C periodically applies a predetermined voltage between the reticular electrode layer 22 and the second reticular electrode layer, a contact position of a finger of an operator in the touch sensor 1 is determined on the basis of a change in the electrostatic capacitance at each intersection point between two reticular electrode layers. Furthermore, the touch sensor may be configured by overlapping two wiring boards 10 with each other such that the extending directions of the reticular electrode layers 22 are orthogonal to each other.

Next, a method for producing the wiring board 10 of this embodiment will be described. FIG. 7(A) to FIG. 7(E) are sectional views (simplified diagrams) illustrating the method for producing the wiring board 10 of the embodiment of the invention.

Figure 7C:
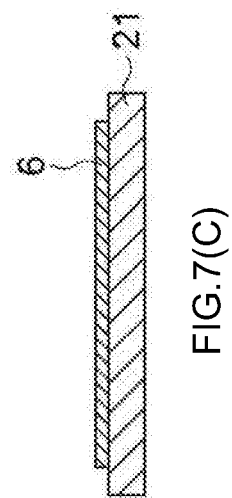
FIG. 7(A) to FIG. 7(E) are sectional views illustrating a method for producing a wiring board of the first embodiment of the invention.
Figure 7B:
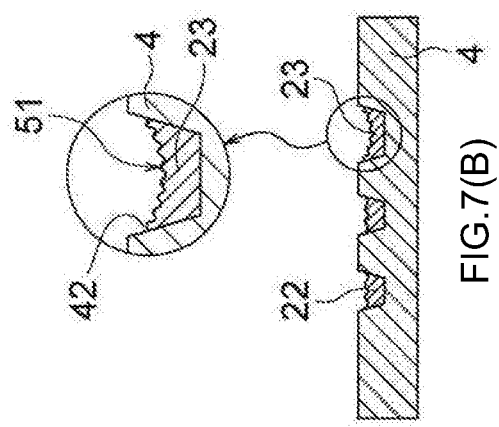
Figure 7E:
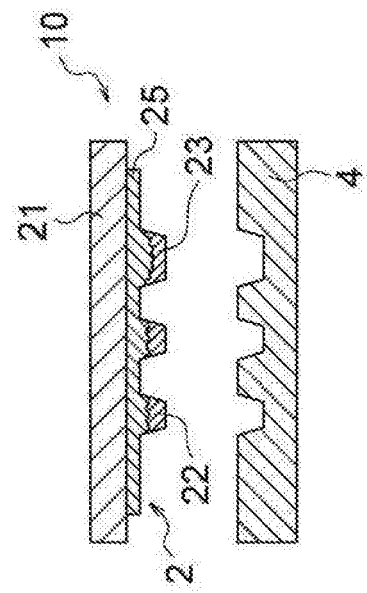
Figure 7A:
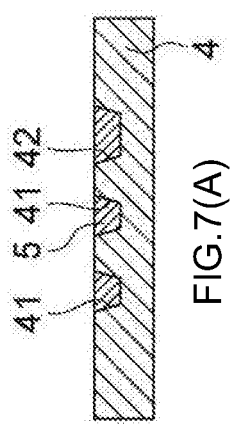

First, as illustrated in FIG. 7(A), an intaglio 4 is prepared on which a first recessed portion 41 having a shape corresponding to the shape of the reticular electrode layer 22 and a second recessed portion 42 having a shape corresponding to the shape of the lead-out wiring layer 23 are formed.

Glasses such as nickel, silicon, and silicon dioxide, organic silicas, glassy carbon, a thermoplastic resin, a photocurable resin, and the like can be exemplified as a material configuring the intaglio 4. The width of the first recessed portion 41 is preferably within a range of 50 nm to 1000 µm, is more preferably within a range of 500 nm to 150 µm, is even more preferably within a range of 1 µm to 10 µm, and is still even more preferably within a range of 1 µm to 5 µm. In addition, the depth of the first recessed portion 41 is preferably within a range of 100 nm to 100 µm, is more preferably within a range of 500 nm to 10 µm, and is even more preferably within a range of 1 µm to 5 µm. On the other hand, the width of the second recessed portion 42 is preferably within a range of 1 µm to 500 µm, is more preferably within a range of 3 µm to 100 µm, and is even more preferably within a range of 5 to 20 µm. In addition, the depth of the second recessed portion 42 is preferably within a range of 1 µm to 500 µm, is more preferably within a range of 1 µm to 100 µm, and is even more preferably within a range of 5 µm to 30 µm. In this embodiment, a sectional shape of the first recessed portion 41 and the second recessed portion 42 is a tapered shape which narrows towards a bottom portion.

In order to improve releasability, it is preferable that a release layer (not illustrated) formed of a black lead-based material, a silicone-based material, a fluorine-based material, a ceramic-based material, an aluminum-based material, and the like, is formed in advance on front surfaces of the first recessed portion 41 and the second recessed portion 42.

The first recessed portion 41 and the second recessed portion 42 of the intaglio 4 described above are filled with a conductive material 5. The conductive paste as described above is used as such a conductive material 5.

Examples of a method of filling the first recessed portion 41 and the second recessed portion 42 of the intaglio 4 with the conductive material 5 are capable of including a dispense method, an ink jet method, and a screen printing method. Alternatively, a method in which coating is performed by a slit coating method, a bar coating method, a blade coating method, a dip coating method, a spray coating method, and a spin coating method, and then, the conductive material applied onto a portion other than the first recessed portion 41 and the second recessed portion 42 is wiped away or scraped away, is absorbed, is pasted, is washed, and is blown away, can be included. The composition or the like of the conductive material can be suitably changed according to the shape or the like of the intaglio.

Next, as illustrated in FIG. 7(B), the conductive material 5 filled in the first recessed portion 41 and the second recessed portion 42 of the intaglio 4 is heated, and thus, the reticular electrode layer 22 and the lead-out wiring layer 23 are formed. Heating conditions of the conductive material 5 can be suitably set according to the composition or the like of the conductive material. By such a heating treatment, the conductive material 5 is subjected to volume contraction, and a front surface 51 of the conductive material 5 in the lead-out wiring layer 23 has a curved shape. In addition, the front surface 51 of the conductive material 5 has a slightly concave-convex shape. At this time, an outer surface of the conductive material 5 except for an upper surface is formed to have a shape along the first recessed portion 41 and the second recessed portion 42.

Furthermore, a treatment method of the conductive material 5 is not limited to the heating. The conductive material 5 may be irradiated with an energy ray such as an infrared ray, an ultraviolet ray, and laser light, or may only be dried. In addition, two or more types of treatment methods may be combined. It is possible to increase a contact area between the reticular electrode layer 22 and the lead-out wiring layer 23, and the adhesive layer 25, and to more rigidly fix the reticular electrode layer 22 and the lead-out wiring layer 23 to the adhesive layer 25.

Subsequently, as illustrated in FIG. 7(C), an adhesive material 6 for forming the adhesive layer 25 is approximately evenly applied onto the substrate 21. The material configuring the adhesive layer 25 described above is used as such an adhesive material 6. A screen printing method, a spray coating method, a bar coating method, a dip method, an ink jet method, and the like can be exemplified as a method of applying the adhesive material 6 onto the substrate 21.

Figure 7D:
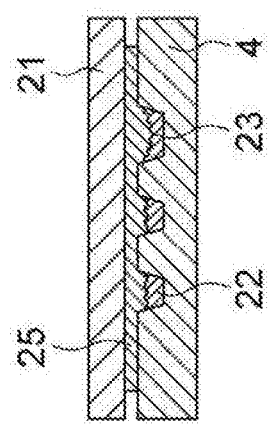

Next, as illustrated in FIG. 7(D), the substrate 21 and the adhesive material 6 are arranged on the intaglio 4 such that the adhesive material 6 inserted to the first recessed portion 41 and the second recessed portion 42 of the intaglio 4, the substrate 21 is pressed against the intaglio 4, and the adhesive material 6 is hardened. Irradiation of an energy ray such as an ultraviolet ray, an infrared ray, and laser light, heating, heating and cooling, drying, and the like can be exemplified as a method of hardening the adhesive material 6. Accordingly, the adhesive layer 25 is formed, and the substrate 21, and the reticular electrode layer 22 and the lead-out wiring layer 23 adhere to and are fixed to each other through the adhesive layer 25.

Furthermore, a formation method of the adhesive layer 25 is not particularly limited to the above description. For example, the adhesive material 6 is applied onto the intaglio 4 on which the reticular electrode layer 22 and the lead-out wiring layer 23 are formed (the intaglio 4 in a state illustrated in FIG. 7(B)), the substrate 21 is disposed on the adhesive material 6, and then, the adhesive material 6 is hardened in a state where the substrate 21 is disposed on and is pressed against the intaglio 4, and thus, the adhesive layer 25 may be formed. Furthermore, in a case where a thermoplastic material is used as the adhesive material 6, the adhesive material 6 is melted by being heated or the like, and then, is cooled, and thus, the adhesive layer 25 can be formed.

Subsequently, as illustrated in FIG. 7(E), the substrate 21, the adhesive layer 25, the reticular electrode layer 22, and the lead-out wiring layer 23 are released from the intaglio 4, and thus, it is possible to obtain the wiring board 10 including the wiring body 2.

Figure 8:
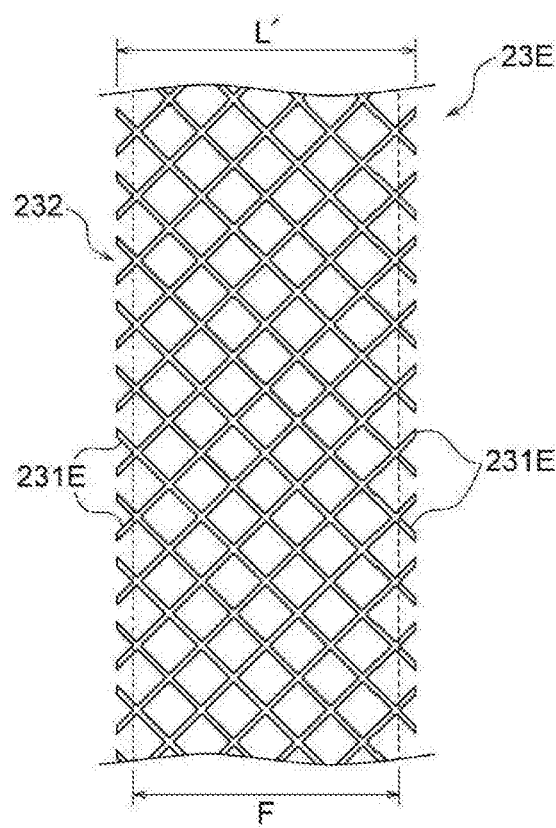
FIG. 8 is a plan view illustrating a lead-out wiring layer of a comparative example.

Next, the function of the wiring board including the wiring body of this embodiment will be described. FIG. 8 is a plan view illustrating a lead-out wiring layer of a comparative example.

In a case where the electrode layer is formed in the shape of a reticulation in order to ensure the transparency of the wiring board, and the lead-out wiring layer connected to the electrode layer is in a linear solid pattern, a difference in the rigidity between the electrode layer and the lead-out wiring layer increases, and thus, there is a case where a stress is concentrated on a boundary between the electrode layer and the lead-out wiring layer, and the electrode layer and the lead-out wiring layer are disconnected from each other. Such disconnection can be prevented by reducing the difference in the rigidity between the electrode layer and the lead-out wiring layer by forming the lead-out wiring layer in the shape of a reticulation, but in the case of simply forming the lead-out wiring layer in the shape of a reticulation, there is a case where the electric resistance value of the lead-out wiring layer increases.

That is, in the case of simply forming the lead-out wiring layer in the shape of a reticulation, as illustrated in FIG. 8, in a lateral end portion of a lead-out wiring layer 23E, a conductor wire 231E which does not configure a unit reticulation is disposed in a state where the conductor wire 231E protrudes towards the outside. In this case, the conductor wire 231E is not closed, and thus, the conductor wire 231E does not substantially contribute to the conduction of the lead-out wiring layer 23, a portion of the lead-out wiring layer 23E in which the conduction is substantially performed has a width F which is less than a width L' of the reticulation portion 232 of the lead-out wiring layer 23E (F<L'). For this reason, the lead-out wiring layer 23E has an electric resistance value greater than an electric resistance value which is assumed from the width L' of the actual reticulation portion 232.

In contrast, in the wiring body 2 of this embodiment, the width of the reticulation portion 232 is defined by the end portion of the unit reticulation U. Accordingly, the lateral end portion of the lead-out wiring layer 23 is in the shape of a wave configured by being closed by the second conductor wires 231A and 231B, and thus, the conduction of the lead-out wiring layer 23 is performed over the entire second conductor wires 231A and 231B existing in the entire width L of the reticulation portion 232 of the lead-out wiring layer 23. For this reason, in this embodiment, it is possible to suppress an increase in the electric resistance value of the lead-out wiring layer 23 while preventing the disconnection between the reticular electrode layer 22 and the lead-out wiring layer 23, and to improve the detection sensitivity of the touch sensor 1. Such an effect becomes more remarkable since a ratio of the width of the unit reticulation U to the width L of the reticulation portion 232 increases as the width L decreases.

In addition, in general, in a case where a protrusion is provided in a lateral portion of wiring, an electric field concentration easily occurs in the protrusion, and thus, a concern that a migration occurs between the adjacent wirings increases. That is, in the lead-out wiring layer 23E as illustrated in FIG. 8, the conductor wire 231E protrudes to the lateral end portion of the lead-out wiring layer 23E, and thus, there is a case where a concern that a migration occurs between the adjacent lead-out wiring layers increases.

In contrast, in the wiring body 2 of this embodiment, the second conductor wires 231A and 231B are closed in the lateral end portion of the lead-out wiring layer 23, and thus, it is possible to reduce a concern that a migration occurs between the adjacent lead-out wiring layers 23. As illustrated in FIG. 3, such an effect is further improved in a case where the maximum portions 233 in the width of the lead-out wiring layer 23 are shifted from each other along the extending direction of the lead-out wiring layer 23 between the adjacent lead-out wiring layers 23 (in a case where the convex portions 241 and 241 of the lateral end portion, which face each other, are shifted from each other between the adjacent lead-out wiring layers 23 and 23). In addition, such an effect is further improved in a case where in the lateral end portions of the adjacent lead-out wiring layers 23 and 23, which face each other, the convex portion 241 and the concave portion 242 which configure one lateral end portion and the concave portion 242 and the convex portion 241 which configure the other lateral end portion face each other in a direction which is orthogonal to the extending direction of the lead-out wiring layers 23 and 23. Further, in a case where the aspect ratio of the unit reticulation U (the ratio ($D_2/D_1$) of the length $D_2$ of the unit reticulation U along the extending direction of the lead-out wiring layer 23 to the length $D_1$ of the unit reticulation U along the width direction with respect to the extending direction of the lead-out wiring layer 23) is greater than 1, the maximum portion 233 (the convex portion 241) does not have an acute angle, and thus, the effect described above can be further improved.

In addition, when the reticulation portion is configured, there is a case where the conductor wire is disposed to extend in a direction which is orthogonal to and parallel to the extending direction of the lead-out wiring layer. In this case, a conduction path passing through the conductor wire extending in a direction perpendicular to the extending direction of the lead-out wiring layer is extremely longer than a conduction path passing through only the conductor wire extending in a direction parallel to the extending direction of the lead-out wiring layer. For this reason, a current preferentially flows into a conductor wire having comparatively low electric resistance (the conductor wire extending in the direction parallel to the extending direction of the lead-out wiring layer), and thus, a conductor wire having comparatively high electric resistance (the conductor wire extending in the direction perpendicular to the extending direction of the lead-out wiring layer) is not capable of sufficiently contributing to the conduction of the lead-out wiring layer. For this reason, there is a concern that the electric resistance of the lead-out wiring layer becomes greater than the assumed electric resistance. In contrast, in this embodiment, the second conductor wires 231A and 231B are arranged by being inclined with respect to the extending direction of the lead-out wiring layer 23. As a result thereof, it is possible to suppress the occurrence of a difference in the electric resistance value between second conductor wires 231A and 231B configuring the reticulation portion 232. Accordingly, the conduction of the lead-out wiring layer 23 is performed over the entire reticulation portion 232, and thus, it is possible to more reliably reduce the electric resistance of the lead-out wiring layer 23.

In addition, the lead-out wiring layer 23 is in the shape of a reticulation, and thus, when the wiring board 10 is produced, for example, it is possible to suppress the occurrence of the filling failure at the time of filling the intaglio 4 with the conductive material 5 by using a doctor blade (refer to FIG. 7(A)). That is, in a case where the lead-out wiring layer is in a linear solid pattern, a tip portion of the doctor blade is close to or is in contact with the bottom of the concave portion of the intaglio 4 corresponding to the lead-out wiring layer at the time of filling the intaglio 4 with the conductive material 5, and thus, there is a case where the filling failure of the conductive material 5 occurs. In this point, in this embodiment, the lead-out wiring layer 23 is in the shape of a reticulation, and thus, it is possible to reduce a concern that the tip portion of the doctor blade is close to or is in contact with the bottom of the second recessed portion 42 of the intaglio 4 is reduced, and to suppress the occurrence of the filling failure of the conductive material 5. Accordingly, it is possible to suppress the occurrence of the conduction failure of the lead-out wiring layer 23 in the completed touch sensor 1.

In addition, in the wiring body 2 of this embodiment, a relative relationship of the surface roughness (that is, a roughness parameter blocking a waviness component) between the lower surface 224 of the first conductor wire 221A and a surface except for the lower surface 224 (a surface including the upper surface 223 and the lateral portion 222), in the sectional surface of the first conductor wire 221A in the width direction, is also noticed, and the surface roughness Ra of the lower surface 224 is relatively rougher than the surface roughness Ra of the other surface. For this reason, it is possible to suppress the diffuse reflection of light which is incident from the outside while allowing the adhesive layer 25 to rigidly adhere to the first conductor wire 221A. In particular, in a case where the width of the first conductor wire 221A is within a range of 1 µm to 5 µm, a relative relationship of the surface roughness between the lower surface 224 and the other layer satisfies the relationship described above, and thus, it is possible to remarkably exhibit an effect of enabling the diffuse reflection of the light which is incident from the outside to be suppressed while allowing the adhesive layer 25 to rigidly adhere to the first conductor wire 221A.

In addition, in this embodiment, the lateral portion 222 extends to be substantially coincident with the virtual straight line passing through the first portion 2221 and the second portion 2222. In this case, in the sectional surface of the first conductor wire 221A in the width direction, a part of the lateral portion does not have a shape which does exist on the inside from the virtual straight line passing through the first portion and the second portion, and thus, the diffuse reflection of the light which is incident from the outside on the wiring body 2 is suppressed. Accordingly, it is possible to further improve the visibility of the wiring body 2.

In addition, in this embodiment, the surface roughness Ra of the lower surface 224 is relatively rougher than the surface roughness Ra of the surface except for the lower surface 224 (the surface including the upper surface 223 and the lateral portion 222), and thus, the diffuse reflectance of the wiring body 2 on the other surface side is relatively smaller than the diffuse reflectance of the wiring body 2 on the lower surface 224 side. Here, in a case where the diffuse reflectance of the wiring body 2 decreases, it is possible to prevent the first conductor wire 221A from being reflected to be white, and to suppress a contrast decrease in a region where the first conductor wire 221A can be viewed. Thus, it is possible to further improve the visibility of the wiring body 2 of this embodiment.

Furthermore, the first conductor wire 221B or the second conductor wires 231A and 231B also have the same fundamental configuration as that of the first conductor wire 221A. For this reason, the wiring body 2 includes the first conductor wire 221B or the second conductor wires 231A and 231B, and thus, it is possible to further exhibit the function and the effect described above.

Figure 9:
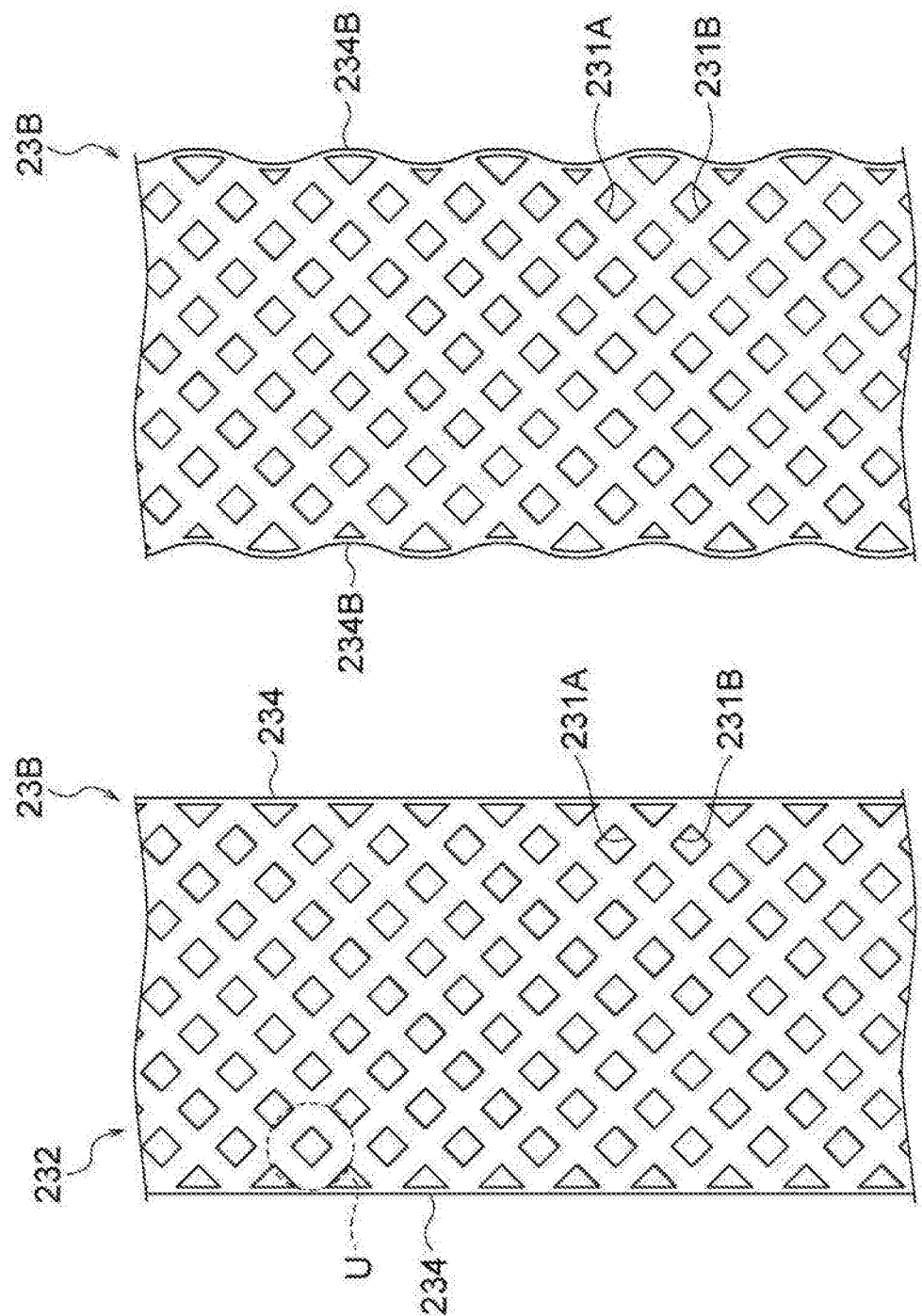
FIG. 9(A) and FIG. 9(B) are plan views respectively illustrating a first modification example and a second modification example of the lead-out wiring layer of the first embodiment of the invention.
Figure 10:
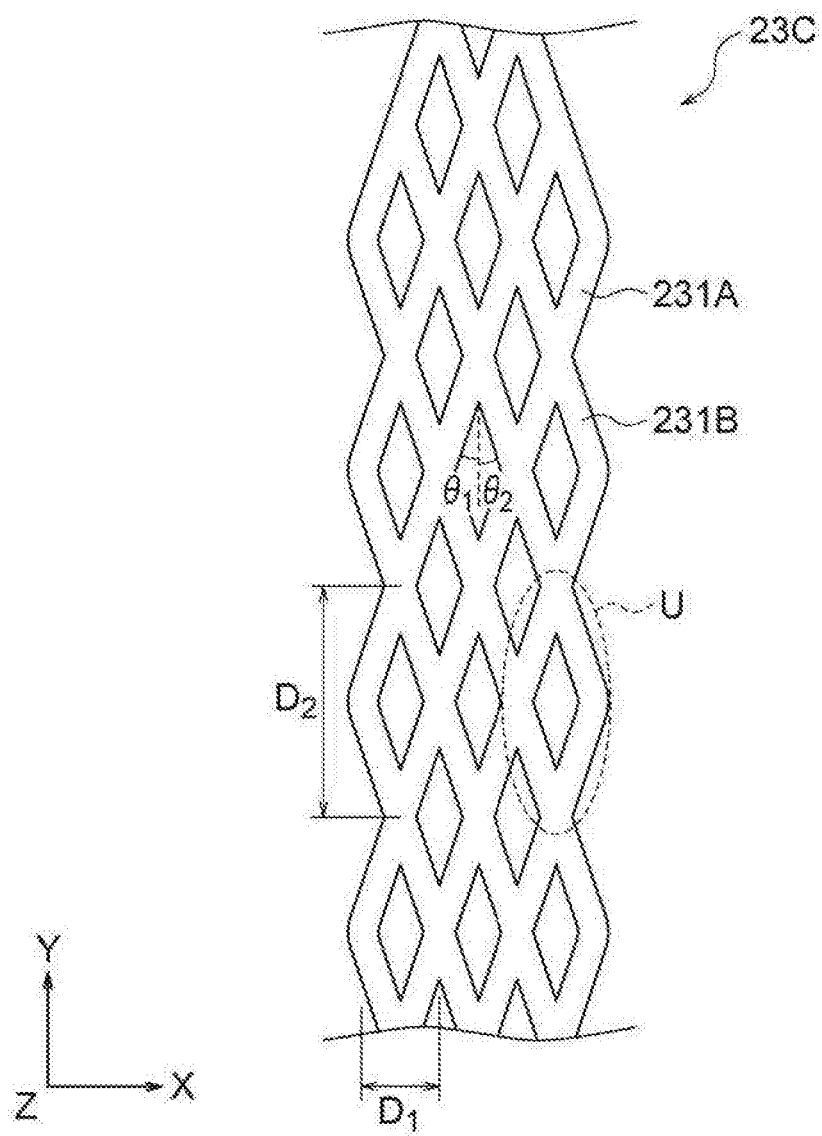
FIG. 10 is a plan view illustrating a third modification example of the lead-out wiring layer of the first embodiment of the invention.

Hereinafter, a modification example of the wiring board 10 (the wiring body 2) described in the first embodiment will be described. FIG. 9(A) and FIG. 9(B) are plan views respectively illustrating a first modification example and a second modification example of the lead-out wiring layer of the first embodiment of the invention, and FIG. 10 is a plan view illustrating a third modification example of the lead-out wiring layer of first embodiment of the invention.

For example, as illustrated in FIG. 9(A), a lead-out wiring layer 23B may includes a side portion 234 in addition to the reticulation portion 232. The side portion 234 couples the unit reticulations U arranged in the lateral end portion of the lead-out wiring layer 23B (specifically, the outside end portions $U_{1a}$) together. The side portion 234 is configured by using the same material and the same method as those of the reticulation portion 232, and thus, the side portion 234 and the reticulation portion 232 are integrally formed. In an example of FIG. 9(A), the side portion 234 has a linear shape, but is not particularly limited thereto, and as illustrated in FIG. 9(B), a side portion 234B may have a curved shape, and in this case, it is preferable that the side portion 234B is not disposed on the outside from the reticulation portion 232. Furthermore, it is preferable that the side portion 234B has a curved shape (a wavy shape), from the viewpoint of the filling properties of the conductive material 5 at the time of producing the wiring board 10.

In addition, it is preferable that the width of the side portion 234B is less than the width of the second conductor wires 231A and 231B, from the viewpoint of the filling properties of the conductive material 5 with respect to the intaglio 4 at the time of producing the wiring board 10. In the examples of FIG. 9(A) and FIG. 9(B), the side portions 234 and 234B are respectively disposed in both lateral end portions of the lead-out wiring layer 23B, but the side portions 234 and 234B may be disposed in only one lateral end portion of the lead-out wiring layer 23B.

In this case, the conduction between the outside end portions $U_{1a}$ of the unit reticulation U existing in the lateral end portion of the lead-out wiring layer 23B (that is, portions corresponding to the maximum portions 233 of the embodiment described above) is performed by the side portions 234 and 234B, and thus, it is possible to further suppress an increase in an electric resistance value of the lead-out wiring layer 23B. In addition, the shape of the lateral portion of the lead-out wiring layer 23B is smoothed by the side portions 234 and 234B, and thus, it is possible to further suppress the occurrence of the migration between the adjacent lead-out wiring layers 23B.

In addition, for example, the lead-out wiring layer may have a shape as illustrated in FIG. 10. In an example illustrated in FIG. 10, the second conductor wire 231A of a lead-out wiring layer 23C is disposed by being inclined at an angle $\theta_1$ with respect to a Y axis direction in FIG. 8 (an extending direction of the lead-out wiring layer 23C), and the second conductor wire 231B is disposed by being inclined at an angle $\theta_2$ with respect to a Y axis direction in FIG. 10. At this time, both of the angles $\theta_1$ and $\theta_2$ are less than 45° ($\theta_1 < 45°$ and $\theta_2 < 45°$), and thus, the aspect ratio of the unit reticulation U (the ratio ($D_2/D_1$) of the length $D_2$ of the unit reticulation U along the extending direction of the lead-out wiring layer 23C to the length $D_1$ of the unit reticulation U along the width direction with respect to the extending direction of the lead-out wiring layer 23C) is greater than an aspect ratio of the reticulation configuring the reticular electrode layer 22 (a ratio ($D_4/D_3$) (refer to FIG. 1)) of a length $D_4$ of the reticulation along the extending direction of the reticular electrode layer 22 to a length $D_3$ of the reticulation along the width direction with respect to the extending direction of the reticular electrode layer 22).

That is, in this example, the shape of the unit reticulation U of the lead-out wiring layer 23C is a shape which is stretched along the extending direction of the lead-out wiring layer 23C. It is preferable that the angles $\theta_1$ and $\theta_2$ described above are greater than or equal to 10°, and it is preferable that the aspect ratio ($D_2/D_1$) of the unit reticulation U is greater than 1 and less than or equal to 5 ($1 < (D_2/D_1) \le 5$).

In this case, it is possible to shorten the total distance of the second conductor wires 231A and 231B included in a predetermined distance along the extending direction of the lead-out wiring layer 23C, and thus, it is possible to further suppress an increase in an electric resistance value of the lead-out wiring layer 23C.

Hereinafter, the effect of the invention was confirmed by examples in which the invention is further embodied. In the following examples are for confirming the effect of suppressing an increase in the electric resistance value of the lead-out wiring layer of the first embodiment described above.

Example 1

In Example 1, the wiring board 10 as illustrated in FIG. 1 was prepared. At this time, a wire width $W_1$ of the first conductor wires 221A and 221B configuring the reticular electrode layer 22 was set to 2 μm, and a wire width $W_2$ of the second conductor wires 231A and 231B configuring the lead-out wiring layer 23 was set to 3 μm, and thus, a ratio ($W_2/W_1$) of the wire width $W_2$ of the second conductor wires 231A and 231B to the wire width $W_1$ of the first conductor wires 221A and 221B was set to 1.5. The height (the thickness) of the first conductor wires 221A and 221B and the second conductor wires 231A and 231B was set to 3 μm. A PET film was used as the substrate 21, and a thermosetting silver (Ag) paste was used as the conductive material 5. The first recessed portion 41 and the second recessed portion 42 of the intaglio 4 was filled with the conductive material 5 by performing coating according to a blade coating method, and then, by scraping away the conductive material which was applied onto a portion other than the first recessed portion 41 and the second recessed portion 42.

In this example, in the prepared wiring board 10, the electric resistance value between the reticular electrode layer 22 and the end portion of the lead-out wiring layer 23 was measured and the appearance was observed. In a case where the measured electric resistance value was less than ±10% of a designed value and the appearance of the lead-out wiring layer was also excellent, it was determined as "○" (excellent), and in a case where the measured electric resistance value was less than ±10% of the designed value, but a disconnection portion was occasionally observed on the appearance of the lead-out wiring layer, it was determined as "Δ" (allowable).

Example 2

In Example 2, a test sample was prepared by the same method as that of Example 1 except that the wire width $W_2$ of the second conductor wires 231A and 231B was set to 5 μm, and thus, the ratio ($W_2/W_1$) of the wire width $W_2$ of the second conductor wires 231A and 231B to the wire width $W_1$ of the first conductor wires 221A and 221B was set to 2.5.

Example 3

In Example 3, a test sample was prepared by the same method as that of Example 1 except that the wire width $W_2$ of the second conductor wires 231A and 231B was set to 7 μm, and thus, the ratio ($W_2/W_1$) of the wire width $W_2$ of the second conductor wires 231A and 231B to the wire width $W_1$ of the first conductor wires 221A and 221B was set to 3.5.

Example 4

In Example 4, a test sample was prepared by the same method as that of Example 1 except that the wire width $W_2$ of the second conductor wires 231A and 231B was set to 8 μm, and thus, the ratio ($W_2/W_1$) of the wire width $W_2$ of the second conductor wires 231A and 231B to the wire width $W_1$ of the first conductor wires 221A and 221B was set to 4.

Example 5

In Example 5, a test sample was prepared by the same method as that of Example 1 except that the wire width $W_2$ of the second conductor wires 231A and 231B was set to 10 μm, and thus, the ratio ($W_2/W_1$) of the wire width $W_2$ of the second conductor wires 231A and 231B to the wire width $W_1$ of the first conductor wires 221A and 221B was set to 5.

In Examples 1 to 5 described above, the results of confirming the effect of suppressing an increase in the electric resistance value of the lead-out wiring layer 23 are shown in Table 1 described below.

TABLE 1

|  | Example 1 | Example 2 | Example 3 | Example 4 | Example 5 |
|---|---|---|---|---|---|
| Wire width $W_1$ of first conductor wire [μm] | 2 | 2 | 2 | 2 | 2 |
| Wire width $W_2$ of second conductor wire [μm] | 3 | 5 | 7 | 8 | 10 |
| $W_2/W_1$ | 1.5 | 2.5 | 3.5 | 4 | 5 |
| Suppressing properties on increase in electric resistance value | ○ | ○ | ○ | ○ | Δ |

From the results described above, in all of Examples 1 to 5, the effect of suppressing an increase in the electric resistance value was confirmed, and in Examples 1 to 4, it was confirmed that the formed appearance of the lead-out wiring layer was particularly excellent. It is considered that this is because filling unevenness rarely occurs at the time of filling the second recessed portion 42 of the intaglio 4 with the conductive material 5 in the preparation of the wiring board 10, in a case where the ratio ($W_2/W_1$) of the wire width $W_2$ of the second conductor wires 231A and 231B to the wire width $W_1$ of the first conductor wires 221A and 221B is less than or equal to 4.

Second Embodiment

Figure 11:
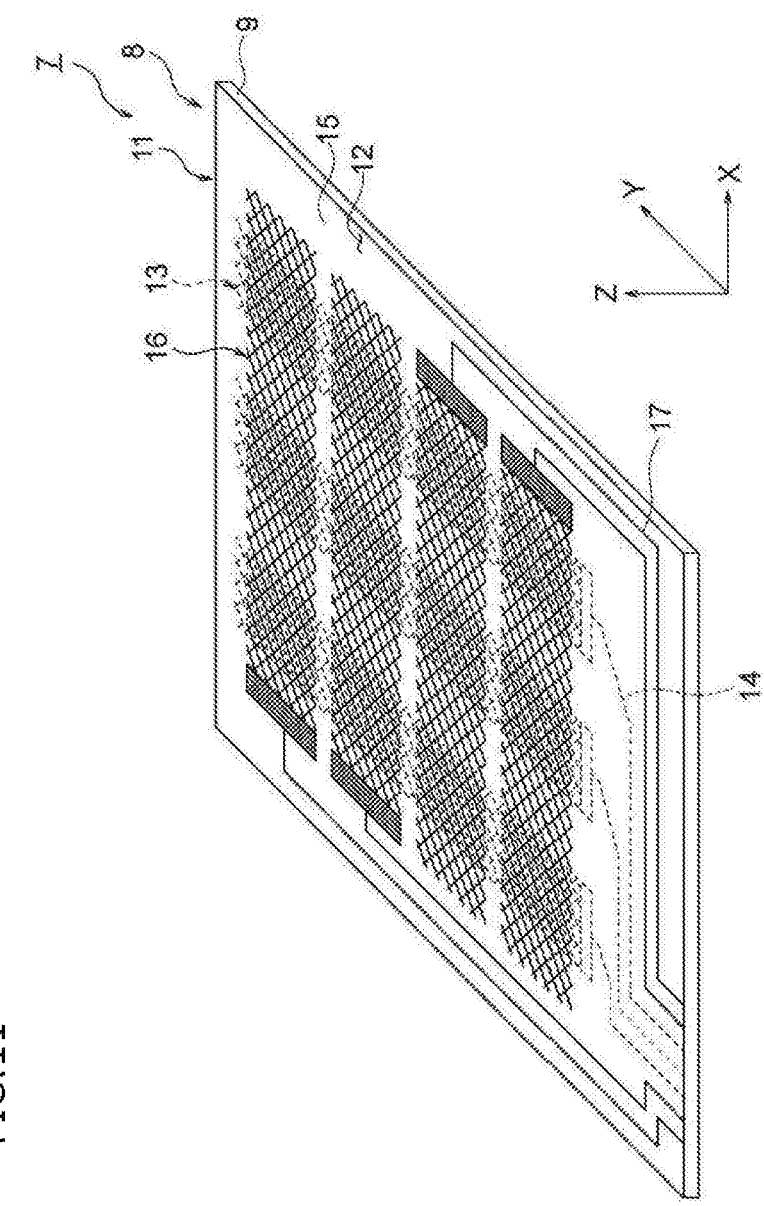
FIG. 11 is a perspective view illustrating a touch sensor of a second embodiment of the invention.
Figure 12:
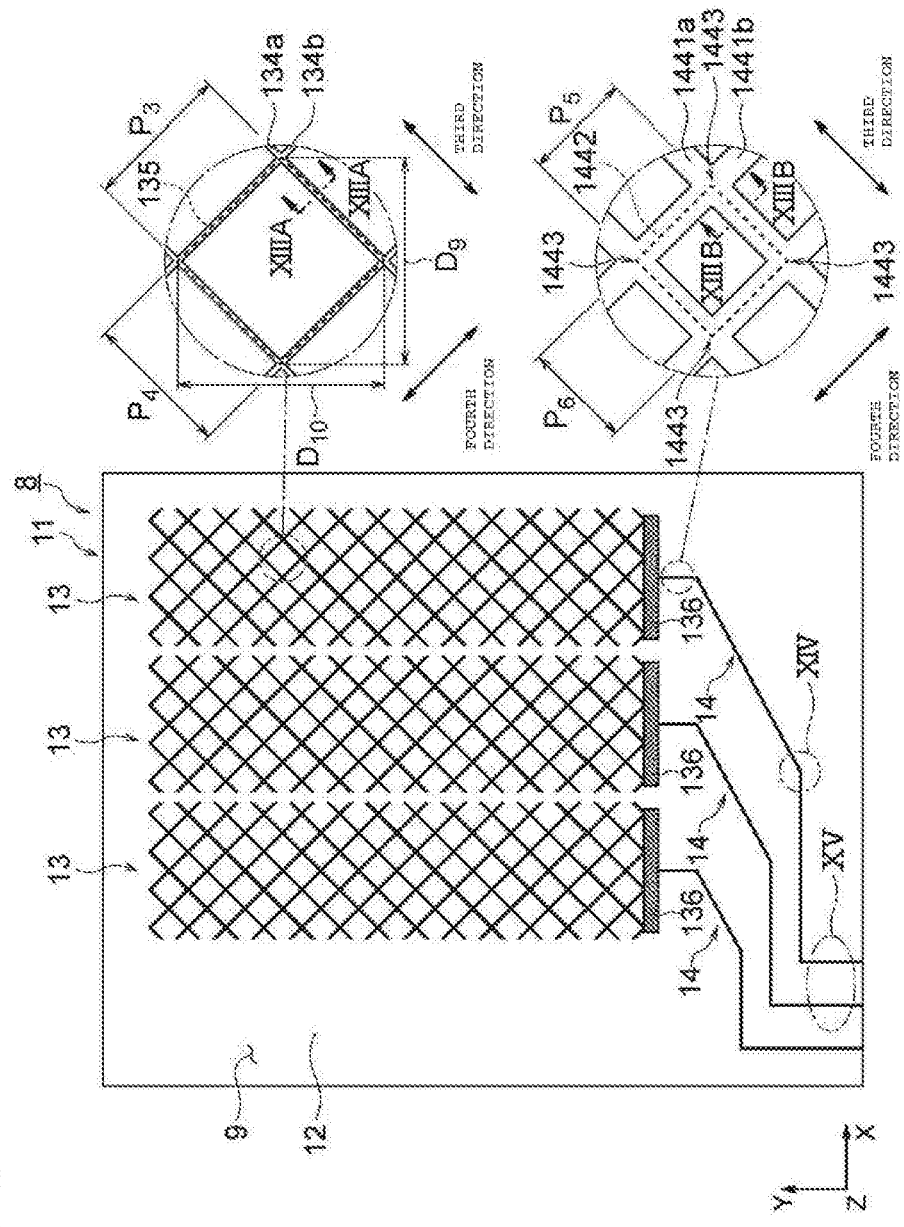
FIG. 12 is a plan view illustrating a wiring board of the second embodiment of the invention.
Figure 13B:
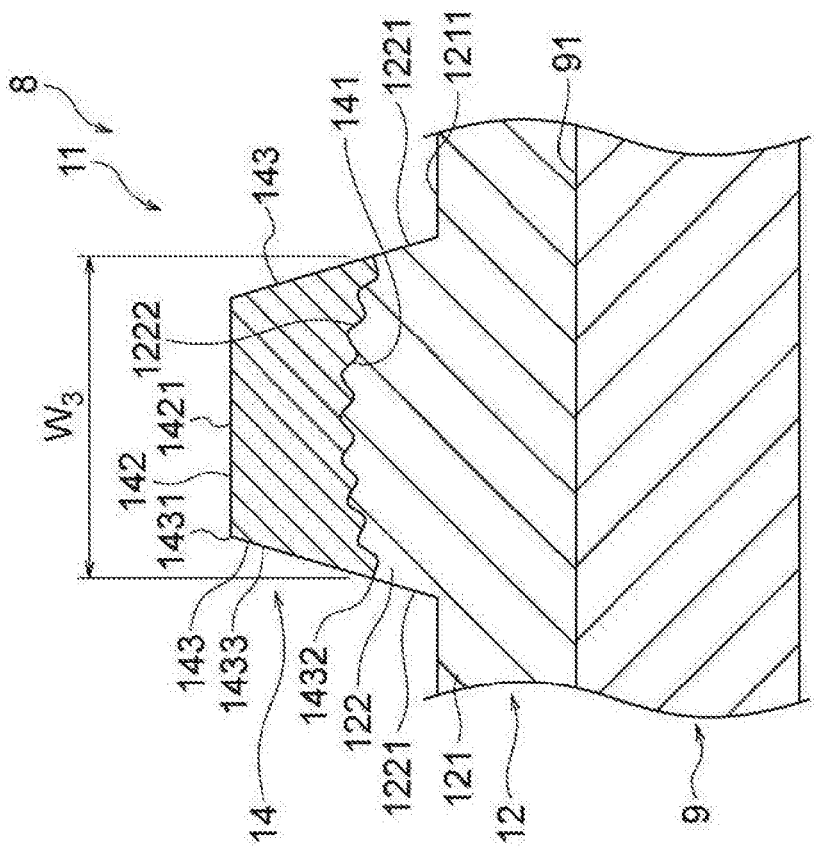
FIG. 13(B) is a sectional view taken along line XIIIB-XIIIB of FIG. 12.
Figure 13A:
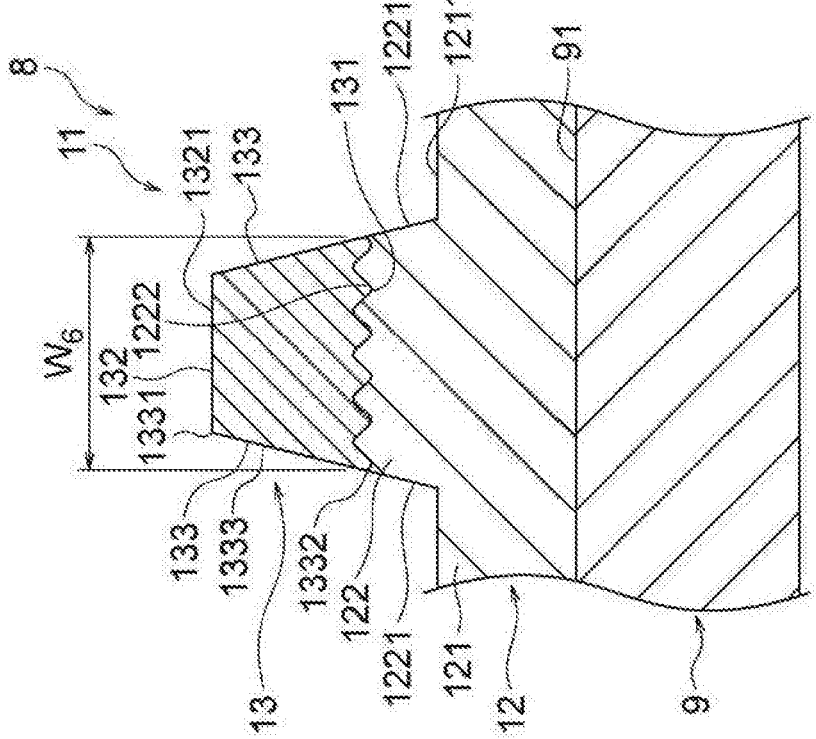
FIG. 13(A) is a sectional view taken along line XIIIA-XIIIA of FIG. 12.
Figure 14:
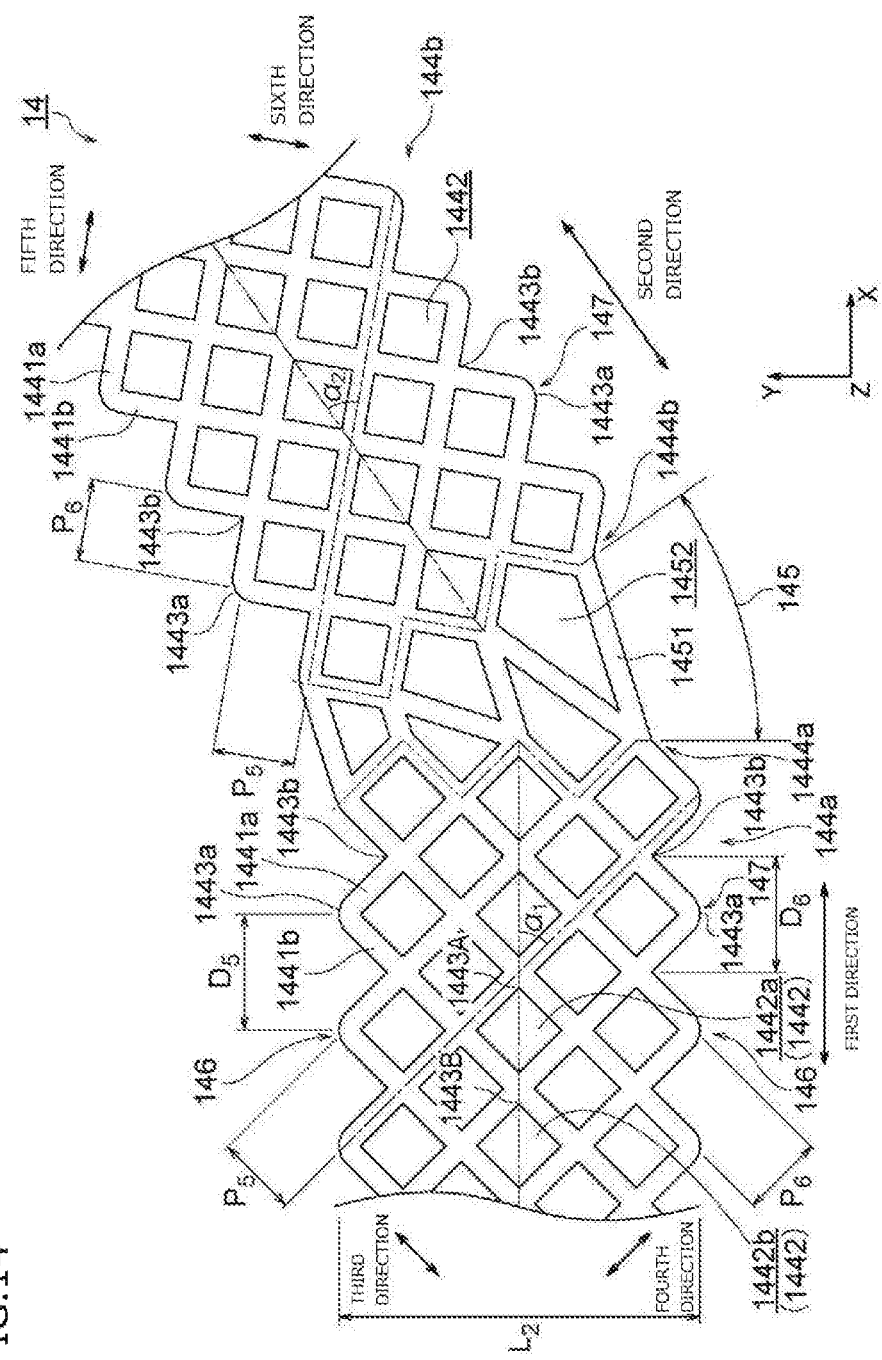
FIG. 14 is an enlarged plan view of a portion XIV of FIG. 12.
Figure 15:
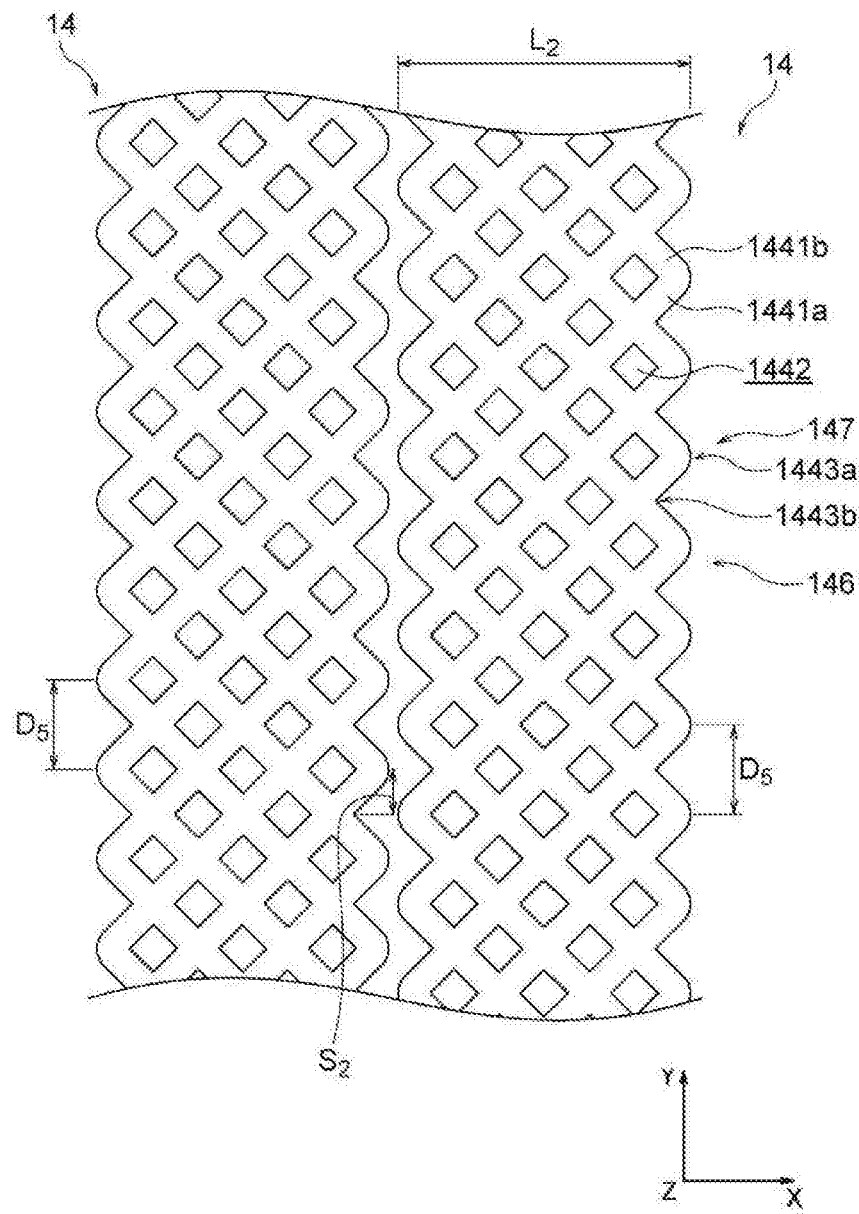
FIG. 15 is an enlarged plan view of a portion XV of FIG. 12.

FIG. 11 is a perspective view illustrating a touch sensor of a second embodiment of the invention, FIG. 12 is a plan view illustrating a wiring board of the second embodiment of the invention, FIG. 13(A) is a sectional view taken along line XIIIA-XIIIA of FIG. 12, FIG. 13(B) is a sectional view taken along line XIIIB-XIIIB of FIG. 12, FIG. 14 is an enlarged plan view of a portion XIV of FIG. 12, and FIG. 15 is an enlarged plan view of a portion XVI of FIG. 12.

A touch sensor 7 including a wiring body 11 of this embodiment, for example, is a touch input device which is used in an electrostatic capacitance type touch panel or an electrostatic capacitance type touch pad. As illustrated in FIG. 11 and FIG. 12, the touch sensor 7 includes a wiring board 8 including a substrate 9 and the wiring body 11, and a reticular electrode layer 16 and a lead-out wiring layer 17 laminated on the wiring board 8 (the wiring body 11) through a resin layer 15.

The reticular electrode layer 13 of the wiring body 11 is a plurality of (in this embodiment, three) detection electrodes which respectively extend in a Y direction, and the reticular electrode layer 16 is a plurality of (in this embodiment, four) detection electrodes disposed to face the reticular electrode layer 13 and respectively extend in an X direction. In the touch sensor 7, the reticular electrode layer 13 is connected to the external circuit through the lead-out wiring layer 14, and the reticular electrode layer 16 is connected to the external circuit through the lead-out wiring layer 17. Then, a predetermined voltage is periodically applied between the reticular electrode layers 13 and 16, and an operation position (the contact position) of the operator in the touch sensor 7 is determined on the basis of a change in the electrostatic capacitance at each intersection point between two reticular electrode layers 13 and 16.

Furthermore, in this embodiment, the resin layer 15 has the same configuration as that of the adhesive layer 12, the reticular electrode layer 16 has the same configuration as that of the reticular electrode layer 13, and the lead-out wiring layer 17 has the same configuration as that of the lead-out wiring layer 14. Therefore, herein, in the following description, the detailed description of the resin layer 15, the reticular electrode layer 16, and the lead-out wiring layer 17 will be omitted. In this embodiment, the "wiring board 8" corresponds to an example of the "wiring board" and the "touch sensor" of the invention.

The substrate 21 described in the first embodiment can be used as the substrate 9. In this embodiment, the "substrate 9" corresponds to an example of the "support" of the invention.

The wiring body 11 is formed on a main surface 91 of the substrate 9, and is supported by the substrate 9. The wiring body 11 includes the adhesive layer 12, the reticular electrode layer 13, and the lead-out wiring layer 14. In this embodiment, the "wiring body 11" corresponds to an example of the "wiring body" of the invention.

The adhesive layer 12 as the resin layer of this embodiment is a member which allows the substrate 9 and the reticular electrode layer 13 to adhere to and to be fixed to each other. Similarly, the adhesive layer 12 also allows the substrate 9 and the lead-out wiring layer 14 to adhere to and to be fixed to each other. The material configuring the adhesive layer 25 described in the first embodiment can be used as a material configuring such an adhesive layer 12. As illustrated in FIG. 13(A) and FIG. 13(B), the adhesive layer 12 of this embodiment is configured of a flat portion 121 disposed on the main surface 91 of the substrate 9 with approximately a constant thickness, and a support portion 122 formed on the flat portion 121.

The flat portion 121 is evenly disposed to cover the main surface 91 of the substrate 9, and a main surface 1211 of the flat portion 121 is a surface which is approximately in parallel to the main surface 91 of the substrate 9. The support portion 122 is formed between the flat portion 121 and the reticular electrode layer 13 and between the flat portion 121 and the lead-out wiring layer 14, and is formed to protrude towards a direction separated from the substrate 9 (a +Z direction in FIG. 12). For this reason, the thickness (the height) of the adhesive layer 12 in a portion where the support portion 122 is disposed is greater than the thickness (the height) of the adhesive layer 12 in the flat portion 121.

The adhesive layer 12 is in contact with the reticular electrode layer 13 (specifically, a contact surface 131 (described below)) or the lead-out wiring layer 14 (specifically, a contact surface 141 (described below)), in a contact surface 1222, which is an upper surface of the support portion 122. The support portion 122 includes two lateral surfaces 1221 and 1221 having a linear shape, which are inclined to be close to each other as being separated from the substrate 9, in the transverse sectional view.

Furthermore, the flat portion 121 and the support portion 122 of the adhesive layer 12 of this embodiment have the same fundamental configurations as those of the smooth portion 252 and the support portion 251 of the adhesive layer 25 described in the first embodiment. Therefore, the support portion 251 is replaced with the support portion 122, and the smooth portion 252 is replaced with the flat portion 121, respectively, and thus, the repetitive description will be omitted, and the description of the first embodiment will be used.

As illustrated in FIG. 12, the reticular electrode layer 13 is a detection electrode of the touch sensor 7, which extends in the Y direction, is laminated on the support portion 122 of the adhesive layer 12, and is formed to protrude towards the +Z direction (refer to FIG. 13(A)). In this embodiment, the "reticular electrode layer 13" corresponds to an example of the "reticular electrode layer" of the invention.

The reticular electrode layer 13 is configured of a conductive powder and a binder resin. The conductive material configuring the reticular electrode layer 22 described in the first embodiment can be used as such a conductive powder. In addition, the binder resin configuring the reticular electrode layer 22 described in the first embodiment can be used as the binder resin. In the reticular electrode layer 13, the conductive powders exist in the binder resin by being approximately evenly dispersed, and the conductive powders are in contact with each other, and thus, conductivity is imparted to the reticular electrode layer 13. Such a reticular electrode layer 13 is formed by applying and hardening a conductive paste. The conductive paste described above can be used as such a conductive paste.

As illustrated in FIG. 12, the reticular electrode layer 13 of this embodiment is configured by allowing fourth conductor wires 134a and 134b having conductivity to intersect with each other, and has a shape in which a quadrangular reticulations 135 are repeatedly arranged, as a whole. In this embodiment, the "fourth conductor wires 134a and 134b" correspond to an example of the "first conductor wire" of the invention, and in this embodiment, the "reticulation 135" corresponds to an example of the "reticulation" of the invention. Furthermore, in the following description, as necessary, the "fourth conductor wire 134a" and the "fourth conductor wire 134b" will be collectively referred to as a "fourth conductor wire 134".

As illustrated in FIG. 13(A), the outline of the fourth conductor wire 134 of this embodiment is configured of the contact surface 131, a top surface 132, and two lateral surfaces 133 and 133. The contact surface 131 is a surface which is in contact with the adhesive layer 12 (specifically, the contact surface 1222). The reticular electrode layer 13 of this embodiment is supported on the substrate 9 through the adhesive layer 12, and in this case, the contact surface 131 is a surface positioned on the substrate 9 side with respect to the top surface 132. In addition, the contact surface 131 is a surface having a concave-convex shape formed of fine convexities and concavities, in a transverse sectional surface.

On the other hand, the top surface 132 is a surface on a side opposite to the contact surface 131, and is approximately a flat surface. The top surface 132 is a surface which is substantially parallel to the main surface 91 of the substrate 9 (alternatively, a surface of the adhesive layer 12 facing the main surface 91). The top surface 132 includes a flat portion 1321, in the transverse sectional view of the fourth conductor wire 134.

The lateral surfaces 133 and 133 are surfaces having a linear shape, which are inclined to be close to each other as being separated from the adhesive layer 12, in the transverse sectional view. In addition, in this embodiment, the lateral surfaces 133 and 133 are continuously connected to the lateral surfaces 1221 and 1221 in a portion connected to a boundary surface between the contact surfaces 1222 and 131, in the transverse sectional view. The lateral surface 133 is connected to the top surface 132 in a first portion 1331 and is connected to the contact surface 131 in a second portion 1332, and is a surface extending on a virtual straight line which passes through the first portion 1331 and the second portion 1332. The lateral surface 133 includes a flat portion 1333.

The fourth conductor wire 134 of this embodiment has the same fundamental configuration as that of the first conductor wire 221A (221B) described in the first embodiment. Therefore, the lower surface 224 is replaced with the contact surface 131, the upper surface 223 is replaced with the top surface 132, and the lateral portion 222 is replaced with the lateral surface 133, respectively, and thus, the repetitive description will be omitted, and the description of the first embodiment will be used. In addition, the flat portion 2231 is replaced with the flat portion 1321, the first portion 2221 is replaced with the first portion 1331, the second portion 2222 is replaced with the second portion 1332, and the flat portion 2223 is replaced with the flat portion 1333, respectively, and thus, the repetitive description will be omitted, and the description of the first embodiment will be used.

In the reticular electrode layer 13 of this embodiment, the fourth conductor wire 134 is disposed as described below. That is, as illustrated in FIG. 12, the fourth conductor wire 134a linearly extends along a direction which is inclined at +45° with respect to the X direction (hereinafter, simply referred to as a "third direction"), and the fourth conductor wires 134a are arranged side by side at a regular pitch $P_3$ in a direction which is substantially orthogonal to the first direction (hereinafter, also simply referred to as a "fourth direction"). In contrast, the fourth conductor wire 134b linearly extends along the fourth direction, and the fourth conductor wires 134b are arranged side by side at a regular pitch $P_4$ in the third direction. Then, the fourth conductor wires 134a and 134b are orthogonal to each other, and thus, the reticular electrode layer 13 is formed in which the quadrangular (rhombic) reticulations 135 are repeatedly arranged.

Furthermore, the configuration of the reticular electrode layer 13 is not particularly limited to the above description. For example, in this embodiment, the pitch $P_3$ of the fourth conductor wire 134a is substantially identical to the pitch $P_4$ of the fourth conductor wire 134b ($P_3=P_4$), but is not particularly limited thereto, and the pitch $P_3$ of the fourth conductor wire 134a may be different from the pitch $P_4$ of the fourth conductor wire 134b ($P_3 \neq P_4$). In this case, the reticulation has a rectangular outline.

In addition, in this embodiment, the third direction, which is an extending direction of the fourth conductor wire 134a, is a direction which is inclined at +45° with respect to the X direction, and the fourth direction, which is an extending direction of the fourth conductor wire 134b, is a direction which is substantially orthogonal to the third direction, but extending directions of the third direction and the fourth direction (that is, the angle of the third direction with respect to an X axis or the angle of the fourth direction with respect to with respect to the X axis) can be arbitrarily set.

In addition, the shape of the reticulation 135 of the reticular electrode layer 13 may be a geometric pattern. That is, the shape of the reticulation 135 may be a triangular shape such as an equilateral-triangular shape, an isosceles-triangular shape, and a right-triangular shape, or may be a quadrangular shape such as a rectangular shape, a square shape, a rhombic shape, a parallelogram-like shape, and a trapezoidal shape. In addition, the shape of the reticulation 135 may be an n-polygonal shape such as a hexagonal shape, an octagonal shape, a dodecagonal shape, and an icosagonal shape, a circular shape, an elliptical shape, a star-like shape, and the like.

Thus, in the reticular electrode layer 13, a geometric pattern obtained by repeating various diagram units can be used as the shape of the reticulation 135 of the reticular electrode layer 13. In addition, in this embodiment, the fourth conductor wire 134 has a linear shape, but is not particularly limited thereto, and for example, may be in the shape of a curve, a horseshoe, a zigzag line, and the like.

As illustrated in FIG. 12, the lead-out wiring layer 14 is disposed corresponding to the reticular electrode layer 13, and in this embodiment, three lead-out wiring layers 14 are formed with respect to three reticular electrode layers 13. The lead-out wiring layer 14 is led out from a linear outer edge portion 136 disposed on the reticular electrode layer 13 on a −Y direction side in the drawing. The lead-out wiring layer 14 and the reticular electrode layer 13 described above are integrally formed of the same material as that of the reticular electrode layer 13.

Furthermore, in the outer edge of the reticular electrode layer 13, a position in which the lead-out wiring layer 14 is disposed is not particularly limited. In addition, the outer edge portion 136 may be omitted from the configuration of the wiring body 11, and in this case, the lead-out wiring layer 14 and the reticular electrode layer 13 are directly connected to each other.

As illustrated in FIG. 13(B), the outline of the lead-out wiring layer 14 of this embodiment (specifically, a first conductor wire 1441 (described below)) is configured of the contact surface 141, a top surface 142, and two lateral surfaces 143 and 143, as with the reticular electrode layer 13. The contact surface 141 is a surface which is in contact with the adhesive layer 12, and has a concave-convex shape formed of fine convexities and concavities, in a transverse sectional surface. On the other hand, the top surface 142 is approximately a flat surface positioned on a side opposite to the contact surface 141, and extends to be substantially parallel to the main surface 91 of the substrate 9.

The lateral surfaces 143 and 143 are surfaces having a linear shape, which are inclined to be close to each other as being separated from the adhesive layer 12, in the transverse sectional view. In addition, in this embodiment, the lateral surfaces 143 and 143 are continuously connected to the lateral surfaces 1221 and 1221 in a portion connected to a boundary surface between the contact surfaces 1222 and 141, in the transverse sectional view.

The top surface 142 includes a flat portion 1421, in the transverse sectional view of the first conductor wire 1441. The lateral surface 143 is connected to the top surface 142 in a first portion 1431, is connected to the contact surface 141 in a second portion 1432, and is a surface extending on a virtual straight line which passes through the first portion 1431 and the second portion 1432. The lateral surface 143 includes a flat portion 1433.

The first conductor wire 1441 of this embodiment has the same fundamental configuration as that of the second conductor wire 231A (231B) described in the first embodiment. Therefore, the lower surface 236 is replaced with the contact surface 141, the upper surface 235 is replaced with the top surface 142, and the lateral portion 230 is replaced with the lateral surface 143, respectively, and thus, the repetitive description will be omitted, and the description of the first embodiment will be used. In addition, the flat portion 2351 is replaced with the flat portion 1421, the first portion 2301 is replaced with the first portion 1431, the second portion 2302 is replaced with the second portion 1432, and the flat portion 2303 is replaced with the flat portion 1433, respectively, and thus, the repetitive description will be omitted, and the description of the first embodiment will be used.

In the touch sensor 7, the reticular electrode layer 13 is formed in a detection region where the operation of the operator can be detected, whereas the lead-out wiring layer 14 is formed in an outside region (a frame region) which is positioned on the outside of the detection region. In this case, the lead-out wiring layer 14 is disposed not to pass through the detection region, while being curved in the outside region (refer to FIG. 11).

As illustrated in FIG. 14, the lead-out wiring layer 14 of this embodiment includes a first linear portion 144a extending along a first direction, a second linear portion 144b extending along a second direction, and a curved portion 145 connecting the first linear portion 144a and the second linear portions 144b to each other. In addition, in the lead-out wiring layer 14 of this embodiment, an end portion 1444a of the first linear portion 144a and an end portion 1444b of the second linear portion 144b are formed to be separated from each other.

In this embodiment, the "first linear portion 144a" corresponds to an example of the "first linear portion" of the invention, in this embodiment, the "second linear portion 144b" corresponds to an example of the "second linear portion" of the invention, and in this embodiment, the "curved portion 145" corresponds to an example of the "curved portion" of the invention.

In this embodiment, the first direction is a direction which is substantially parallel to the X direction. The first linear portion 144a extending in the first direction, is configured by allowing first conductor wires 1441a and 1441b having conductivity to intersect with each other, and has a shape in which quadrangular first unit reticulations 1442 are repeatedly arranged, as a whole.

On the other hand, the second direction is a direction which is inclined at 30° with respect to the X direction. The second linear portion 144b extending in the second direction, is configured by allowing first conductor wires 1441a and 1441b having conductivity to intersect with each other, as with the first linear portion 144a described above, and has a shape in which the quadrangular first unit reticulations 1442 are repeatedly arranged, as a whole. In this embodiment, the first unit reticulation 1442 configuring the first linear portion 144a and the first unit reticulation 1442 configuring the second linear portion 144b have substantially the same shape.

In this embodiment, the "first conductor wires 1441a and 1441b" correspond to an example of the "second conductor wire" of the invention, and in this embodiment, the "first unit reticulation 1442" corresponds to an example of the "first unit reticulation" of the invention. Furthermore, in the following description, as necessary, the "first conductor wire 1441a" and the "first conductor wire 1441b" will be collectively referred to as the "first conductor wire 1441".

In the first linear portion 144a, the first conductor wire 1441a linearly extends along a direction which is inclined at −45° with respect to the first direction (that is, the X direction) (that is, a fourth direction), and the first conductor wires 1441a are arranged side by side at a regular pitch $P_5$ in a direction which is substantially orthogonal to the fourth direction (that is, a third direction). In contrast, the first conductor wire 1441b linearly extends along the third direction, and the first conductor wires 1441b are arranged side by side at a regular pitch $P_6$ in the third direction.

Thus, in the first linear portion 144a, the first conductor wire 1441a extending in the fourth direction and the first conductor wire 1441b extending in the third direction are orthogonal to each other, and thus, a quadrangular first unit reticulations 1442 having substantially the same shape are formed. Here, a direction which is substantially coincident with a virtual straight line extending along the fourth direction is set to an arrangement direction of the first unit reticulation 1442 of the first linear portion 144a.

Furthermore, the direction which is substantially coincident with the virtual straight line extending along the fourth direction is set to the arrangement direction of the first unit reticulation 1442 of the first linear portion 144a, but the arrangement direction of the first unit reticulation 1442 is not particularly limited to the above description insofar as the arrangement direction is a virtual straight line intersecting with a first unit reticulations 1442 and is substantially coincident with a straight line which equally divides the area of all of the first unit reticulations 1442 arranged in an extending direction of the virtual straight line, in the planar view. For example, in the first linear portion 144a of this embodiment, the arrangement direction of the first unit reticulation 1442 may be a direction which is substantially coincident with a virtual straight line extending along the third direction. Alternatively, the arrangement direction of the first unit reticulation 1442 may be a direction which is substantially coincident with a virtual straight line extending in a direction which is orthogonal to the first direction.

On the other hand, in the second linear portion 144b, the first conductor wire 1441a linearly extends along a direction which is inclined at −45° with respect to the second direction (hereinafter, also simply referred to as a "fifth direction"), and the first conductor wires 1441a are arranged side by side at the regular pitch $P_5$ in a direction which is substantially orthogonal to the fifth direction (hereinafter, also simply referred to as a "sixth direction"). In contrast, the first conductor wire 1441b linearly extends along the sixth direction, and the first conductor wires 1441b are arranged side by side at the regular pitch $P_6$ in the fifth direction.

Furthermore, in this embodiment, in the first linear portion 144a and the second linear portions 144b, the first unit reticulations 1442 have the same shape, and thus, the pitch of the first conductor wires 1441a of the first linear portion 144a and the pitch of the first conductor wires 1441a of the second linear portion 144b are set to substantially the same pitch $P_5$. Similarly, the pitch of the first conductor wires 1441b of the first linear portion 144a and the pitch of the first conductor wires 1441b of the second linear portion 144b are set to substantially the same pitch $P_6$.

In the second linear portion 144b, the first conductor wire 1441a extending in the fifth direction and the first conductor wire 1441b extending in the sixth direction are orthogonal to each other, and thus, quadrangular first unit reticulations 1442 having substantially the same shape are formed. Then, a direction which is substantially coincident with a virtual straight line extending along the fifth direction is set to an arrangement direction of the first unit reticulation 1442 of the second linear portion 144b.

As described above, in the lead-out wiring layer 14 of this embodiment, Formula (7) described below is established.

$$\alpha_1 = \alpha_2 \quad (7)$$

Here, in Formula (7) described above, $\alpha_1$ is an angle between the virtual straight line extending along the arrangement direction (the fourth direction) of the first unit reticulation 1442 of the first linear portion 144a and a virtual straight line extending along the first direction, and $\alpha_2$ is an angle between the virtual straight line extending along the arrangement direction (the fifth direction) of the first unit reticulation 1442 of the second linear portion 144b and a virtual straight line extending along the second direction.

Formula (7) described above is established, and thus, the arrangement direction (the fourth direction) of the first unit reticulation 1442 with respect to the first direction in the first linear portion 144a and the arrangement direction (the fifth direction) of the first unit reticulation 1442 with respect to the second direction in the second linear portion 144b are substantially coincident with each other. Accordingly, a conduction path of one of the first linear portion 144a and the second linear portions 144b is prevented from being shorter than a conduction path of the other first linear portion 144a and the second linear portions 144b.

Furthermore, in each of the first linear portion 144a and the second linear portions 144b, in a case where arrangement directions of the first unit reticulations 1442 exist, each arrangement direction in which a positional relationship between the adjacent first unit reticulations 1442 along the arrangement direction of the first unit reticulation 1442 of the first linear portion 144a and a positional relationship between the adjacent first unit reticulations 1442 along the arrangement direction of the first unit reticulation 1442 of the second linear portion 144b are identical to each other is selected on the basis of the extending direction of the lead-out wiring layer 14. The "positional relationship between the adjacent first unit reticulations 1442" indicates the disposition of the other one of the adjacent first unit reticulations 1442 with respect to one of the adjacent first unit reticulations 1442.

Further, in this embodiment, in the first unit reticulations 1442a and 1442b arranged side by side along the arrangement direction in the first linear portion 144a, a vertex 1443A of the first unit reticulation 1442a and a vertex 1443B of the first unit reticulation 1442b, which corresponds to the vertex 1443A, are positioned on the virtual straight line extending along the first direction.

Thus, in this embodiment, in the first direction, the first unit reticulations 1442 are periodically and repeatedly arranged, and thus, unless a defect occurs in one first unit reticulation 1442a, a new defect does not occur in the other first unit reticulation 1442b. For this reason, in the entire first linear portion 144a, it is possible to suppress the occurrence of the defect in a part of the first unit reticulation 1442. In addition, the occurrence of a defect on the first unit reticulation 1442 is suppressed, and thus, the conduction is stably ensured in the entire first linear portion 144a, and a contact portion between the first unit reticulations 1442 to be arranged increases. Therefore, it is possible to increase the conduction path. Furthermore, in this embodiment, in the first linear portion 144a, one of the arrangement directions of the first unit reticulations 1442 is substantially coincident with the extending direction of the first linear portion 144a, and thus, the relationship described above is established.

In addition, even in the second linear portion 144b, as with the first linear portion 144a, in the first unit reticulations 1442 arranged side by side along the arrangement direction, a vertex 1443 of one first unit reticulation 1442 and the vertex 1443 of the other first unit reticulation 1442, which corresponds to the vertex 1443, are positioned on the virtual straight line extending along the second direction. Accordingly, in the entire second linear portion 144b, it is possible to suppress the occurrence of a defect in a part of the first unit reticulation 1442. In addition, the occurrence of a defect on the first unit reticulation 1442 is suppressed, and thus, in the entire second linear portion 144b, the conduction is stably ensured, and the contact portion between the first unit reticulations 1442 to be arranged increases. Therefore, it is possible to increase the conduction path.

Furthermore, the configuration of the first linear portion 144a and the second linear portions 144b of the lead-out wiring layer 14 is not particularly limited to the above description. For example, in this embodiment, in the first linear portion 144a and the second linear portions 144b, the pitch $P_5$ of the first conductor wire 1441a is substantially identical to the pitch $P_6$ of the first conductor wire 1441b ($P_5 = P_6$), but is not particularly limited thereto, and the pitch $P_5$ of the first conductor wire 1441a may be different from the pitch $P_6$ of the first conductor wire 1441b ($P_5 \neq P_6$). In this case, the first unit reticulation has a rectangular outline.

In addition, in this embodiment, in the first linear portion 144a, an extending direction of the first conductor wire 1441a is set to the fourth direction which is inclined at −45° with respect to the X direction, and an extending direction of the first conductor wire 1441b is set to the third direction which is substantially orthogonal to the fourth direction, but the extending direction of the first conductor wires 1441a and 1441b (that is, the angle with respect to the X axis) can be arbitrary set.

In this case, in the second linear portion 144b, the fifth direction which is the extending direction of the first conductor wire 1441a and the sixth direction which is the extending direction of the first conductor wire 1441b extend such that the arrangement direction of the first unit reticulation 1442 formed of the first conductor wires 1441a and 1441b satisfies Formula (7) described above.

In addition, the shape of the first unit reticulation 1442 may be a geometric pattern. That is, the shape of the first unit reticulation 1442 may be a triangular shape such as an equilateral-triangular shape, an isosceles-triangular shape, and a right-triangular shape, or may be a quadrangular shape such as a rectangular shape, a square shape, a rhombic shape, a parallelogram-like shape, and a trapezoidal shape. In addition, the shape of the first unit reticulation 1442 may be an n-polygonal shape such as a hexagonal shape, an octagonal shape, a dodecagonal shape, and an icosagonal shape, a circular shape, an elliptical shape, a star-like shape, and the like. Further, an assembly in which different shapes are assembled, can be adopted as the first unit reticulation 1442. In this case, the assemblies described above, as the first unit reticulation 1442, are repeatedly arranged along a predetermined arrangement direction.

Thus, in the first linear portion 144a and the second linear portions 144b of the lead-out wiring layer 14, a geometric pattern obtained by repeating various diagram units can be used as the shape of the first unit reticulation 1442. In addition, in this embodiment, the first conductor wire 1441 has a linear shape, but is not particularly limited thereto, and for example, may be in the shape of a curve, a horseshoe, a zigzag line, and the like.

Furthermore, in a case where the lead-out wiring layer 14 is formed to satisfy Formula (7) described above, as illustrated in an enlarged view on a lower side in FIG. 12, the first conductor wire 1441a extends in the third direction, and the first conductor wire 1441b extends in the fourth direction, in a case where the lead-out wiring layer 14 extends along the Y direction.

As illustrated in FIG. 14, the curved portion 145 of this embodiment is positioned between the end portions 1444a and 1444b, and connects the end portions 1444a and 1444b to each other. As a result thereof, in the curved portion 145, the extending direction of the lead-out wiring layer 14 is changed from the first direction which is the extending direction of the first linear portion 144a to the second direction which is the extending direction of the second linear portion 144b. In this embodiment, the "end portions 1444a and 1444b" correspond to the "end" of the invention.

The curved portion 145 includes a second unit reticulation 1452 including a second conductor wire 1451 connecting the separated end portions 1444a and 1444b to each other. In this embodiment, the "second conductor wire 1451" corresponds to an example of the "third conductor wire" of the invention, and in this embodiment, the "second unit reticulation 1452" corresponds to an example of the "second unit reticulation" of the invention.

The second conductor wire 1451 and the first conductor wire 1441 configuring the first linear portion 144a and the second linear portions 144b are integrally formed of a material having the same composition as that of the first conductor wire 1441. The second conductor wire 1451 is a conductor wire connecting the vertex 1443 of the first unit reticulation 1442 configuring the first linear portion 144a and the vertex 1443 of the first unit reticulation 1442 configuring the second linear portion 144b to each other.

In a case where a conductor wire connecting the vertex 1443 of the first linear portion 144a and the vertex 1443 of the second linear portion 144b to each other is formed as the second conductor wire 1451, it is preferable that a vertex exposed from the end portion 1444a of the first linear portion 144a and a vertex exposed from the end portion 1444b of the second linear portion 144b are respectively connected to at least one second conductor wire 1451. In addition, the number of second conductor wires 1451 is greater than or equal to a larger value between the number of vertices exposed from the end portion 1444a of the first linear portion 144a and the number of vertices exposed from the end portion 1444b of the second linear portion 144b. Accordingly, in the curved portion 145, it is possible to suppress an increase in the electric resistance value.

In addition, it is preferable that the second conductor wire 1451 is formed not to intersect with the first conductor wire 1441 configuring the first linear portion 144a and the second linear portions 144b, from the viewpoint of ensuring the flexibility of the lead-out wiring layer 14. Furthermore, it is preferable that the width of such a second conductor wire 1451 is substantially identical to the width of the first conductor wire 1441, from the viewpoint of suppressing an increase in an electric resistance value of the lead-out wiring layer 14 and of suppressing a decrease in the visibility of the wiring body 11.

Furthermore, the second conductor wire 1451 of this embodiment connects the vertices 1443 and 1443 configuring the first linear portion 144a and the second linear portions 144b to each other, but is not particularly limited thereto, and may connect the first conductor wires 1441 and 1441 to each other.

In sides configuring the second unit reticulation 1452, at least one side of the second unit reticulation 1452 is configured of the second conductor wire 1451. The second unit reticulation 1452 has an outline different from that of the first unit reticulation 1442.

Various diagrams can be used as the shape of such a second unit reticulation 1452. Second unit reticulations 1452 formed in the curved portion 145 may have outlines different from each other, but it is preferable that an aperture ratio of the second unit reticulation 1452 is approximately identical to an aperture ratio of the first unit reticulation 1442.

In a case where the aperture ratio of the second unit reticulation is extremely less than the aperture ratio of the first unit reticulation, in the curved portion, the flexibility of the lead-out wiring layer deteriorates, and there is a concern that the lead-out wiring layer is disconnected. In contrast, in a case where the aperture ratio of the second unit reticulation is extremely greater than the aperture ratio of the first unit reticulation, in the curved portion, the conduction path is reduced, and thus, there is a concern that the electric resistance value of the lead-out wiring layer increases.

Incidentally, in this embodiment, it is preferable that the aperture ratio of the lead-out wiring layer 14 is less than or equal to 50%. Further, it is more preferable that the aperture ratio of the lead-out wiring layer 14 is within a range of 10% to 50%, from the viewpoint of reducing a difference in the rigidity between the reticular electrode layer 13 and the lead-out wiring layer 14 or from the viewpoint of improving the effect of suppressing an increase in the electric resistance value of the lead-out wiring layer 14.

Furthermore, in this embodiment, the "aperture ratio" is identical to the "aperture ratio" defined in the first embodiment.

Returning to FIG. 14, in the first linear portion 144a, both of the lateral end portions 146 and 146 of the lead-out wiring layer 14 are configured of a first vertex 1443a, a second vertex 1443b, and the first conductor wire 1441 connecting the first vertex 1443a and the second vertex 743b to each other. In this embodiment, the "first vertex 1443a" and the "second vertex 1443b" correspond to an example of the "end portion" of the invention, and in this embodiment, the "first vertex 1443a" corresponds to an example of the "outside end portion" of the invention.

Similarly, in the second linear portion 144b, both of the lateral end portions 146 and 76 of the lead-out wiring layer 14 are configured of the first vertex 1443a, the second vertex 1443b, and the first conductor wire 1441 connecting the first vertex 1443a and the second vertex 1443b to each other.

The first vertex 1443a is a vertex positioned on the outermost side in the vertices 1443 configuring the first unit reticulation 1442 positioned on the outermost side in the lead-out wiring layer 14 (refer to FIG. 11). The second vertex 1443b is the vertex 1443 configuring the first unit reticulation 1442 positioned on the outermost side in the lead-out wiring layer 14, and is a vertex exposed to the outside of the lead-out wiring layer 14 unlike the first vertex 1443a. In the first vertex 1443a, the first conductor wires 1441a and 1441b are connected to each other, whereas in the second vertex 1443b, the first conductor wires 1441a and 1441b intersect with each other.

In the lateral end portion 146 of this embodiment, the adjacent first vertices 1443a and 1443a are approximately equally arranged at a distance $D_6$, and the adjacent second vertices 1443b and 1443b are approximately equally arranged at a distance $D_6$. In the lateral end portion 146, the first vertex 1443a and the second vertex 1443b are alternately continuous along the extending direction of the lead-out wiring layer 14, and the first vertex 1443a and the second vertex 1443b are connected to each other by the first conductor wires 1441a and 1441b. As a result thereof, the lateral end portion 146 is in the shape of a wave along the extending direction of the lead-out wiring layer 14.

In addition, the lateral end portion 146 is configured by including the first vertex 1443a, and thus, in the lead-out wiring layer 14, the first unit reticulation 1442 positioned on the outermost side exists in a state without a defect. In this case, the width of the lead-out wiring layer 14 of this embodiment is a distance between the first vertex 1443a of one lateral end portion 146 and the first vertex 1443a of the other lateral end portion 146, in a direction which is substantially perpendicular to the extending direction of the lead-out wiring layer 14. Thus, in the lead-out wiring layer 14, the conduction path is ensured in the entire width L, and thus, an increase in the electric resistance value of the lead-out wiring layer 14 is suppressed.

The lateral end portion 146 of the curved portion 145 is configured by including the first vertex 1443a configuring the lateral end portion 146 of the first linear portion 144a, the first vertex 1443a configuring the lateral end portion 146 of the second linear portion 144b, and the second conductor wire 1451 connecting the first vertices 1443a and 1443a of the first linear portion 144a and the second linear portions 144b to each other. Furthermore, the lateral end portion 146 of the curved portion 145 is not particularly limited to the above description, and may be configured by including a second vertex. Alternatively, the lateral end portion 146 of the curved portion 145 may be configured by including the first conductor wire.

In the curved portion 145, it is preferable that the width of the lead-out wiring layer 14 in the curved portion 145 is formed to be substantially identical to the width of the lead-out wiring layer 14 in the first linear portion 144a and the second linear portions 144b, from the viewpoint of reducing the electric resistance value of the lead-out wiring layer 14.

As illustrated in FIG. 11 and FIG. 12, the end portion of the lead-out wiring layer 14 on a side opposite to the end portion connected to the reticular electrode layer 13, is formed in a position facing the outer edge of the substrate 9. At this time, in order to easily and collectively connect lead-out wiring layers 14 to the external circuit, the lead-out wiring layers 14 are assembled such that the lead-out wiring layers 14 are arranged to be close to each other, in the vicinity of the outer edge of the substrate 9. In this embodiment, the assembled lead-out wiring layers 14 are arranged approximately in parallel to each other along the Y direction.

In this case, as illustrated in FIG. 15, in the extending direction of the lead-out wiring layer 14 (that is, the Y direction), in the lead-out wiring layers 14 arranged approximately in parallel to each other, the first vertex 1443a of one of the adjacent lead-out wiring layers 14 and the first vertex 1443a of the other one of the adjacent lead-out wiring layers 14 are arranged by being shifted by a distance $S_2$.

That is, the lead-out wiring layer 14 includes a maximum portion 147 having a width which is a distance between the first vertices 1443a and 1443a configuring both of the lateral end portions 146 and 146, and the position of the maximum portion 147 of one of the adjacent lead-out wiring layers 14 and the position of the maximum portion 147 of the other one of the adjacent lead-out wiring layers 14 are arranged by being shifted by the distance $S_2$. Furthermore, the distance $S_2$ is less than the distance $D_5$ between the first vertices 1443a and 1443a along the extending direction of the lead-out wiring layer 14 ($S_2<D_5$).

Accordingly, it is possible to extremely decrease a gap between the adjacent lead-out wiring layers 14, and to form the lead-out wiring layer 14 with a high density. In addition, a predetermined gap is ensured between the adjacent lead-out wiring layers 14, and thus, it is possible to suppress the occurrence of the migration in the adjacent lead-out wiring layers 14.

As described above, in the wiring body 11 of this embodiment, both of the reticular electrode layer 13 and the lead-out wiring layer 14 are formed in the shape of a reticulation (a mesh). In this case, in the wiring body 11 of this embodiment, it is preferable that Formula (8) described below is established, from the viewpoint of suppressing an increase in the electric resistance value of the lead-out wiring layer 14 (refer to FIG. 13(A) and FIG. 13(B)).

$$W_6 \leq W_3 \tag{8}$$

Here, in Formula (8) described above, $W_3$ is the width of the first conductor wire 1441, and $W_6$ is the width of the fourth conductor wire 134.

Furthermore, it is more preferable that the width $W_3$ of the first conductor wire 1441 is less than or equal to four times the width $W_6$ of the fourth conductor wire 134 ($W_3 \leq 4 \times W_6$), from the viewpoint of reducing a disconnection portion.

It is preferable that a specific value of the width $W_6$ of the fourth conductor wire 134 is set to be in the same range as a range which is preferable as the width of the first conductor wires 221A and 221B described in the first embodiment. In addition, it is preferable that a specific value of the width $W_3$ of the first conductor wire 1441 is set to be in the same range as a range which is preferable as the width of the second conductor wires 231A and 231B described in the first embodiment.

In addition, in the wiring body 11 of this embodiment, it is preferable that Formula (9) described below is established (refer to an enlarged view of FIG. 12).

$$P_3, P_4 > P_5, P_6 \tag{9}$$

Here, in Formula (9) described above, $P_3$ is a pitch between the adjacent fourth conductor wires 134a in the reticular electrode layer 13, $P_4$ is a pitch between the adjacent fourth conductor wires 134b in the reticular electrode layer 13, $P_5$ is a pitch between the adjacent first conductor wires 1441a in the lead-out wiring layer 14, and $P_6$ a pitch between the adjacent first conductor wires 1441b in the lead-out wiring layer 14. Formula (9) described above is satisfied, and thus, an increase in the electric resistance value of the lead-out wiring layer 14 is suppressed.

The wiring board of this embodiment can be produced by using the same method as the method for producing the wiring board described in the first embodiment. Accordingly, in the method for producing the wiring board, the repetitive description will be omitted, and the description of the first embodiment will be used.

Furthermore, even though it is not particularly illustrated, the method for producing the wiring board described in the first embodiment is performed, and then, a resin material is applied onto the obtained wiring board 8 to cover the reticular electrode layer 13 and the lead-out wiring layer 14, and is hardened, and thus, the resin layer 15 is formed. Then, the reticular electrode layer 16 is formed to face the reticular electrode layer 13 through the formed resin layer 15. In addition, the lead-out wiring layer 17 connected to the reticular electrode layer 16 is formed. As described above, it is possible to obtain the touch sensor 7 including the wiring body 11.

The same method as the formation method of the adhesive layer 12 can be exemplified as a method of forming the resin layer 15. The reticular electrode layer 16 and the lead-out wiring layer 17 can be formed by the same method as a formation method of the reticular electrode layer 13 and the lead-out wiring layer 14.

Furthermore, the method of forming the reticular electrode layer 16 and the lead-out wiring layer 17 is not particularly limited to the above description, and for example, the resin layer 15 is hardened, and then, a conductive material is printed on the resin layer 15 by using screen printing, gravure-offset printing, ink jet printing, and the like, and thus, the reticular electrode layer 16 and the lead-out wiring layer 17 may be formed. Alternatively, a metal layer laminated on the resin layer 15 is printed into the shape of a reticulation, and thus, the reticular electrode layer 16 and the lead-out wiring layer 17 may be formed. Alternatively, the reticular electrode layer 16 and the lead-out wiring layer 17 may be formed on the resin layer 15 by using a sputtering method, a vacuum vapor deposition method, a chemical vapor deposition method (a CVD method), a non-electrolytic plating method, and an electrolytic plating method, or a combined method thereof.

The wiring body 11 and the wiring board 8 of this embodiment have the following effects.

It is known that the touch panel of the related art includes the detection electrode configured of the conductive fine wire, and the lead-out wiring connected to the detection electrode (for example, refer to Patent Document 1). In this case, in general, the lead-out wiring is positioned in an outside region avoiding an input region which can be viewed by the operator, and is disposed by being curved in the outside region.

In a case where the entire lead-out wiring described above is formed to have a reticular shape (a mesh-like shape) in which reticulations are evenly arranged, the conduction path is reduced or a conduction distance is elongated between a linear portion positioned on one side of the curved portion in which the extending direction of the lead-out wiring is changed and a linear portion positioned on the other side of the curved portion, and thus, an increase in the electric resistance value of the lead-out wiring is caused.

In contrast, in this embodiment, Formula (7) described above is established, and thus, the arrangement direction of the first unit reticulation 1442 with respect to the first direction in the first linear portion 144a and the arrangement direction of the first unit reticulation 1442 with respect to the second direction in the second linear portion 144b are substantially coincident with each other. Accordingly, the conduction path of one of the first linear portion 144a and the second linear portions 144b connected to each other through the curved portion 145 is prevented from being shorter than the conduction path of the other one of the first linear portion 144a and the second linear portions 144b. As a result thereof, it is possible to suppress an increase in the electric resistance value of the lead-out wiring layer 14.

In addition, in this embodiment, the end portion 1444a of the first linear portion 144a and the end portion 1444b of the second linear portion 144b are separated from each other, and the end portions 1444a and 1444b are connected to each other by the second conductor wire 1451, and at this time, the vertex 1443 configuring the first unit reticulation 1442 of the first linear portion 144a and the vertex 1443 configuring the first unit reticulation 1442 of the second linear portion 144b are connected to each other by the second conductor wire 1451, and thus, it is possible to efficiently ensure the conduction path of the lead-out wiring layer 14, compared to a case where the first conductor wires 1441 and 1441 configuring the first unit reticulations 1442 and 1442 are connected to each other.

That is, the first conductor wire 1441 and the second conductor wire 1451 configuring the first unit reticulation 1442 or the second unit reticulation 1452 are connected to the vertex 1443 configuring the first unit reticulation 1442, and thus, it is possible to make conductor wires conductive with each other. Therefore, in the first linear portion 144a and the second linear portions 144b, the vertices 1443 and 1443 in contact with the conductor wires are connected to each other by the second conductor wire 1451, and thus, conduction paths are ensured by one second conductor wire 1451. Furthermore, in the curved portion 145, in a case where the conduction path of the lead-out wiring layer 14 is efficiently ensured, it is possible to improve the flexibility of the lead-out wiring layer 14. In addition, in the curved portion 145, it is possible to stably ensure the conduction of the lead-out wiring layer 14.

In addition, in this embodiment, the second conductor wire 1451 and the first conductor wire 1441 configuring the first linear portion 144a and the second linear portions 144b are integrally formed of a material having the same composition as that of the first conductor wire 1441, and thus, it is possible to stably ensure the conduction between the first linear portion 144a and the curved portion 145 and between the second linear portion 144b and the curved portion 145.

In addition, in this embodiment, in the first unit reticulations 1442 arranged side by side along the arrangement direction in the first linear portion 144a, the vertex 1443A of one first unit reticulation 1442a and the vertex 1443B of the other first unit reticulation 1442b, which corresponds to the vertex 1443A are positioned on the virtual straight line extending along the first direction. Accordingly, in the entire first linear portion 144a, it is possible to suppress the occurrence of a defect in a part of the first unit reticulation 1442. In addition, the occurrence of a defect in the first unit reticulation 1442 is suppressed, and thus, the conduction is stably ensured in the entire first linear portion 144a, and the contact portion between the first unit reticulations 1442 to be arranged increases. Therefore, it is possible to increase the conduction path. Furthermore, the second linear portion 144b also has the same configuration as that of the first linear portion 144a, and thus, the conduction is stably ensured in the entire second linear portion 144b, and the contact portion between the first unit reticulations 1442 to be arranged increases. Therefore, it is possible to increase the conduction path.

In addition, in the related art, in a case where the lead-out wiring layer is simply formed in the shape of a reticulation, a defect occurs in a part of the unit reticulation positioned on the outermost side of the lead-out wiring layer, and there is a case where the conductor wire configuring the lead-out wiring layer is disposed in a state of protruding towards the outside. In this case, the conductor wire positioned on the outermost side of the lead-out wiring layer in a protruding state does not substantially contribute to the conduction of the lead-out wiring layer. For this reason, a region in the lead-out wiring layer, in which the conduction is performed, is narrows, and thus, an electric resistance value which is greater than an electric resistance value assumed from the width of the lead-out wiring layer is obtained.

In contrast, in the wiring body 11 of this embodiment, both of the lateral end portions 146 of the lead-out wiring layer 14 include the first vertex 1443a positioned on the outermost side among the vertices 1443 positioned on the outermost side of the lead-out wiring layer 14 and configure the first unit reticulation 1442, and the width L of the lead-out wiring layer 14 corresponds to the distance between the first vertex 1443a of one lateral end portion 146 and the first vertex 1443a of the other lateral end portion 146, in the direction which is substantially perpendicular to the extending direction of the lead-out wiring layer 14.

For this reason, in the entire width direction of the lead-out wiring layer 14, it is possible to make the lead-out wiring layer 14 conductive, and thus, it is possible to suppress an increase in the electric resistance value of the lead-out wiring layer 14 while preventing the disconnection between the reticular electrode layer 13 and the lead-out wiring layer 14, and to improve the detection sensitivity of the touch sensor 7. Such an effect becomes more remarkable since a ratio of the width of the first unit reticulation 1442 to the width L of the lead-out wiring layer 14 as the width L decreases.

In addition, in general, in a case where the lateral end portion of the lead-out wiring layer sharply protrudes, an electric field concentration easily occurs in the protruding portion, and thus, a concern that a migration occurs between the adjacent wirings increases. In contrast, in the wiring body 11 of this embodiment, the lateral end portion 146 of the lead-out wiring layer 14 is configured of the first vertex 1443a, and the first vertex 1443a is a point in which the first conductor wires 1441a and 1441b are in contact with each other, and thus, the lateral end portion 146 does not sharply protrude, and it is possible to reduce a concern that a migration occurs between the adjacent lead-out wiring layers 14 and 14.

In addition, in this embodiment, in the extending direction of the lead-out wiring layers 14 arranged in parallel to each other, the first vertex 1443a one of the adjacent lead-out wiring layers 14 and the first vertex 1443a of the other one of the adjacent lead-out wiring layers 14 are shifted from each other, and thus, it is possible to further reduce the concern that the migration occurs between the adjacent lead-out wiring layers 14 and 7.

In addition, in the wiring body 11 of this embodiment, in a sectional surface of the fourth conductor wire 134 in a width direction, a relative relationship of the surface roughness between the contact surface 131 of the fourth conductor wire 134 and a surface except for the contact surface 131 (a surface including the top surface 132 and the lateral surface 133) is identical to the relative relationship of the surface roughness between the contact surface 131 of the of the first conductor wire 221A and the surface except for the contact surface 131 (the surface including the top surface 132 and the lateral surface 133), described in the first embodiment, and thus, it is possible to obtain the same function and the same effect as the function and the effect of the wiring body 2 of the first embodiment.

In addition, in the wiring body 11 of this embodiment, the lateral surface 133 of the fourth conductor wire 134 has a shape in which the lateral surface 133 does not exist on the inside from a virtual straight line passing through the first portion and the second portion, and thus, it is possible to obtain the same function and the same effect as the function and the effect of the wiring body 2 of the first embodiment.

In addition, in the wiring body 11 of this embodiment, the diffuse reflectance of the wiring body 11 on the side of the surface except for the contact surface 131 of the fourth conductor wire 134 is relatively less than the diffuse reflectance of the wiring body 11 on the side of the contact surface 131, and thus, it is possible to obtain the same function and the same effect as the function and the effect of the wiring body 2 of the first embodiment.

Furthermore, the first conductor wire 1441 or the second conductor wire 1451 has the same fundamental configuration as that of the fourth conductor wire 134. For this reason, the wiring body 11 includes the first conductor wire 1441 or the second conductor wire 1451, and thus, it is possible to further obtain the function and the effect described above.

Figure 16:
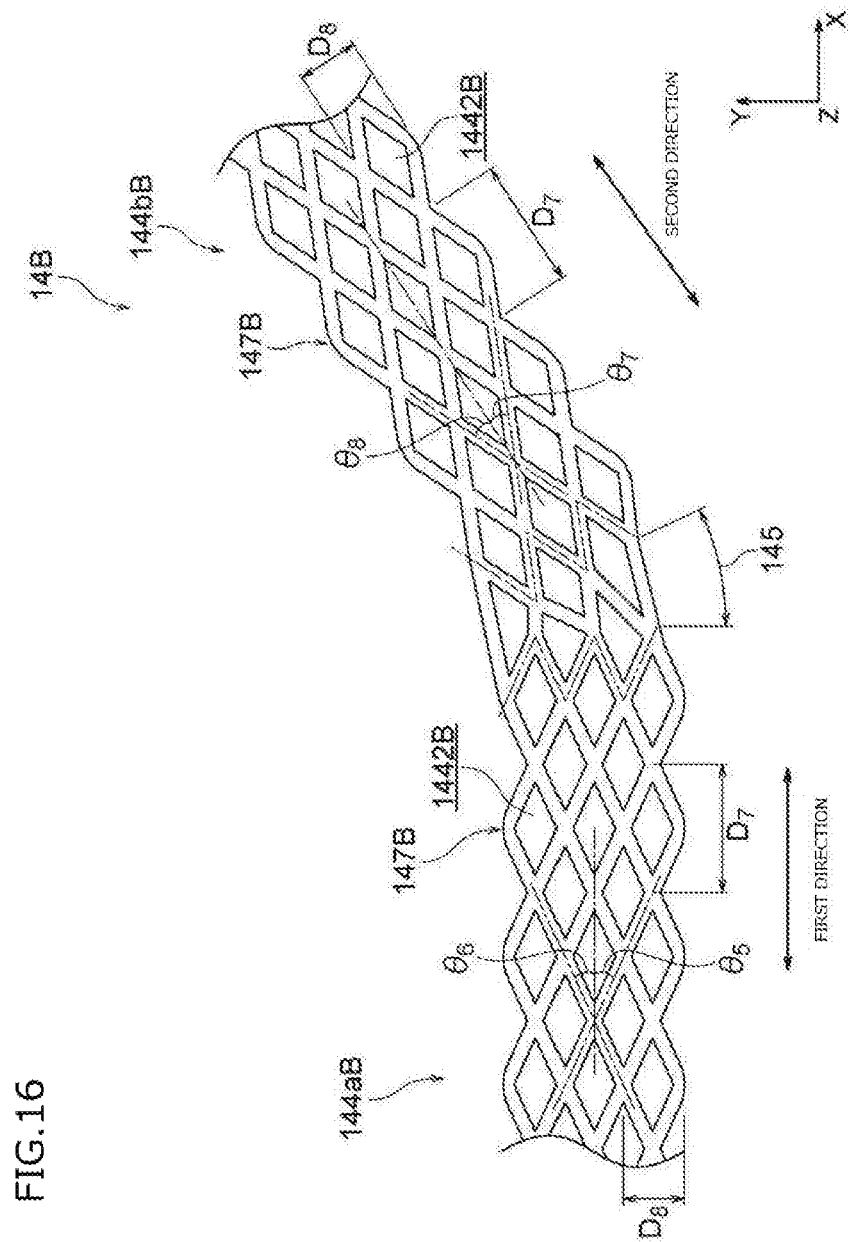
FIG. 16 is a plan view illustrating a first modification example of a lead-out wiring layer of the second embodiment of the invention.
Figure 17A:
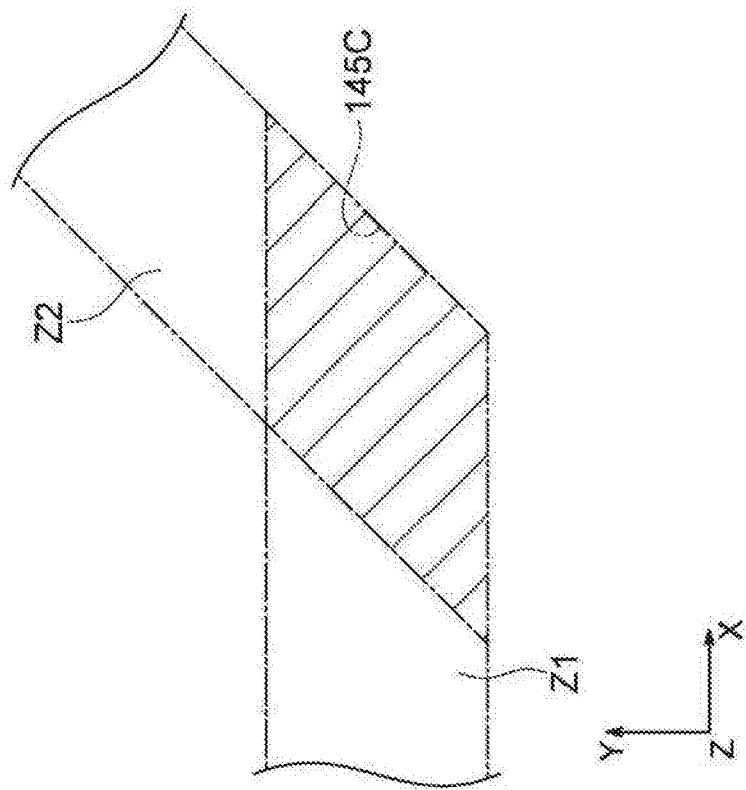
FIG. 17(A) is a plan view describing a second modification example of the lead-out wiring layer of the second embodiment of the invention.
Figure 17B:
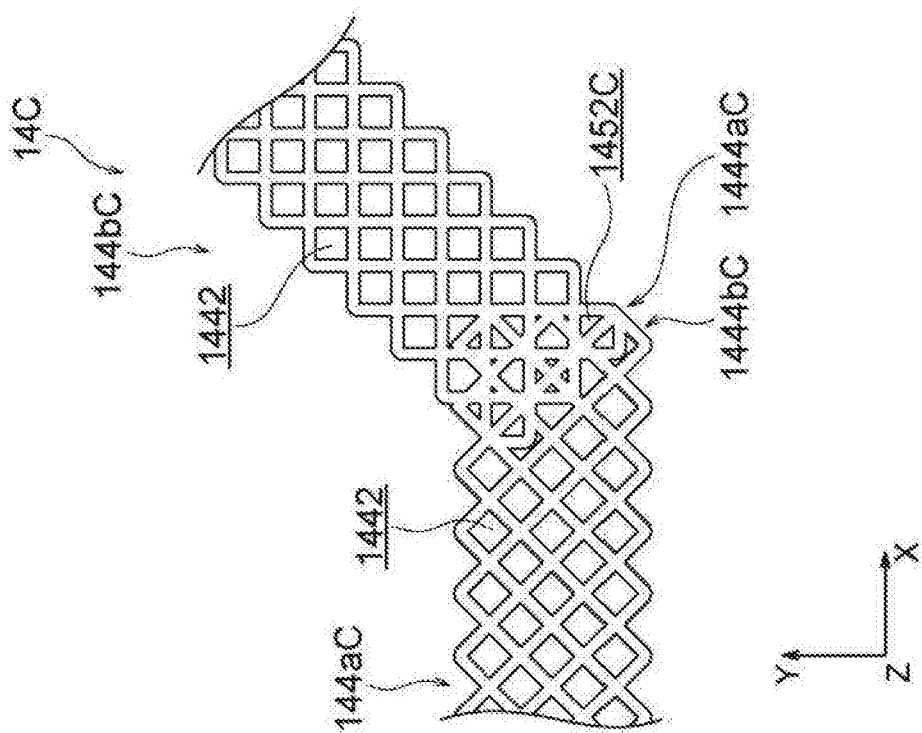
FIG. 17(B) is a diagram for illustrating a curved portion.
Figure 18B:
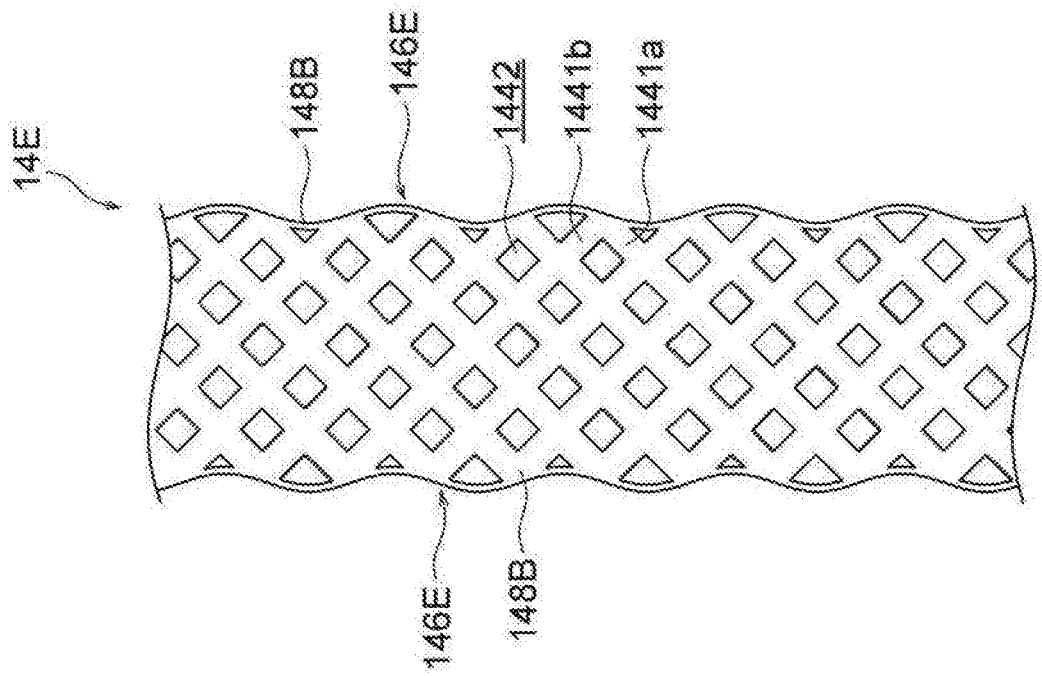
FIG. 18(A) and FIG. 18(B) are plan views respectively illustrating a third modification example and a fourth modification example of the lead-out wiring layer of the second embodiment of the invention.
Figure 18A:
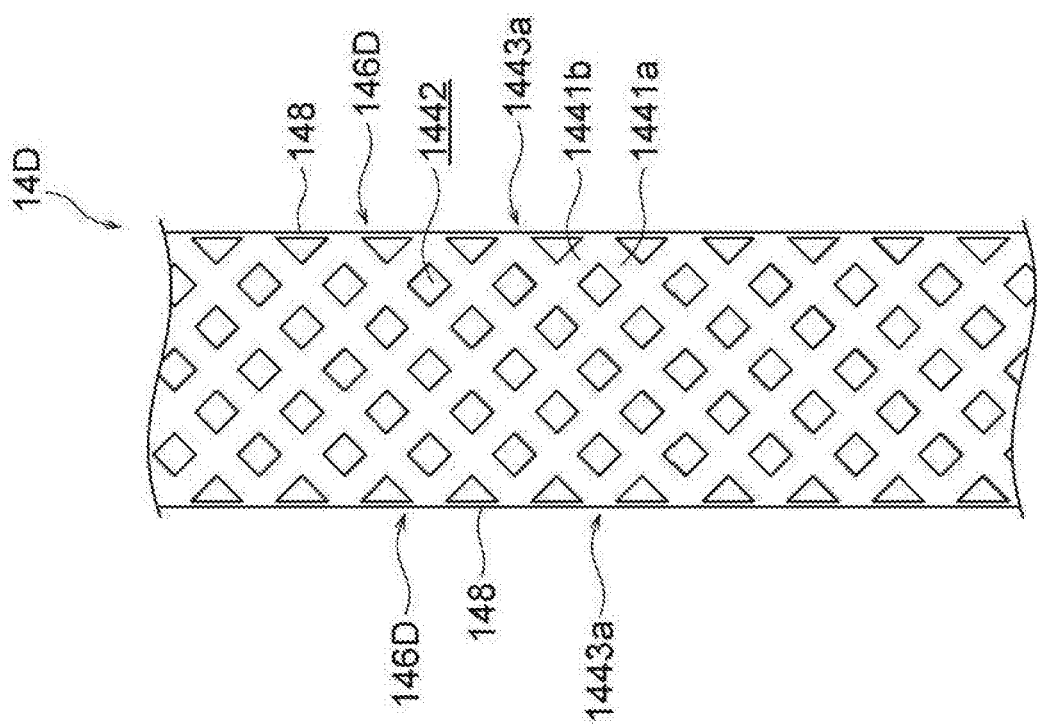

Hereinafter, a modification example of the wiring board 8 (the wiring body 11) described in this embodiment will be described. FIG. 16 is a plan view illustrating a first modification example of the lead-out wiring layer of the second embodiment of the invention, FIG. 17(A) is a plan view illustrating a second modification example of the lead-out wiring layer of the second embodiment of the invention, FIG. 17(B) is a diagram for describing a curved portion, and FIG. 18(A) and FIG. 18(B) are plan views respectively illustrating a third modification example and a fourth modification example of the lead-out wiring layer of the second embodiment of the invention.

As illustrated in FIG. 16, in a first linear portion 144aB of a lead-out wiring layer 14B, a first conductor wire 1441aB may extend by being inclined at an angle $\theta_5$ with respect to a first direction, and a first conductor wire 1441bB may extend by being inclined at an angle $\theta_6$ with respect to the first direction. At this time, both absolute values of the angles $\theta1$ and $\theta2$ are less than 45° ($-45°<\theta_5$ and $\theta_6<45°$), and thus, an aspect ratio of a first unit reticulation 1442B (a ratio ($D_7/D_8$) of a length $D_8$ of the first unit reticulation 1442B along an extending direction of the lead-out wiring layer 14B to a length $D_7$ of the first unit reticulation 1442B along a width direction with respect to the extending direction of the lead-out wiring layer 14B) can be to set to be greater than 1.

In this example, the shape of the first unit reticulation 1442B of the lead-out wiring layer 14B is a shape stretched along the extending direction of the lead-out wiring layer 14B. It is preferable that the angles $\theta_5$ and $\theta_6$ described above are greater than or equal to 10°, and it is preferable that the aspect ratio ($D_7/D_8$) of the first unit reticulation 1442B is greater than 1 and less than or equal to 5 ($1<(D_7/D_8)$ 5).

Furthermore, in a second linear portion 144bB, the first conductor wire 1441aB extends by being inclined at an angle θ₇ with respect to a second direction, and the first conductor wire 1441bB extends by being inclined at an angle θ₈ with respect to the second direction. Both absolute values of the angles θ₇ and θ₈ are less than 45° (−45°<θ₇ and θ₈<45°), and thus, the aspect ratio of the first unit reticulation 1442B is greater than 1, and even in this case, the first unit reticulation 1442B of the second linear portion 144bB and the first unit reticulation 1442B of the first linear portion 144aB have substantially the same shape.

Thus, the aspect ratio of the first unit reticulation 1442B is greater than 1, and thus, it is possible to shorten the total distance of the first conductor wire 1441B within a predetermined distance along the extending direction of the lead-out wiring layer 14B. Therefore, it is possible to further suppress an increase in an electric resistance value of the lead-out wiring layer 14B.

In addition, in a case where the aspect ratio of the first unit reticulation 1442B is greater than 1, a maximum portion 147B does not have an acute angle, and thus, it is possible to reduce a concern that a migration occurs between the adjacent lead-out wiring layers 14B and 14B.

Furthermore, in this example, in a relationship between the reticular electrode 6 and the lead-out wiring layer 14, the aspect ratio of the first unit reticulation 1442B is greater than the aspect ratio of the reticulation 135 (a ratio ($D_{10}/D_9$ (refer to FIG. 12)) of a length $D_{10}$ of the reticulation 135 along an extending direction of the reticular electrode layer 13 to a length $D_9$ of the reticulation along a width direction with respect to the extending direction of the reticular electrode layer 13).

In addition, for example, as illustrated in FIG. 17(A), in a lead-out wiring layer 14C, an end portion 1444aC of a first linear portion 144aC and an end portion 1444bC of a second linear portion 144bC overlap with each other, and thus, a curved portion 145C may be formed. In this example, a region, in which a first region Z1 which has a width corresponding to width of the first linear portion 144aC, extends in a first direction, and has the same center axis as that of the first linear portion 144aC overlaps with a second region Z2 which has a width corresponding to the width of the second linear portion 144bC, extends in a second direction, and has the same center axis as that of the second linear portion 144bC, is the curved portion 145C (in FIG. 17(B), a hatched region).

The curved portion 145C is configured by including the first unit reticulation 1442 and the second unit reticulation 1452C. In this example, the first conductor wire 1441 configuring the first linear portion 144aC and the first conductor wire 1441 configuring the second linear portion 144bC intersect with each other, and thus, second unit reticulations 1452C which are smaller than the first unit reticulation 1442 are formed.

Thus, the second unit reticulations 1452C are densely arranged compared to the arrangement of the first unit reticulation 1442, and thus, in the curved portion 145C, the lead-out wiring layer 14C is prevented from being disconnected. Furthermore, even though it is not particularly illustrated, as with the example described above, even in a case where the first unit reticulation configuring the first linear portion and the second linear portion is formed to have an aspect ratio of greater than 1, one end portion of the first linear portion and one end portion of the second linear portion overlap with each other, and thus, the same effect as that described above can be obtained.

In addition, for example, as illustrated in FIG. 18(A), a lead-out wiring layer 14D may include a third conductor wire 148 coupling first vertices 1443a to each other. In the lead-out wiring layer 14D of this example, a lateral end portion 146D is configured of the third conductor wire 148. Such a third conductor wire 148 and the first conductor wire 1441 are integrally formed of a material having the same composition as that of the first conductor wire 1441. Furthermore, in FIG. 18(A), the third conductor wire 148 has a linear shape, but is not particularly limited thereto, and as illustrated in FIG. 18(B), a third conductor wire 148B may have a curved shape, from the viewpoint of the filling properties of the conductive material at the time of producing the wiring board. Furthermore, it is preferable that the third conductor wire is formed to intersect with the first conductor wire 1441.

It is preferable that the width of the third conductor wire 148 is less than the width of the first conductor wire 1441, from the viewpoint of the filling properties of the conductive material with respect to the intaglio at the time of producing the wiring board. In addition, in examples illustrated in FIG. 18(A) and FIG. 18(B), the third conductor wires 148 and 148B are respectively disposed in both lateral end portions 146D and 146E of the lead-out wiring layers 14D and 14E, and the third conductor wire 148 (148B) may be disposed in only one lateral end portion 146D (146E) of the lead-out wiring layer 14D (14E).

As with this example, the lead-out wiring layer 14D includes the third conductor wire 148, and thus, in the lateral end portion 146D of the lead-out wiring layer 14D, the conduction between the first vertices 1443a and 1443a can be performed, and an increase in an electric resistance value of the lead-out wiring layer 14D can be further suppressed. In addition, the shape of the lateral end portion 146D is smoothed by the third conductor wire 148, and thus, it is possible to further suppress the occurrence of the migration between the adjacent lead-out wiring layers 14D and 14D. In this example, the "third conductor wires 148 and 148B" correspond to an example of the "side portion" of the invention.

In addition, for example, in the wiring body 11 of this embodiment, the reticular electrode layer 13, which is a reticular electrode layer, is used, but is not particularly limited thereto, and an electrode layer in a solid pattern may be used. In this case, indium tin oxide (ITO) or a conductive polymer having transparency, and the like can be used as a material configuring the electrode layer.

As described above, the wiring body described in the second embodiment includes the resin layer, the electrode layer disposed on the resin layer, and the reticular lead-out wiring layer disposed on the resin layer and is connected to the electrode layer, the lead-out wiring layer includes the first linear portion extending along the first direction, the second linear portion extending along the second direction which is different from the first direction, and the curved portion connecting the first linear portion and the second linear portion to each other, and the first linear portion and the second linear portion are configured by respectively arranging first unit reticulations formed of the first conductor wire and have substantially the same shape, and satisfy Formula (8) described below (a first configuration).

$$\alpha_1 = \alpha_2 \quad (8)$$

Here, in Formula (8) described above, $\alpha_1$ is an angle between the virtual straight line extending along the arrangement direction of the first unit reticulation of the first linear portion and the virtual straight line extending along the first direction, and $\alpha_2$ is an angle between the virtual straight line extending along the arrangement direction of the first unit reticulation of the second linear portion and the virtual straight line extending along the second direction.

In the first configuration described above, the curved portion may include the second unit reticulation having a shape which is different from the shape of the first unit reticulation (a second configuration).

In the second configuration described above, the curved portion may be configured by overlapping one end portion of the first linear portion and one end portion of the second linear portion with each other, and the conductor wire configuring the second unit reticulation may include the first conductor wire configuring the first linear portion and the first conductor wire configuring the second linear portion (a third configuration).

In the second configuration described above, one end portion of the of the first linear portion and one end portion of the second linear portion may be separated from each other, the curved portion may include the second conductor wire connecting one end portion of the first linear portion and one end portion of the second linear portion to each other, and the second unit reticulation may include the second conductor wire (a fourth configuration).

In the fourth configuration described above, the second conductor wire may connect the vertex of the first unit reticulation configuring the first linear portion and the vertex of the first unit reticulation configuring the second linear portion to each other (a fifth configuration).

In the fourth configuration or the fifth configuration described above, the width of the first conductor wire may be substantially identical to the width of the second conductor wire (a sixth configuration).

In any one configuration of the first configuration to the sixth configuration described above, in the first unit reticulations arranged side by side along the arrangement direction of the first linear portion, the vertex of one first unit reticulation and the vertex of the other first unit reticulation, which corresponds to the vertex of one first unit reticulation, may be positioned on the virtual straight line extending along the first direction, in the first unit reticulations arranged side by side along the arrangement direction of the second linear portion, the vertex of one first unit reticulation and the vertex of the other first unit reticulation, which corresponds to the vertex of one first unit reticulation, may be positioned on the virtual straight line extending along the second direction (a seventh configuration).

In any one configuration of the first configuration to the seventh configuration described above, the aspect ratio of the first unit reticulation in the planar view may be greater than 1, and the aspect ratio of the first unit reticulation in the planar view may be the ratio of the length of the first unit reticulation along the extending direction of the lead-out wiring layer to the length of the first unit reticulation along the direction which is substantially perpendicular to the extending direction of the lead-out wiring layer (an eighth configuration).

In any one configuration of the first configuration to the eighth configuration described above, both lateral end portions of the lead-out wiring layer may include the first vertex positioned on the outermost side among the vertices positioned on the outermost side of the lead-out wiring layer and configure the first unit reticulation, and the width of the lead-out wiring layer may be the distance between the first vertex of one lateral end portion and the first vertex of the other lateral end portion, in the direction which is substantially perpendicular to the extending direction of the lead-out wiring layer (a ninth configuration).

In any one configuration of the first configuration to the ninth configuration described above, the wiring body may include the electrode layers, and the lead-out wiring layers which are respectively connected to the electrode layers and are arranged approximately in parallel to each other, and in the extending direction of the lead-out wiring, the first vertex of one of the adjacent lead-out wiring layers and the first vertex of the other one of the adjacent lead-out wiring layers may be shifted from each other (a tenth configuration).

In any one configuration of the first configuration to the tenth configuration described above, the aperture ratio of the lead-out wiring layer may be less than or equal to 50% (an eleventh configuration).

In addition, the wiring board described in the second embodiment includes the wiring body described in any one configuration of the first configuration to the eleventh configuration described above, and the support supporting the wiring body (a twelfth configuration).

In addition, the touch sensor described in the second embodiment includes the wiring board described in the twelfth configuration described above (a thirteenth configuration).

Furthermore, the embodiments described above have been described for easily understanding the invention, and are not described for limiting the invention. Therefore, each constituent disclosed in the embodiments described above includes all design changes or equivalents belonging to the technical scope of the invention.

For example, the wiring board may be configured by omitting the substrate 21 from the wiring board 10 of the first embodiment, and by using a resin layer corresponding to the adhesive layer 25 as the base material supporting the reticular electrode layer 22 and the lead-out wiring layer 23. In addition, the adhesive layer 25 may be omitted from the embodiments described above, and the reticular electrode layer 22 and the lead-out wiring layer 23 may be directly disposed on the substrate 21. Furthermore, similarly, in this example, the substrate 9 may be omitted from the wiring board 8 described in the second embodiment.

In addition, for example, in the embodiments described above, the metal material or the carbon-based material is used as the conductive material configuring the first conductor layer and the second conductor layer, but the conductive material is not particularly limited thereto, and the metal material and the carbon-based material may be used by being mixed. In this case, for example, in the case of describing the first conductor wire 221A of the first embodiment as an example, the carbon-based material may be disposed on the first conductor wire 221A on the upper surface 223 side, and the metal material may be disposed on the first conductor wire 221A on the lower surface 224 side. In addition, on the contrary, metal material may be disposed on the first conductor wire 221A on the upper surface 223 side, and the carbon-based material may be disposed on the first conductor wire 221A on the lower surface 224 side.

In addition, in the embodiments described above, the wiring body has been described as being used in the touch sensor, but the application of the wiring body is not particularly limited thereto. For example, the wiring body is energized and is allowed to produce fever by resistive heating or the like, and thus, the wiring body may be used as a heater. In this case, it is preferable that a carbon-based material having a comparatively high electric resistance value is used as the conductive powder of the conductor pattern. In addition, a part of a conductor portion of the wiring body is grounded, and thus, the wiring body may be used as an electromagnetic shield. In addition, the wiring body may be used as an antenna.

EXPLANATIONS OF LETTERS OR NUMERALS

1: touch sensor
10: wiring board
2: wiring body
21: substrate
22: reticular electrode layer
221A, 221B: first conductor wire
222: lateral portion
2221: first portion
2222: second portion
2223: flat portion
223: upper surface
2231: flat portion
224: lower surface
23, 23B, 23C: lead-out wiring layer
231A, 231B: second conductor wire
230: lateral portion
2301: first portion
2302: second portion
2303: flat portion
232: reticulation portion
233: maximum portion
234: side portion
235: upper surface
2351: flat portion
236: lower surface
241: convex portion
242: concave portion
25: adhesive layer (resin layer)
251: support portion
252: smooth portion
7: touch sensor
8: wiring board
9: substrate
91: main surface
11: wiring body
12: adhesive layer
121: flat portion
1211: main surface
122: support portion
1221: lateral surface
1222: adhesive surface
13: reticular electrode layer
131: contact surface
132: top surface
1321: flat portion
133: lateral surface
1331: first portion
1332: second portion
1333: flat portion
134a, 134b: fourth conductor wire
135: reticulation
136: outer edge portion
14, 14B to 14E: lead-out wiring layer
141: contact surface
142: top surface
1421: flat portion
143: lateral surface
1431: first portion
1432: second portion
1433: flat portion
144a, 144b, 144aB, 144bB, 144aC, 144bC: first linear portion and second linear portion
1441a, 1441b, 1441aB, 1441bB: first conductor wire
1442, 1442a, 1442b, 1442B: first unit reticulation
1443, 1443A, 1443B: vertex
1443a: first vertex
1443b: second vertex
1444a, 1444b, 1444aC, 1444bC: end portion
145, 145C: curved portion
1451: second conductor wire
1452, 1452C: second unit reticulation
146: lateral end portion
147: maximum portion
148, 148B: third conductor wire
15: resin layer
16: reticular electrode layer
17: lead-out wiring layer
4: intaglio
41: first recessed portion
42: second recessed portion
5: conductive material
51: front surface
6: adhesive material

The invention claimed is:

1. A wiring body comprising:
a resin layer;
a reticular electrode layer disposed on the resin layer and including first conductor wires arranged into the shape of a reticulation; and
a lead-out wiring layer disposed on the resin layer and connected to the reticular electrode layer, wherein
the lead-out wiring layer includes a reticulation portion configured by gathering unit reticulations formed by being surrounded by a second conductor wire, in the planar view,
the second conductor wire is disposed by being inclined with respect to an extending direction of the lead-out wiring layer,
the unit reticulation includes an end portion which is an intersection point between the second conductor wires,
the lead-out wiring layer includes a lateral end portion formed by arranging the unit reticulations side by side along the extending direction of the lead-out wiring layer in the planar view,
the lateral end portion is closed by the second conductor wire connected and terminated to an outside end portion positioned on an outermost side in the end portion of the unit reticulation existing in the lateral end portion,
a width of the reticulation portion is defined by the outside end portion,
wherein the lead-out wiring layer comprises:
a first linear portion extending along a first direction;
a second linear portion extending along a second direction different from the first direction; and
a curved portion connecting the first linear portion and the second linear portion to each other, the curved portion comprising:
a plurality of the second conductor wires that are straight and are extended from at least one end portion at an end of the first linear portion to at least one end portion at an end of the second linear portion;
the first linear portion and the second linear portion are respectively configured by arranging first unit reticulations, disposed only in the first linear portion and the second linear portion, formed of the second conductor wire and having substantially the same shape, as the unit reticulation, and the following Formula (1) is satisfied:

$$\alpha_1 = \alpha_2 \qquad (1)$$

in the Formula (1), $\alpha_1$ is an angle between a virtual straight line extending along an arrangement direction of the first unit reticulation and a virtual straight line extending along the first direction in the first linear portion, and $\alpha_2$ is an angle between a virtual straight line extending along the arrangement direction of the first unit reticulation and a virtual straight line extending along the second direction in the second linear portion, wherein the second conductor wires of the curved portion create a second unit reticulation disposed only in the curved portion, that has a plurality of shapes different from a shape of the first unit reticulation and the plurality of shapes of the second unit reticulation are different from one another, wherein the first direction is not perpendicular to the second direction, and wherein a number of the plurality of the second conductor wires is greater than or equal to a larger one of:
a number of vertices exposed from the end portion of the first linear portion, and
a number of vertices exposed from the end portion of the second linear portion.

2. The wiring body according to claim 1, wherein the lateral end portion of the lead-out wiring layer in the planar view has a shape of a wave configured of the second conductor wire forming the unit reticulation disposed on the lateral end portion of the lead-out wiring layer.

3. The wiring body according to claim 1, wherein the lead-out wiring layer includes a side portion that has a linear shape and is disposed on the lateral end portion of the lead-out wiring layer and connecting the unit reticulations together.

4. The wiring body according to claim 1, wherein
one end of the first linear portion and one end of the second linear portion are separated from each other,
the curved portion includes a third conductor wire connecting one end of the first linear portion and one end of the second linear portion to each other, and
the second unit reticulation includes the third conductor wire.

5. The wiring body according to claim 4, wherein the third conductor wire connects the end portion of the first unit reticulation configuring the first linear portion and the end portion of the first unit reticulation configuring the second linear portion to each other.

6. The wiring body according to claim 4, wherein a width of the second conductor wire is substantially identical to a width of the third conductor wire.

7. The wiring body according to claim 1, wherein
in the first unit reticulations arranged side by side along the arrangement direction in the first linear portion, the end portion of one first unit reticulation and the end portion of the other first unit reticulation corresponding to the end portion of one first unit reticulation are positioned on the virtual straight line extending along the first direction, and
in the first unit reticulations arranged side by side along the arrangement direction in the second linear portion, the end portion of one first unit reticulation and the end portion of the other first unit reticulation corresponding to the end portion of one first unit reticulation are positioned on the virtual straight line extending along the second direction.

8. The wiring body according to claim 1, wherein
an aspect ratio of the unit reticulation in the planar view is greater than 1, and
the aspect ratio of the unit reticulation in the planar view is a ratio of a length of the unit reticulation along the extending direction of the lead-out wiring layer to a length of the unit reticulation along a width direction with respect to the extending direction of the lead-out wiring layer.

9. The wiring body according to claim 1, further comprising:
reticular electrode layers; and
lead-out wiring layers, including and configured identically to the lead-out wiring layer, respectively connected to the reticular electrode layers and arranged approximately in parallel to each other, wherein
the lateral end portion includes:
a convex portion configured by including the outside end portion and the second conductor wire connected to the outside end portion, and protruding towards the outside of the lead-out wiring layer in the planar view; and
a concave portion alternately disposed with the convex portion along the extending direction of the lead-out wiring layer, and recessed towards the inside of the lead-out wiring layer in the planar view, and
among the lead-out wiring layers, the convex portion configuring the lateral end portion of a first lead-out wiring layer facing the lateral end portion of a second lead-out wiring layer and the convex portion configuring the lateral end portion of the second lead-out wiring layer facing the lateral end portion of the first lead-out wiring layer are shifted from each other along the extending direction of the lead-out wiring layer in adjacent lead-out wiring layers.

10. The wiring body according to claim 9, wherein
the convex portion configuring the lateral end portion of the first other lead-out wiring layer facing the lateral end portion of the second lead-out wiring layer and the concave portion configuring the lateral end portion of the second lead-out wiring layer facing the lateral end portion of the first lead-out wiring layer face each other in a direction orthogonal to the extending direction of the lead-out wiring layer in the adjacent lead-out wiring layers, and
the concave portion configuring the lateral end portion of the first lead-out wiring layer facing the lateral end portion of the second lead-out wiring layer and the convex portion configuring the lateral end portion of the second lead-out wiring layer facing the lateral end portion of the first lead-out wiring layer face each other in the direction orthogonal to the extending direction of the lead-out wiring layer in the adjacent lead-out wiring layers.

11. A wiring board comprising:
the wiring body according to claim 1; and
a support that supports the wiring body.

12. A touch sensor, comprising:
the wiring board according to claim 11.

13. The wiring body according to claim 1, wherein an aperture ratio of the lead-out wiring layer is within a range of 10% to 50%.

14. A wiring body comprising:
a resin layer;

a reticular electrode layer disposed on the resin layer and including first conductor wires arranged into the shape of a reticulation; and a lead-out wiring layer disposed on the resin layer and connected to the reticular electrode layer, wherein the lead-out wiring layer includes a reticulation portion configured by gathering unit reticulations formed by being surrounded by a second conductor wire, in the planar view, the second conductor wire is disposed by being inclined with respect to an extending direction of the lead-out wiring layer, the unit reticulation includes an end portion which is an intersection point between the second conductor wires, the lead-out wiring layer includes a lateral end portion formed by arranging the unit reticulations side by side along the extending direction of the lead-out wiring layer in the planar view, the lateral end portion is closed by the second conductor wire connected and terminated to an outside end portion positioned on an outermost side in the end portion of the unit reticulation existing in the lateral end portion, a width of the reticulation portion is defined by the outside end portion, wherein the lead-out wiring layer comprises:
  a first linear portion extending along a first direction;
  a second linear portion extending along a second direction different from the first direction; and
  a curved portion connecting the first linear portion and the second linear portion to each other, the curved portion comprising:
    a plurality of the second conductor wires that are straight and are extended from at least one end portion at an end of the first linear portion to at least one end portion at an end of the second linear portion;

the first linear portion and the second linear portion are respectively configured by arranging first unit reticulations, disposed only in the first linear portion and the second linear portion, formed of the second conductor wire and having substantially the same shape, as the unit reticulation, and the following Formula (1) is satisfied:

$$\alpha_1 = \alpha_2 \qquad (1)$$

in the Formula (1), $\alpha_1$ is an angle between a virtual straight line extending along an arrangement direction of the first unit reticulation and a virtual straight line extending along the first direction in the first linear portion, and $\alpha_2$ is an angle between a virtual straight line extending along the arrangement direction of the first unit reticulation and a virtual straight line extending along the second direction in the second linear portion, wherein the second conductor wires of the curved portion create a second unit reticulation disposed only in the curved portion, that has a plurality of shapes different from a shape of the first unit reticulation and the plurality of shapes of the second unit reticulation are different from one another, wherein the first unit reticulations of the first linear portion and the second linear portion have a shape of a quadrangle, and wherein a number of the plurality of the second conductor wires is greater than or equal to a larger one of:
  a number of vertices exposed from the end portion of the first linear portion, and
  a number of vertices exposed from the end portion of the second linear portion.

* * * * *